US012641997B2

(12) United States Patent
Jeong et al.

(10) Patent No.: US 12,641,997 B2
(45) Date of Patent: May 26, 2026

(54) LIGHT-EMITTING DEVICE AND ELECTRONIC APPARATUS INCLUDING SAME

(71) Applicant: Samsung Display Co., Ltd., Yongin-si (KR)

(72) Inventors: Dongseob Jeong, Yongin-si (KR); Eungyoung Park, Yongin-si (KR); Jiyoung Song, Yongin-si (KR); Jimyoung Ye, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 586 days.

(21) Appl. No.: 17/231,899

(22) Filed: Apr. 15, 2021

(65) Prior Publication Data

US 2022/0052274 A1 Feb. 17, 2022

(30) Foreign Application Priority Data

Aug. 14, 2020 (KR) ........................ 10-2020-0102706

(51) Int. Cl.

*H01L 51/00* (2006.01)
*H10K 85/40* (2023.01)
(Continued)

(52) U.S. Cl.

CPC ........... *H10K 85/622* (2023.02); *H10K 85/40* (2023.02); *H10K 85/633* (2023.02); (Continued)

(58) Field of Classification Search

CPC .. H10K 85/6574; H10K 85/40; H10K 85/622; H10K 85/633; H10K 85/636; H10K 85/654; H10K 85/6572; H10K 85/6576; H10K 50/11; H10K 2101/10; H10K 50/13; H10K 50/86; H10K 2101/20; (Continued)

(56) References Cited

U.S. PATENT DOCUMENTS

| | | |
|---|---|---|
| 8,981,355 B2 | 3/2015 | Seo |
| 9,281,487 B2 | 3/2016 | Kim et al. |

(Continued)

FOREIGN PATENT DOCUMENTS

| | | |
|---|---|---|
| CN | 103378300 A | 10/2013 |
| CN | 108475732 A | 8/2018 |

(Continued)

OTHER PUBLICATIONS

Chinese Office action for Chinese Patent Application No. 202110466882.0, dated Jan. 10, 2026, 8 pages.

*Primary Examiner* — Ermias T Woldegeorgis

(74) *Attorney, Agent, or Firm* — Womble Bond Dickinson (US) LLP

(57) ABSTRACT

A light-emitting device includes: a first electrode; a second electrode facing the first electrode; and an interlayer located between the first electrode and the second electrode and including an emission layer stack, wherein the emission layer stack includes a first emission layer including a first thermally activated delayed fluorescence (TADF) dopant and a second emission layer including a second TADF dopant, the first TADF dopant and the second TADF dopant are different compounds, and the first emission layer contacts the second emission layer.

16 Claims, 3 Drawing Sheets

(51) Int. Cl.

| | |
|---|---|
| ***H10K 85/60*** | (2023.01) |
| *H10K 50/11* | (2023.01) |
| *H10K 101/10* | (2023.01) |
| *H10K 101/20* | (2023.01) |

(52) U.S. Cl.
CPC ......... *H10K 85/636* (2023.02); *H10K 85/654* (2023.02); *H10K 85/6572* (2023.02); *H10K 85/6574* (2023.02); *H10K 85/6576* (2023.02); *H10K 85/658* (2023.02); *H10K 50/11* (2023.02); *H10K 2101/10* (2023.02); *H10K 2101/20* (2023.02)

(58) Field of Classification Search
CPC .. H10K 85/322; H10K 85/615; H10K 85/657; H10K 59/12; H10K 59/38; H10K 59/40; H10K 50/165; H10K 59/1213; H10K 59/123; H10K 59/00; H10K 85/656
See application file for complete search history.

(56) References Cited

U.S. PATENT DOCUMENTS

| | | | | |
|---|---|---|---|---|
| 9,741,955 B2 | 8/2017 | Shitagaki et al. | | |
| 10,937,982 B2 | 3/2021 | Haldi et al. | | |
| 2013/0270531 A1* | 10/2013 | Seo | ........................ | H10K 50/16 257/40 |
| 2013/0292656 A1* | 11/2013 | Seo | ........................ | H10K 50/13 257/40 |
| 2015/0188072 A1* | 7/2015 | Seo | .................... | H10K 85/6572 257/40 |
| 2018/0190193 A1 | 7/2018 | Kim et al. | | |
| 2018/0323395 A1* | 11/2018 | Haldi | ..................... | H10K 50/82 |
| 2018/0366656 A1 | 12/2018 | Tada et al. | | |
| 2020/0251663 A1 | 8/2020 | Choi et al. | | |

FOREIGN PATENT DOCUMENTS

| | | | | | | |
|---|---|---|---|---|---|---|
| CN | 109524558 | A | * | 3/2019 | | |
| EP | 2937915 | A1 | * | 10/2015 | ......... | H01L 27/3209 |
| JP | 2013229322 | A | * | 11/2013 | ......... | H01L 51/5004 |
| JP | 2018014404 | A | | 1/2018 | | |
| KR | 20130074654 | A | * | 7/2013 | | |
| KR | 10-2013-0092447 | A | | 8/2013 | | |
| KR | 20130116198 | A | * | 10/2013 | | |
| KR | 10-2015-0015647 | A | | 2/2015 | | |
| KR | 10-2015-0078395 | A | | 7/2015 | | |
| KR | 10-1706542 | B1 | | 2/2017 | | |
| KR | 10-2019-0071971 | A | | 6/2019 | | |
| KR | 10-2020-0004311 | A | | 1/2020 | | |

* cited by examiner

LIGHT-EMITTING DEVICE AND ELECTRONIC APPARATUS INCLUDING SAME

CROSS-REFERENCE TO RELATED APPLICATION

This application claims priority to and the benefit of Korean Patent Application No. 10-2020-0102706, filed on Aug. 14, 2020, in the Korean Intellectual Property Office, the entire content of which is herein incorporated by reference.

BACKGROUND

1. Field

One or more aspects of embodiments of the present disclosure relate to a light-emitting device and an electronic apparatus including the same.

2. Description of Related Art

Light-emitting devices are self-emission devices that, compared with related art devices, may have wide viewing angles, high contrast ratios, short response times, and/or excellent characteristics in terms of luminance, driving voltage, and/or response speed.

In a light-emitting device, a first electrode is located on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as the holes and the electrons, recombine in the emission layer to produce light.

SUMMARY

One or more aspects of embodiments of the present disclosure are directed toward a light-emitting device with improved efficiency, compared to those in the related art.

Additional aspects will be set forth in part in the description that follows and, in part, will be apparent from the description, or may be learned by practice of the presented embodiments of the disclosure.

One or more example embodiments of the present disclosure provide a light-emitting device including a first electrode, a second electrode facing the first electrode, and an interlayer located between the first electrode and the second electrode and including an emission layer stack, wherein the emission layer stack includes a first emission layer including a first thermally activated delayed fluorescence (TADF) dopant and a second emission layer including a second TADF dopant, the first TADF dopant and the second TADF dopant are different compounds, and the first emission layer contacts (e.g., directly contacts) the second emission layer.

One or more example embodiments of the present disclosure provide an electronic apparatus including the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
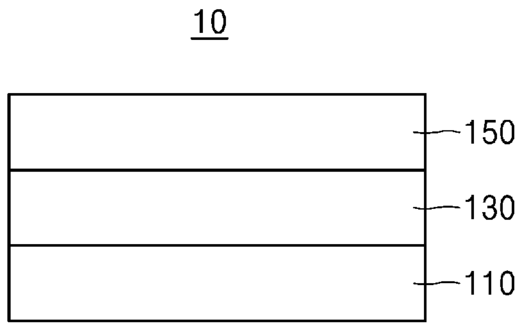
FIG. 1 is a diagram schematically illustrating a structure of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" may indicate only a, only b, only c, both a and b, both a and c, both b and c, all of a, b, and c, or variations thereof.

As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof. Further, the use of "may" when describing embodiments of the present disclosure refers to "one or more embodiments of the present disclosure".

In a structure including a plurality of stacks that each include one light-emitting layer of the same color, the number of stacks may be increased to realize high luminescence efficiency. In this case, a light-emitting zone is formed at an interface between a hole transport layer and an emission layer, and thus, in general, when efficiency is improved, lifespan tends to decrease.

According to an embodiment, a light-emitting device includes:

a first electrode;

a second electrode facing the first electrode; and an interlayer located between the first electrode and the second electrode and including an emission layer stack, where the emission layer stack includes a first emission layer including a first thermally activated delayed fluorescence (TADF) dopant, and a second emission layer including a second TADF dopant, where the first TADF dopant and the second TADF dopant are different compounds, and where the first emission layer contacts (e.g., directly contacts) the second emission layer.

For example, the emission layer stack may include (e.g. consist of) the first emission layer and the second emission layer.

In an embodiment, the first electrode may be an anode, the second electrode may be a cathode, and the light-emitting device may further include a hole transport region located between the first electrode and the emission layer stack, the hole transport region including a hole injection layer, a hole transport layer, an electron blocking layer, or a combination thereof.

In an embodiment, the first electrode may be an anode, the second electrode may be a cathode, and the light-emitting device may further include an electron transport region located between the second electrode and the emission layer stack, the electron transport region including a hole blocking layer, an electron transport layer, an electron injection layer, or a combination thereof.

The hole transport region and the electron transport region will be described later.

In an embodiment, the emission layer stack may be to emit blue light. In an embodiment, regardless of what kind of light each of the first emission layer and the second emission layer emit, the emission layer stack including the first emission layer and the second emission layer may be to emit blue light. In an embodiment, the first emission layer may be to emit short-wavelength blue light, the second emission layer may be to emit long-wavelength blue light, and the emission layer stack including the first emission layer and the second emission layer may be to emit blue light. In an embodiment, the first emission layer may be to emit long-wavelength blue light, the second emission layer may be to emit short-wavelength blue light, and the emission layer stack including the first emission layer and the second emission layer may be to emit blue light.

In an embodiment, the first emission layer may be to emit short-wavelength blue light.

In an embodiment, the second emission layer may be to emit long-wavelength blue light.

In an embodiment, the first emission layer may be to emit blue light, the second emission layer may be to emit blue light, the emission layer stack including the first emission layer and the second emission layer may be to emit blue light.

In an embodiment, a wavelength of the first TADF dopant may be about 440 nm to about 460 nm. For example, the first TADF dopant may be to provide light having a wavelength of about 440 nm to about 460 nm.

In an embodiment, a wavelength of the second TADF dopant may be about 460 nm to about 480 nm. For example, the second TADF dopant may be to provide light having a wavelength of about 460 nm to about 480 nm.

The wavelength refers to a wavelength of $\lambda_{max}$.

In an embodiment, a full width at half maximum (FWHM) of the wavelength of the first TADF dopant may be about 30 nm or less. In an embodiment, the FWHM of the wavelength of the first TADF dopant may be about 10 nm to about 25 nm.

In an embodiment, a FWHM of the wavelength of the second TADF dopant may be about 30 nm or more. In an embodiment, the FWHM of the wavelength of the second TADF dopant may be about 30 nm to about 50 nm.

When the FWHM of the wavelength of the first TADF dopant and the FWHM of the wavelength of the second TADF dopant are each within the above ranges, the efficiency and the lifespan of the light-emitting device may be excellent.

In an embodiment, the first emission layer may contact (e.g., directly contact) the hole transport layer, and the second emission layer may contact (e.g., directly contact) the electron transport layer.

In an embodiment, the first emission layer may contact (e.g., directly contact) the hole transport layer, and the second emission layer may contact (e.g., directly contact) the hole blocking layer.

In an embodiment, the first emission layer may include a first host, the second emission layer may include a second host, and the first host and the second host may be different compounds.

In an embodiment, the first host and the second host may be the same compound. The first host and the second host may each be a compound having a high T1 energy level.

In an embodiment, a T1 energy level of the first host and a T1 energy level of the second host may each be about 1.7 eV or more. When the T1 energy level of the first host and the T1 energy level of the second host are less than about 1.7 eV, the luminescence mechanism (e.g., TADF) may not work well (e.g., may have decreased efficiency).

Each of the first TADF dopant and the second TADF dopant may have a difference between S1 energy and T1 energy (e.g., singlet-triplet energy gap) of about 0.5 eV or less. Here, the S1 energy is greater than the T1 energy.

In an embodiment, each of the first TADF dopant and the second TADF dopant may have a difference between S1 energy and T1 energy (e.g., singlet-triplet energy gap) of about 0.3 eV or less.

When a difference between S1 energy and T1 energy (e.g., singlet-triplet energy gap) is greater than 0.5 eV, TADF mechanism hardly occurs (e.g., TADF may be inhibited or reduced).

In an embodiment, a hole provided from the first electrode and an electron provided from the second electrode may recombine at an interface between the first emission layer and the second emission layer. Accordingly, compared to the related art in which a light-emitting zone is formed (e.g., in which recombination occurs) at an interface between a hole transport layer and an emission layer, deterioration of an interface between the hole transport layer and the emission layer does not occur, and thus the lifespan of the device does not decrease, and its efficiency may increase.

In an embodiment, the emission layer stack may be or include a plurality of emission layer stacks. In an embodiment, the multiplicity (e.g., number) of the emission layer stack may be two, three, or four. In this case, a charge generation layer may be located between the plurality of emission layer stacks. In an embodiment, the charge generation layer may contact the electron transport layer and the hole transport layer.

In an embodiment, a host in the emission layer stack may be any one of the compounds below:

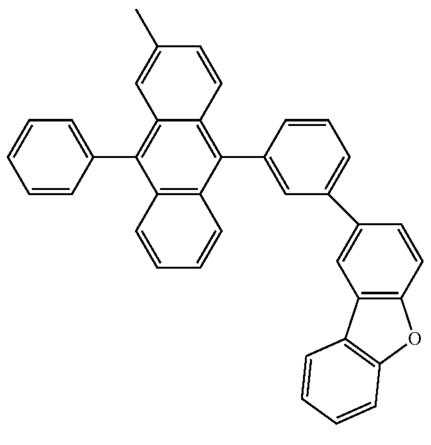

-continued
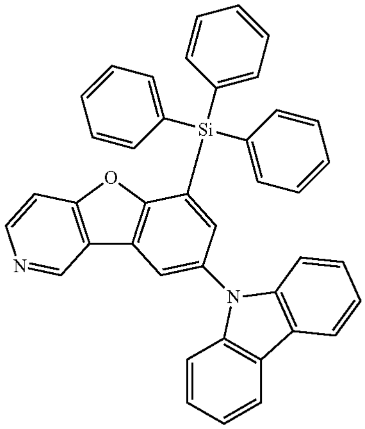
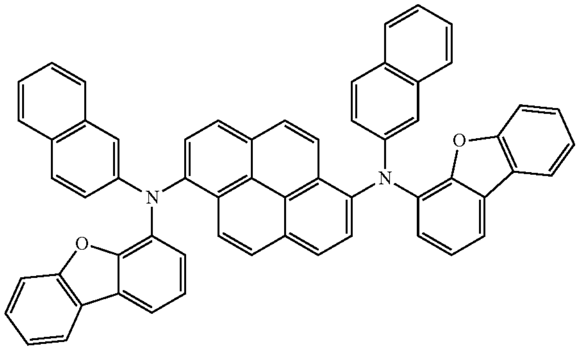
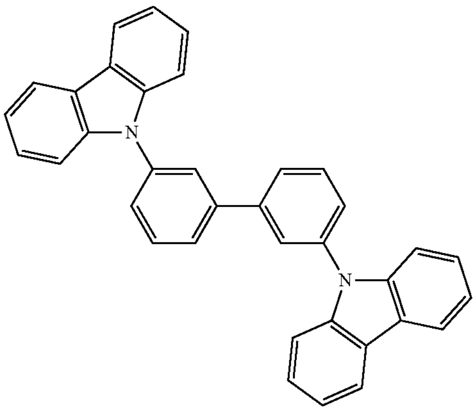
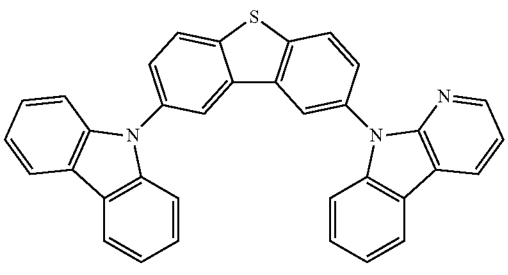
CN
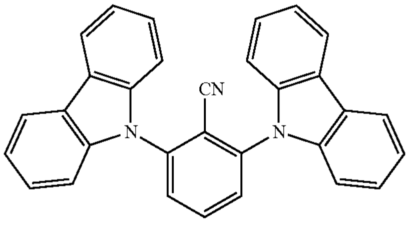
-continued
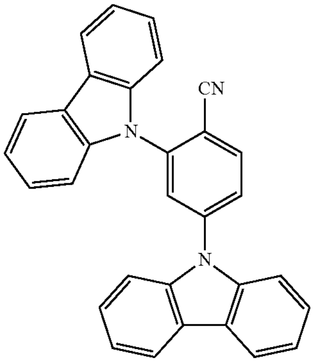
CN
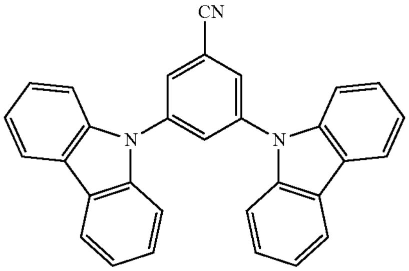
CN
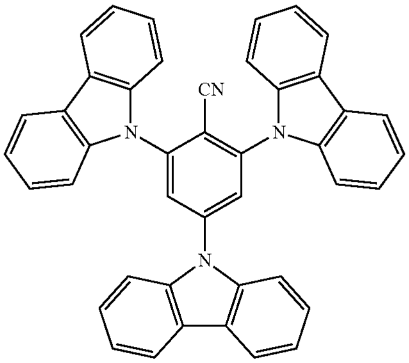
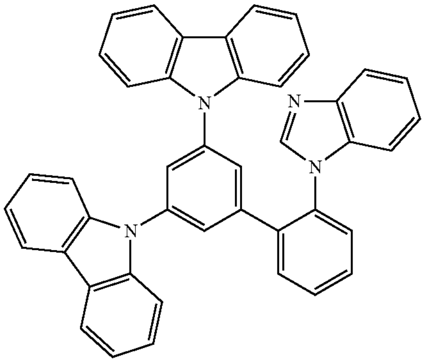
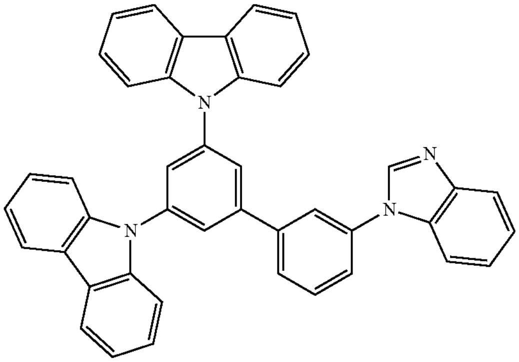

-continued
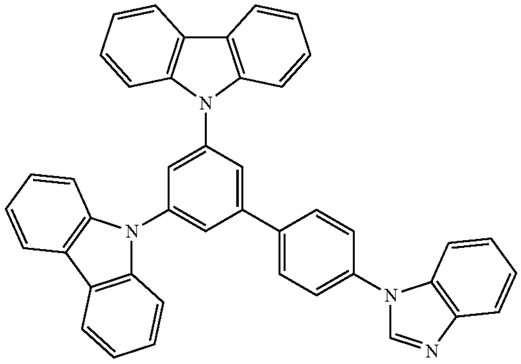
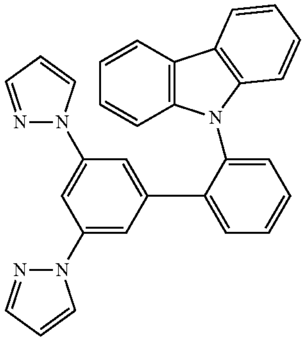
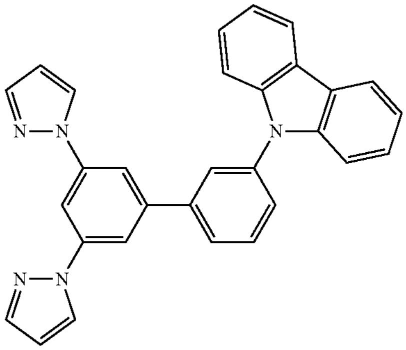
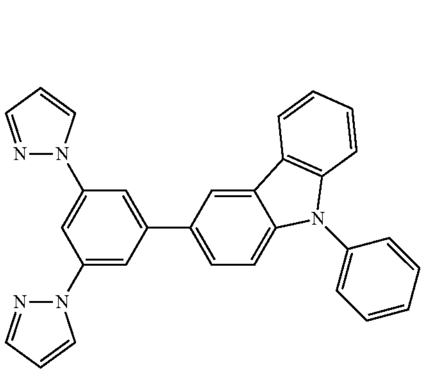
-continued
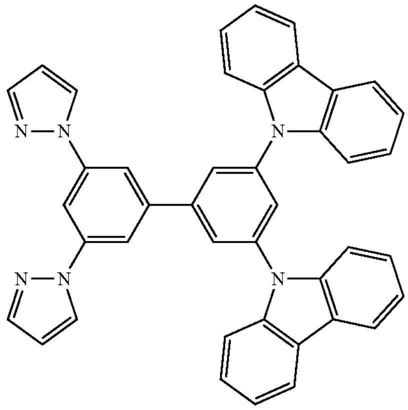
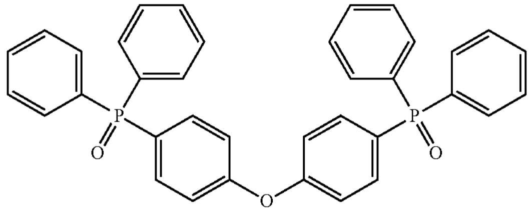
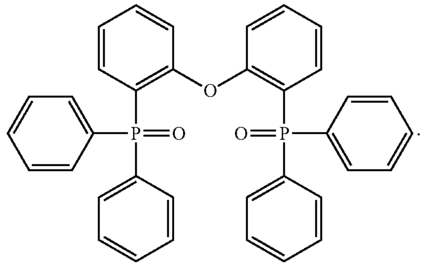
In an embodiment, the first TADF dopant may be any one of the compounds below:
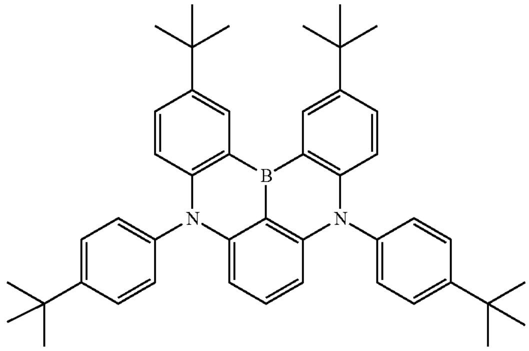
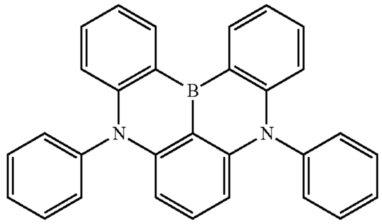

-continued
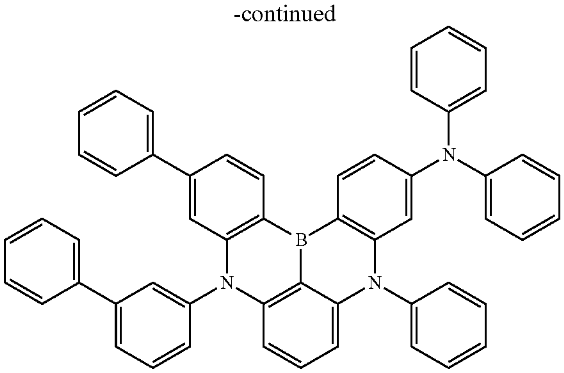
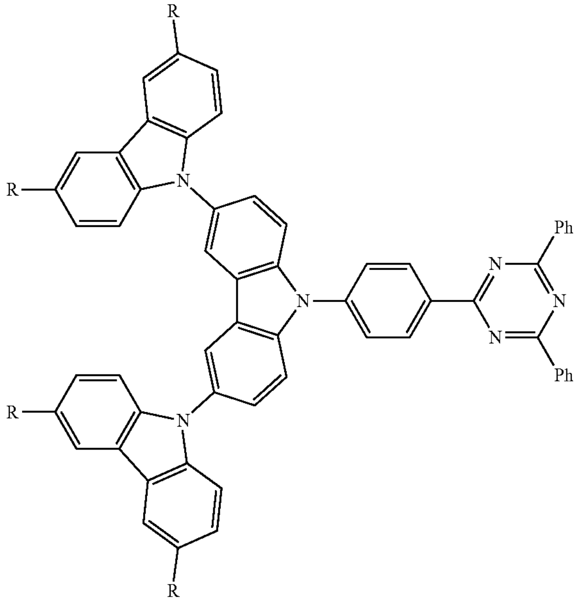
3 (2a): R = Phenyl
4 (2b): R = H
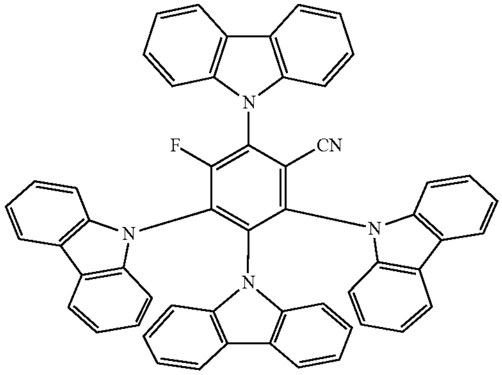
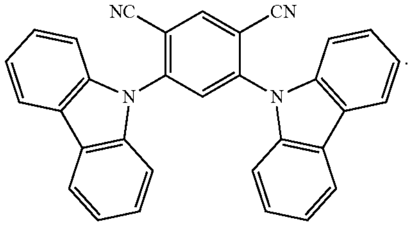
In an embodiment, the second TADF dopant may be any one of the compounds below:
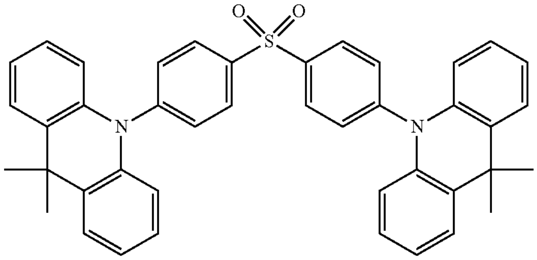
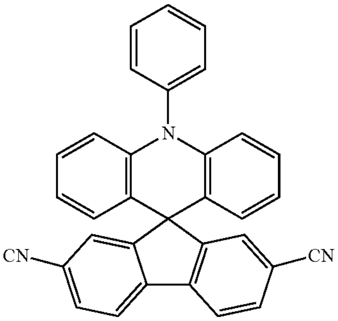
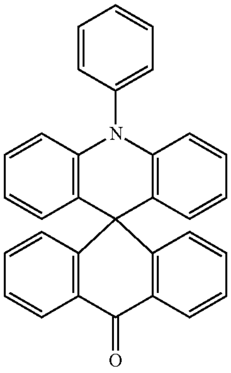
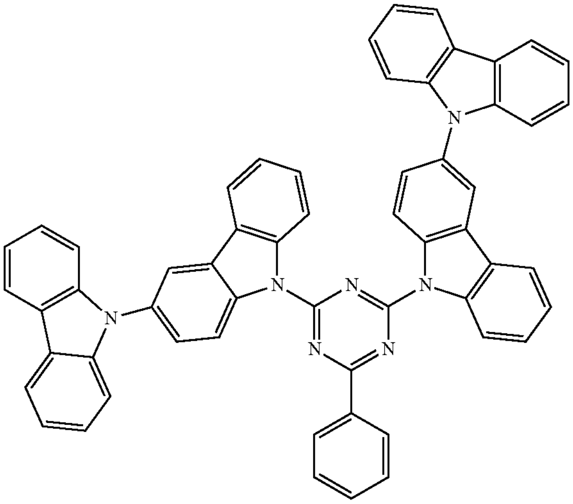

-continued

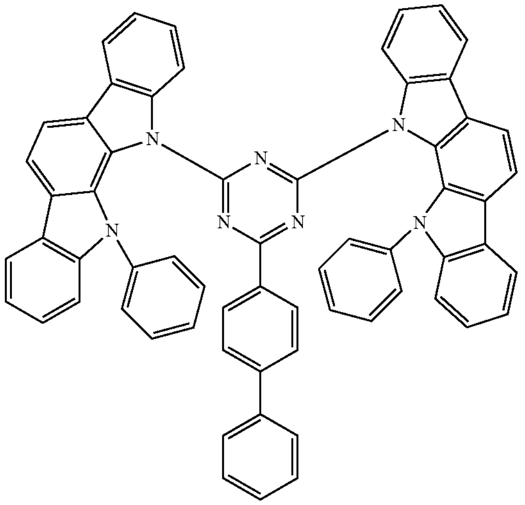

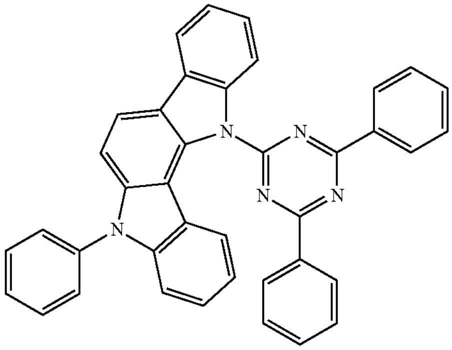

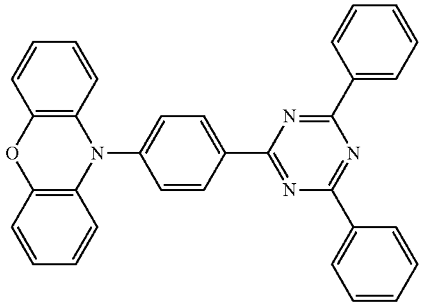

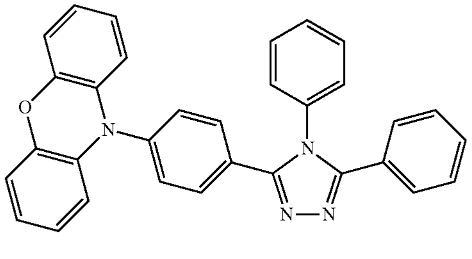

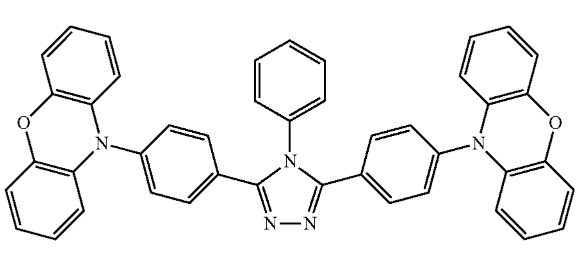

-continued

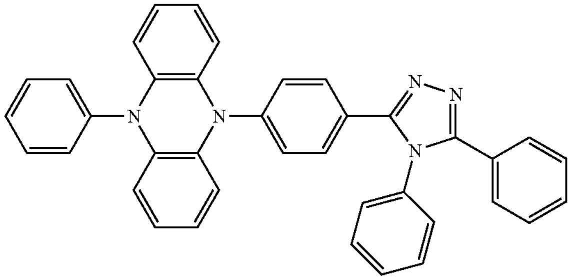

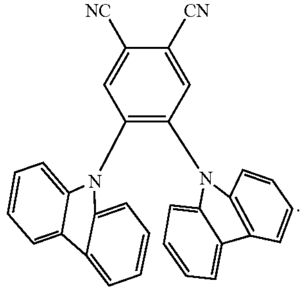

According to another embodiment, an electronic apparatus includes the light-emitting device.

In an embodiment, the electronic apparatus may further include a thin-film transistor, the thin-film transistor may include a source electrode and a drain electrode, and the first electrode of the light-emitting device may be electrically connected to at least one of the source electrode and the drain electrode of the thin-film transistor.

In an embodiment, the electronic apparatus may further include a color filter, a color conversion layer, a touch screen layer, a polarizing layer, or any combination thereof.

The term "interlayer" as used herein may refer to a single layer and/or all of a plurality of layers located between the first electrode and the second electrode of the light-emitting device.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

First Electrode 110

In FIG. 1, a substrate may be additionally located under the first electrode 110 and/or above the second electrode 150. The substrate may be a glass substrate and/or a plastic substrate. The substrate may be a flexible substrate. In one or more embodiments, the substrate may include a plastic with excellent heat resistance and/or durability (such as polyimide, polyethylene terephthalate (PET), polycarbonate, polyethylene naphthalate, polyarylate (PAR), polyetherimide, or any combination thereof).

The first electrode 110 may be formed by, for example, depositing or sputtering a material for forming the first electrode 110 on the substrate. When the first electrode 110 is an anode, a high work function material that can easily inject holes may be used as a material for forming the first electrode 110.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure consisting of a single layer or a multi-layered structure including a plurality of layers. In an embodiment, the first electrode 110 may have a three-layered structure of ITO/Ag/ITO.

Interlayer 130

The interlayer 130 is located on the first electrode 110. The interlayer 130 includes an emission layer stack.

The interlayer 130 may further include a hole transport region between the first electrode 110 and the emission layer stack, and an electron transport region between the emission layer stack and the second electrode 150.

The interlayer 130 may further include metal-containing compounds (such as organometallic compounds, inorganic materials such as quantum dots, and/or the like), in addition to various organic materials.

In some embodiments, the interlayer 130 may include: i) two or more emission layer stacks sequentially stacked between the first electrode 110 and the second electrode 150, and ii) a charge generation layer between the two emission layer stacks. When the interlayer 130 includes the emission layer stack and the charge generation layer described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

Formula 201

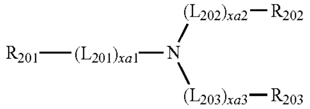

-continued

Formula 202

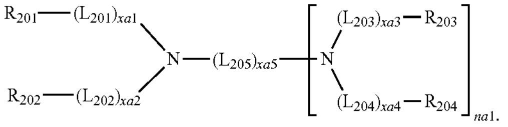

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, and $R_{201}$ to $R_{204}$ and 0201 may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$(for example, a carbazole group or the like) (for example, refer to the following compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, Formulae 201 and 202 may each include at least one of the groups represented by Formulae CY201 to CY217:

CY201

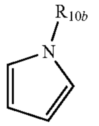

CY202

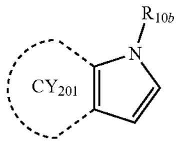

CY203

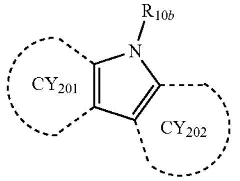

-continued

CY204

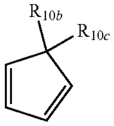

CY205

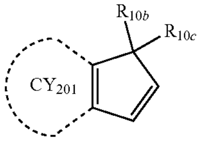

CY206

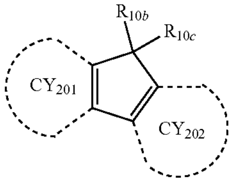

CY207

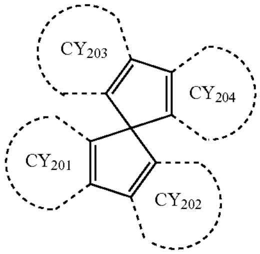

CY208

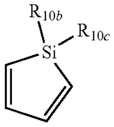

CY209

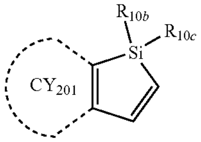

CY210

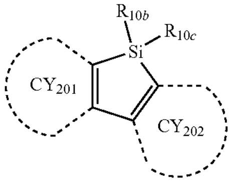

CY211

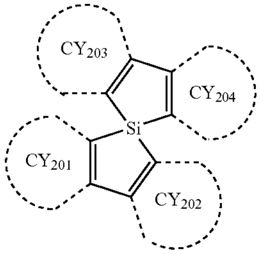

CY212

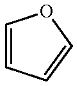

-continued

CY213

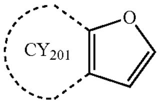

CY214

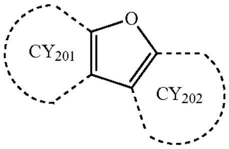

CY215

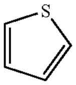

CY216

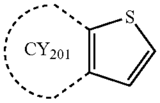

CY217

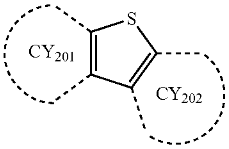

.

Regarding Formulae CY201 to CY217, $R_{10b}$ and $R_{10c}$ may each independently be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ described herein.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, Formulae 201 and 202 may each include at least one of the groups represented by Formulae CY201 to CY203:

In one or more embodiments, Formula 201 may include at least one of the groups represented by Formulae CY201 to CY203 and at least one of the groups represented by Formulae CY204 to CY217.

In one or more embodiments, in Formula 201, xa1 is 1, $R_{201}$ is a group represented by one of Formulae CY201 to CY203, xa2 is 0, and $R_{202}$ is a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one of the groups represented by Formulae CY204 to CY217.

In an embodiment, each of Formulae 201 and 202 may not include a group represented by one of Formulae CY201 to CY217.

In an embodiment, the hole transport region may include one of Compounds HT1 to HT44, m-MTDATA, TDATA, 2-TNATA, NPB(NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylene dioxythiophene)/poly(4-styrene sulfonate) (PEDOT/PSS), polyaniline/camphor sulfonic acid (PANI/CSA), polyaniline/poly(4-styrene sulfonate) (PANI/PSS), or any combination thereof:

HT1

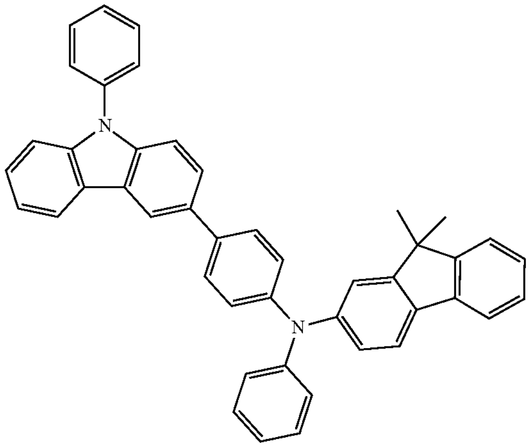

HT2

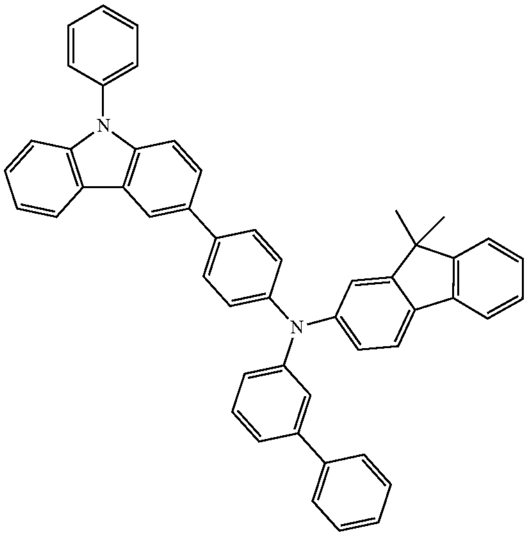

HT3

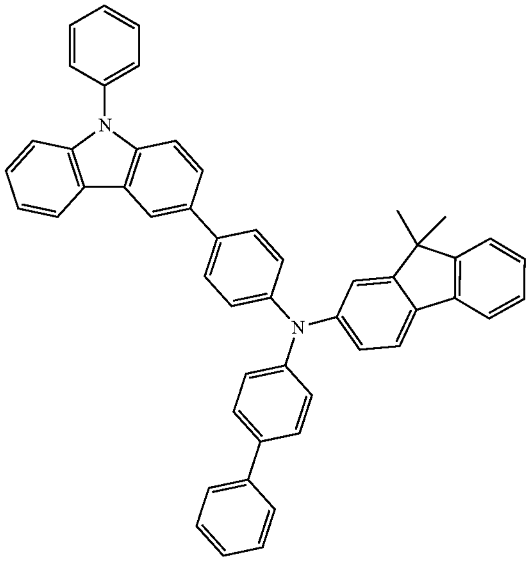

HT4

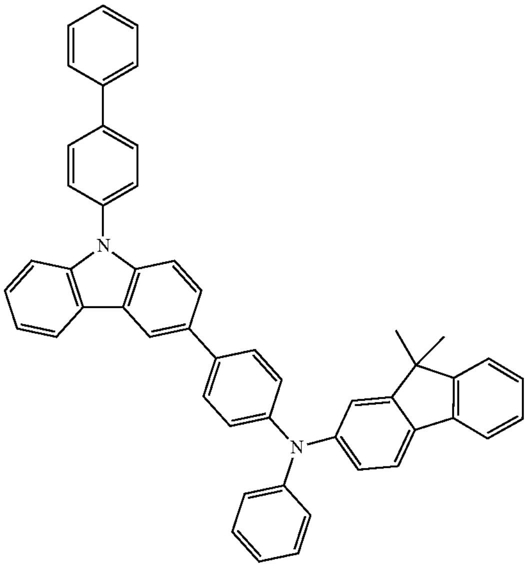

-continued
HT5
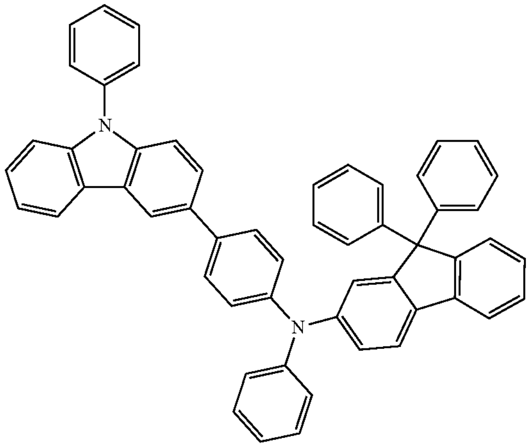
HT6
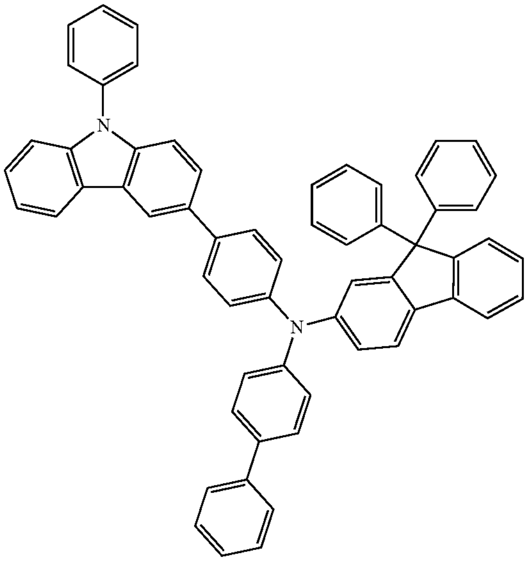
HT7
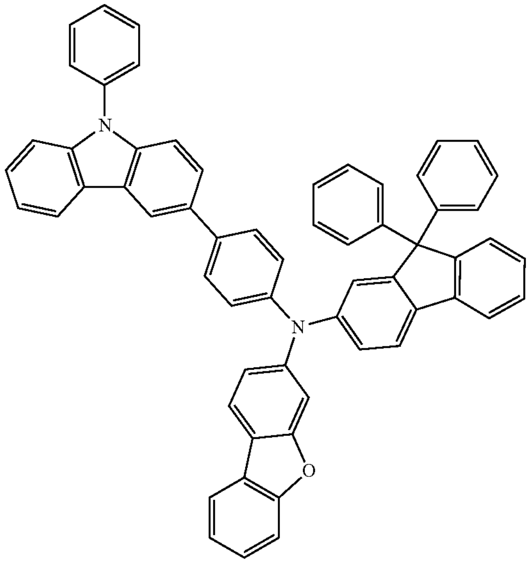
HT8
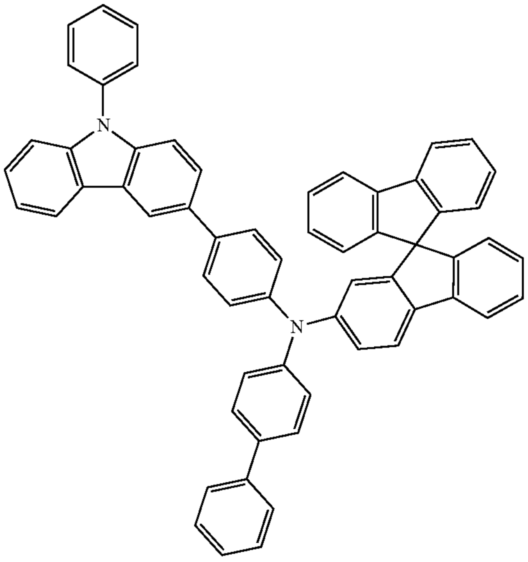

-continued
HT9
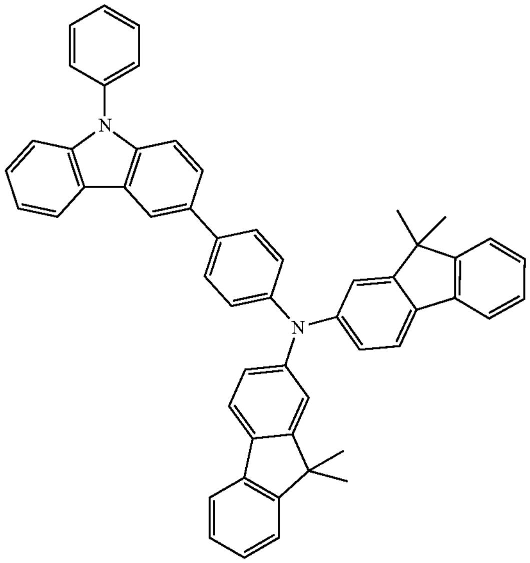
HT10
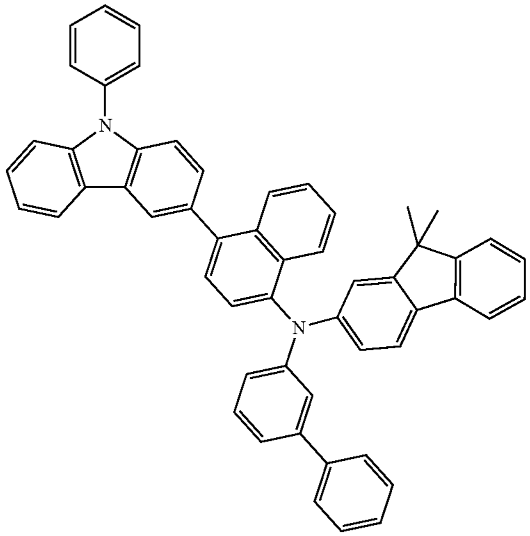
HT11
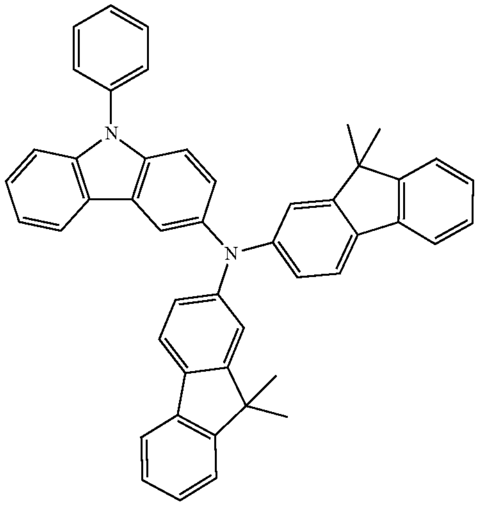
HT12
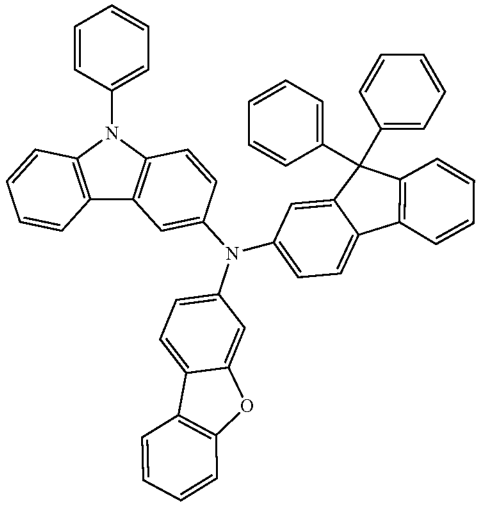
HT13
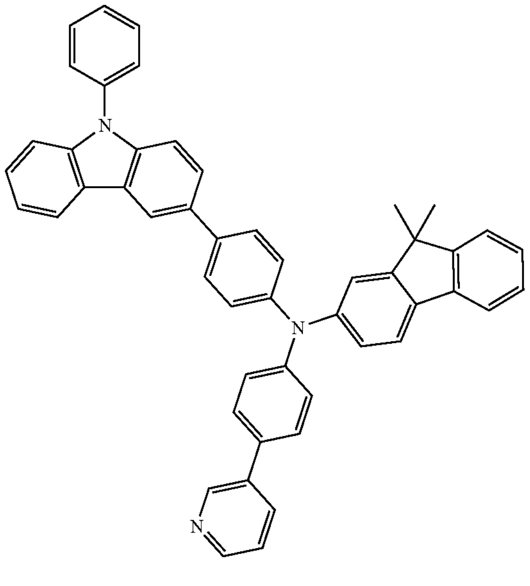
HT14
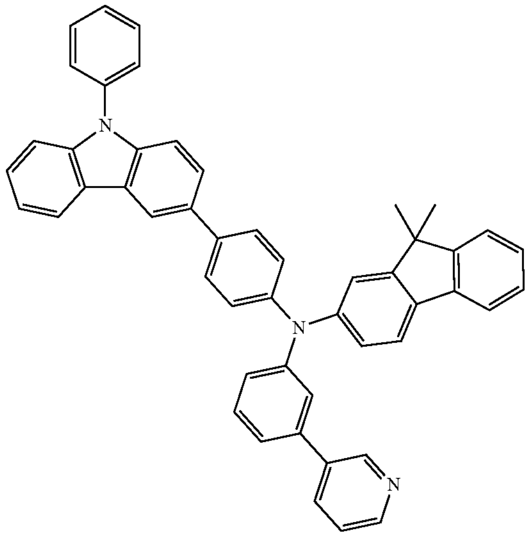

-continued
HT15
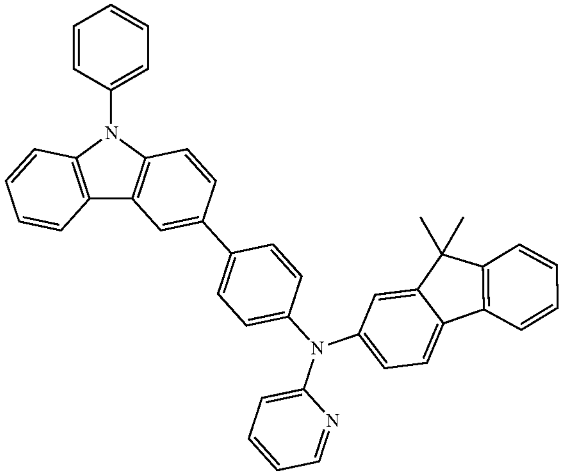
HT16
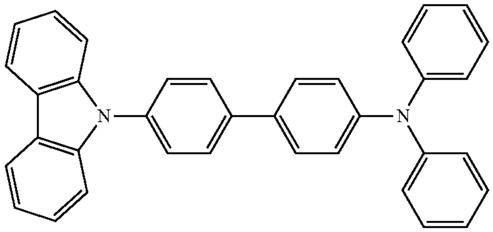
HT17
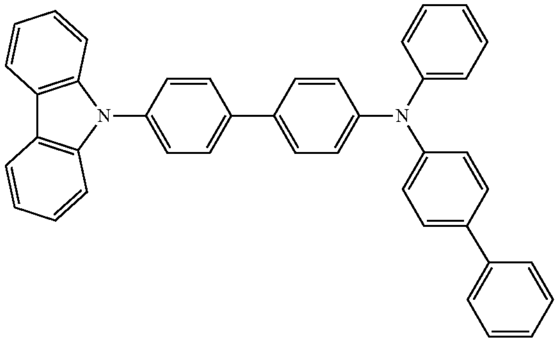
HT18
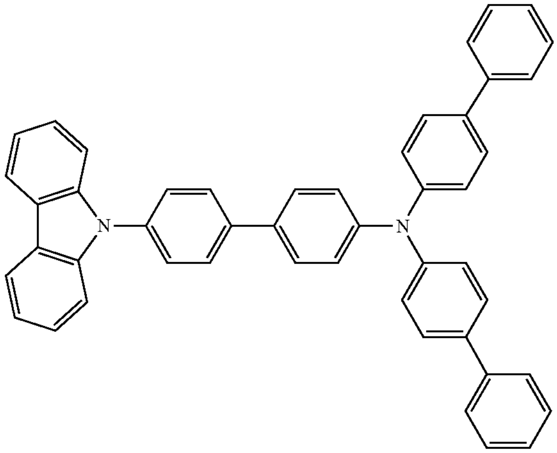
HT19
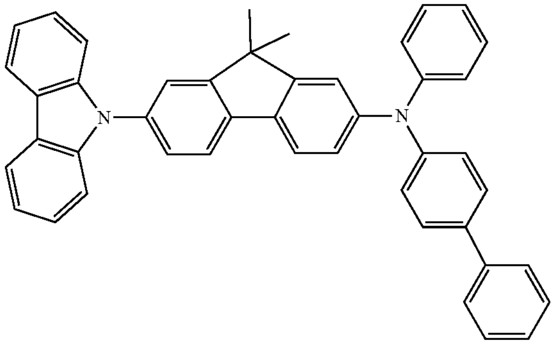

-continued
HT20
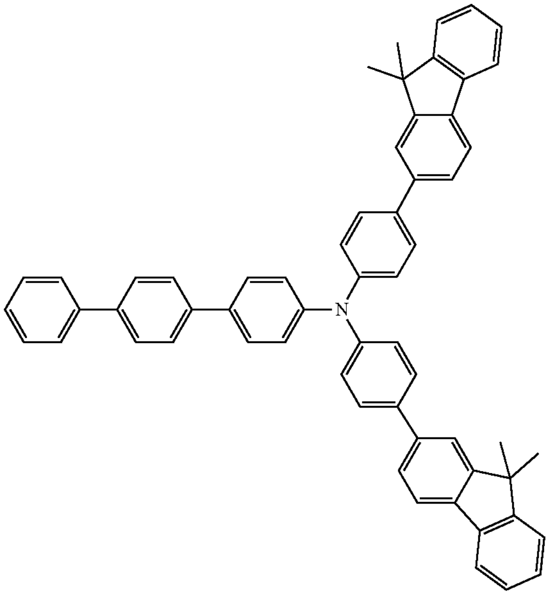
HT21
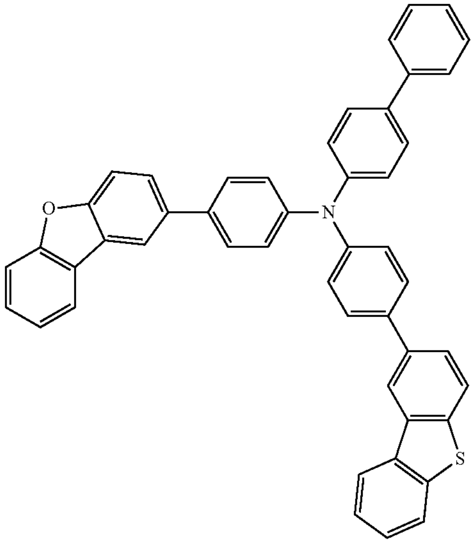
HT22
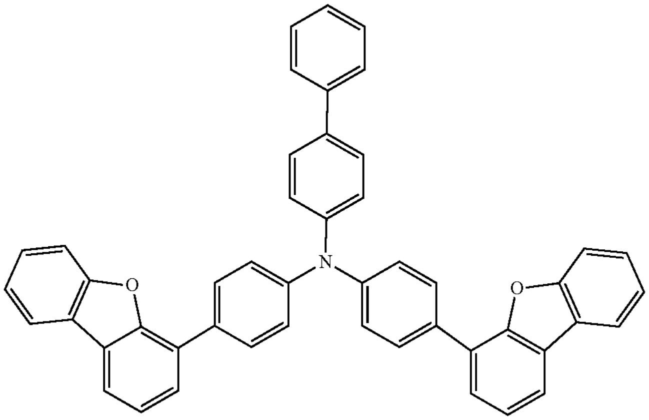
HT23
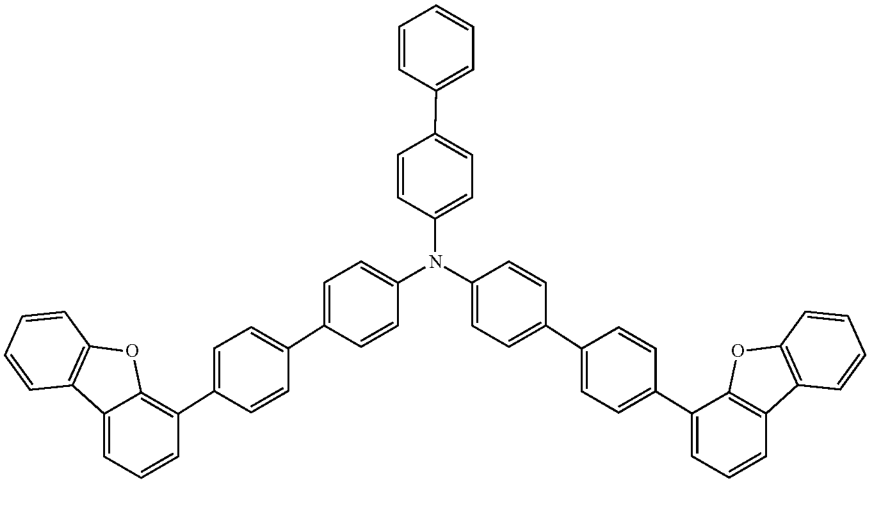

-continued
HT24
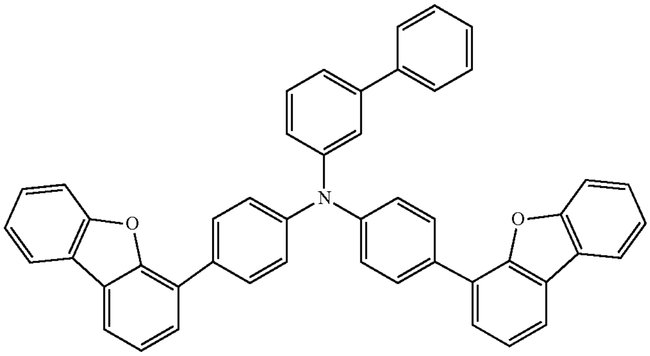
HT25
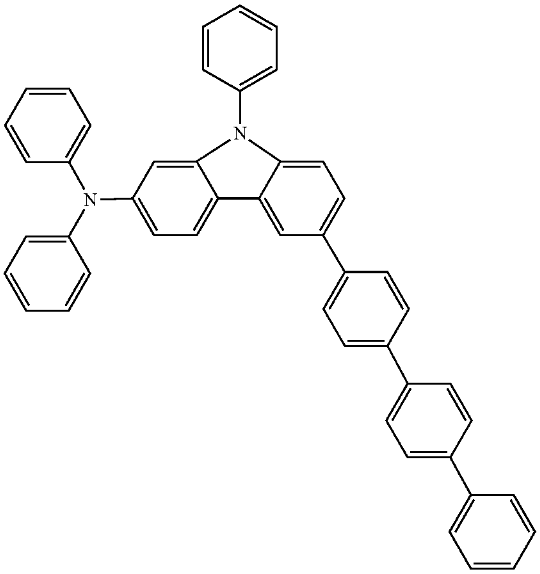
HT26
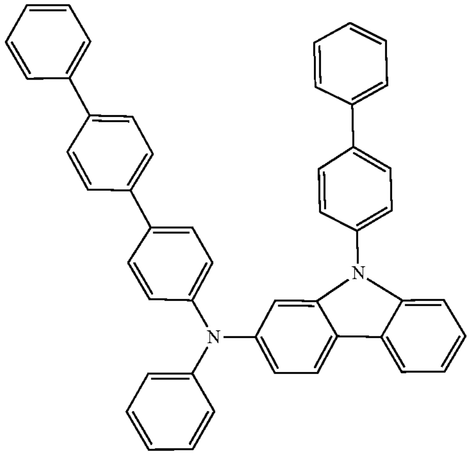
HT27
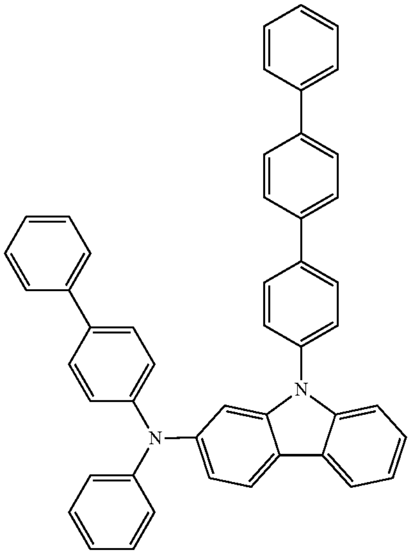
HT28
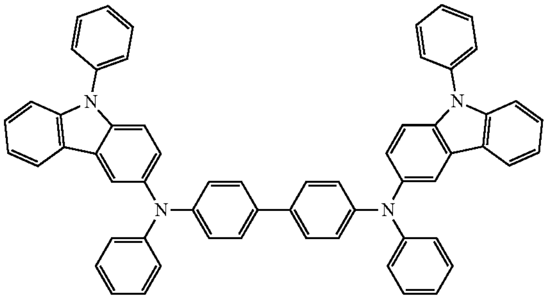

-continued
HT29
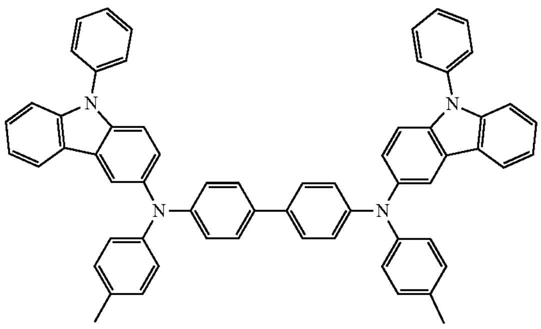
HT30
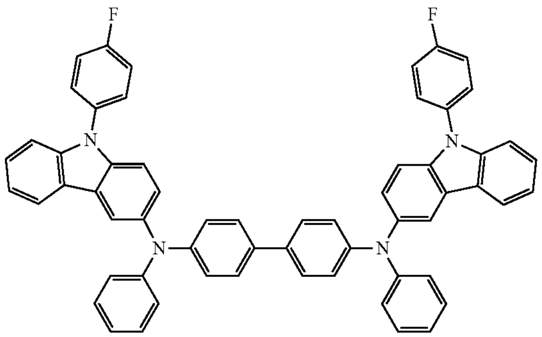
HT31
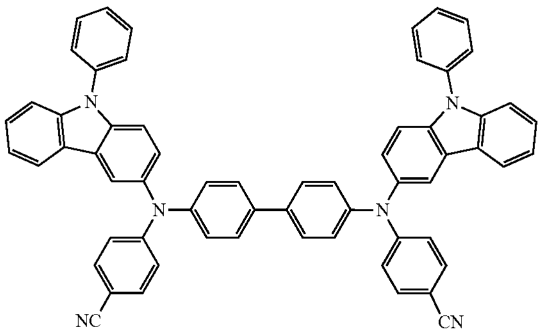
HT32
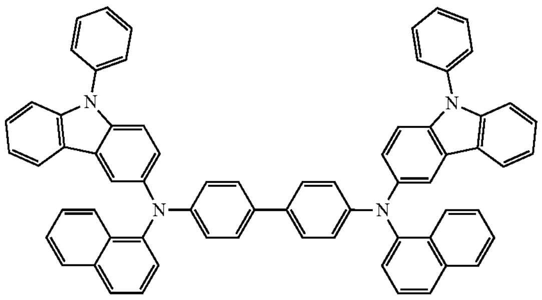
HT33
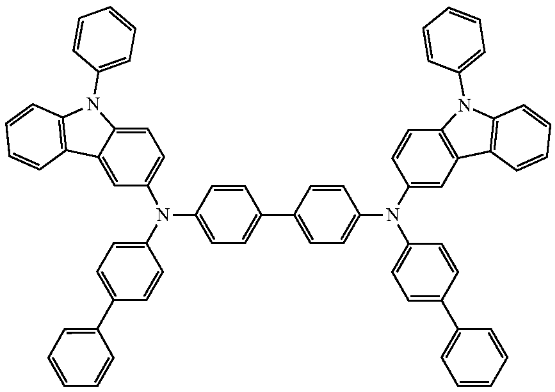
HT34
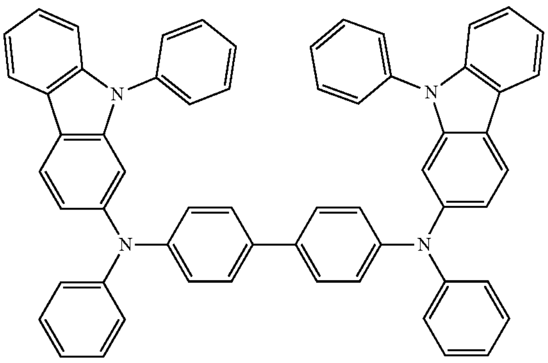
HT35
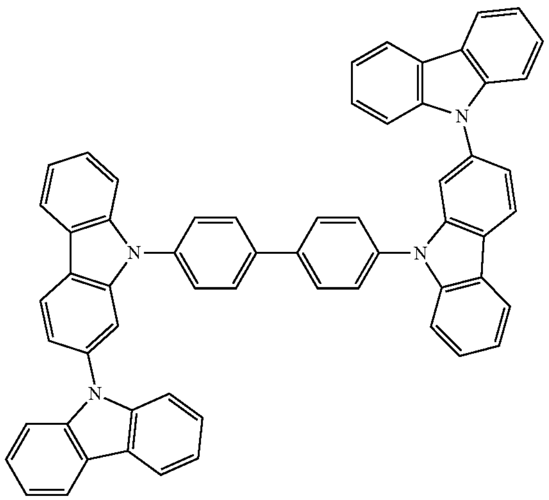
HT36
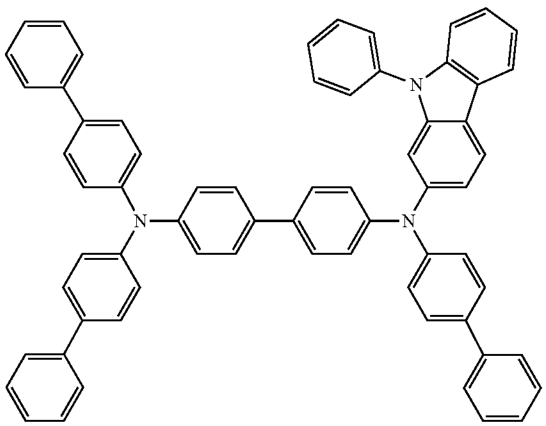

-continued
HT37
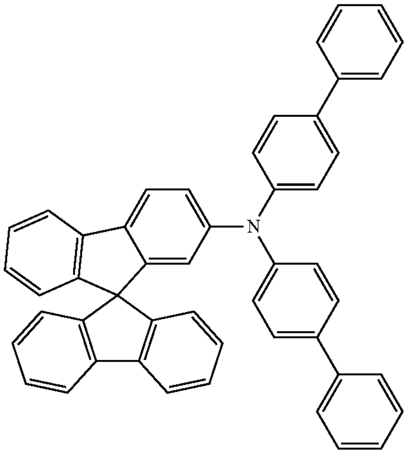
HT38
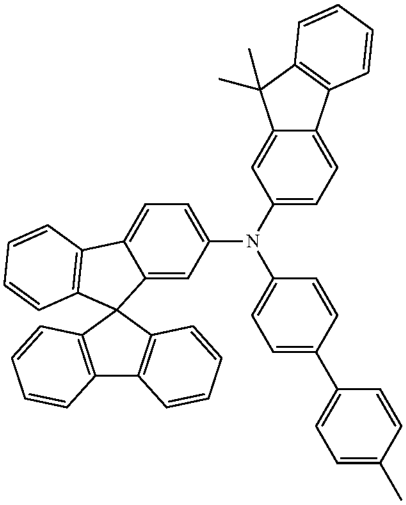
HT39
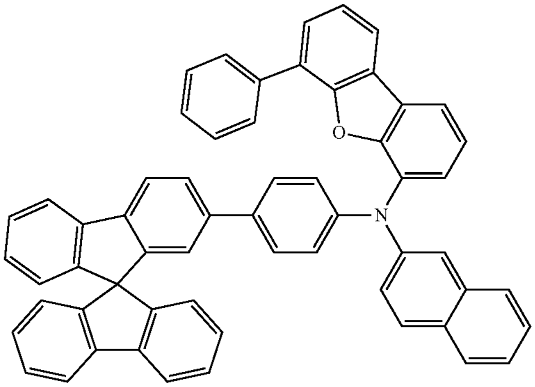
HT40
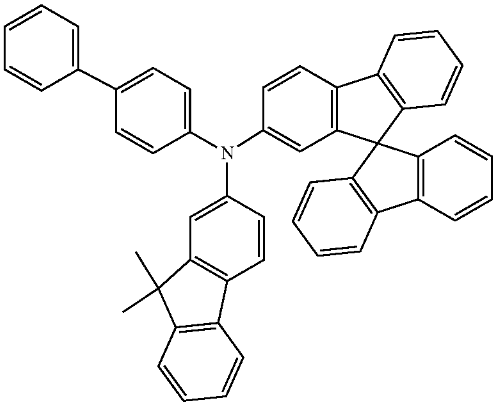
HT41
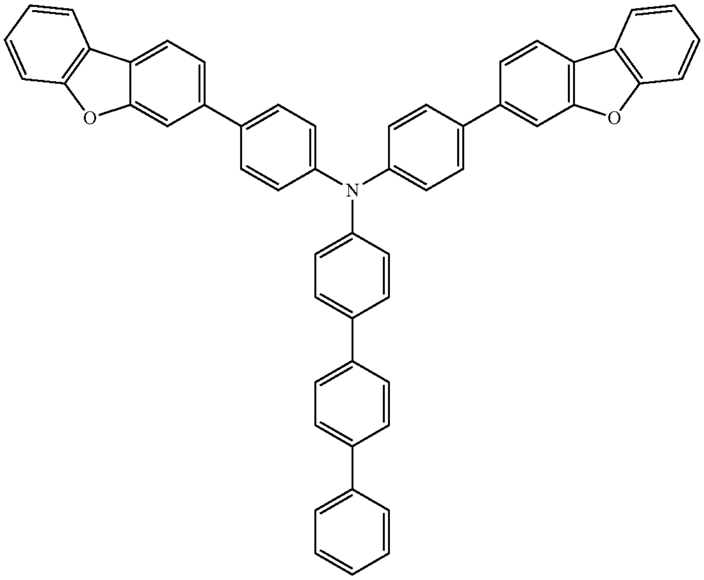

-continued
HT42
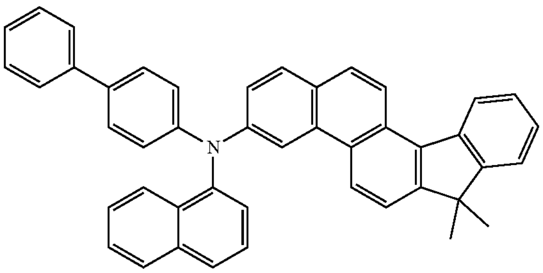
HT43
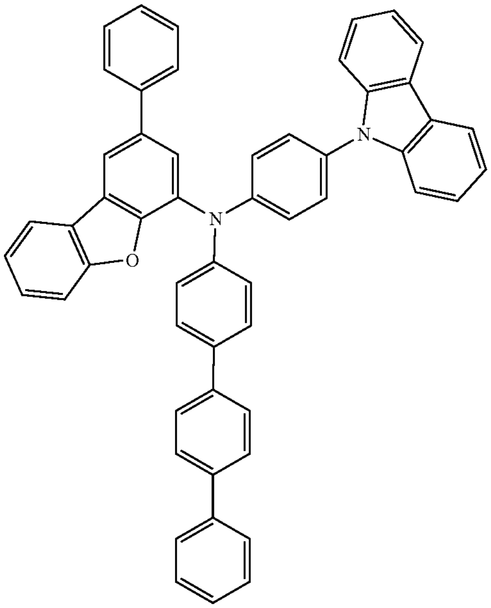
HT44
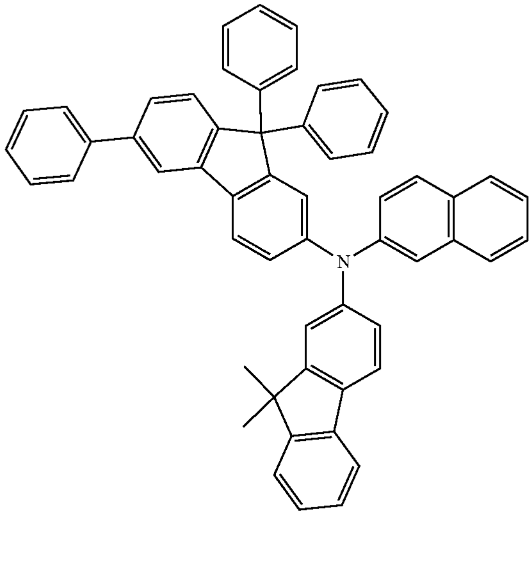
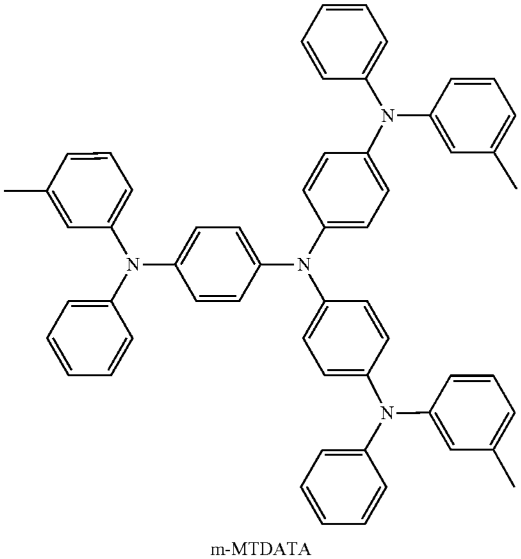
m-MTDATA -continued
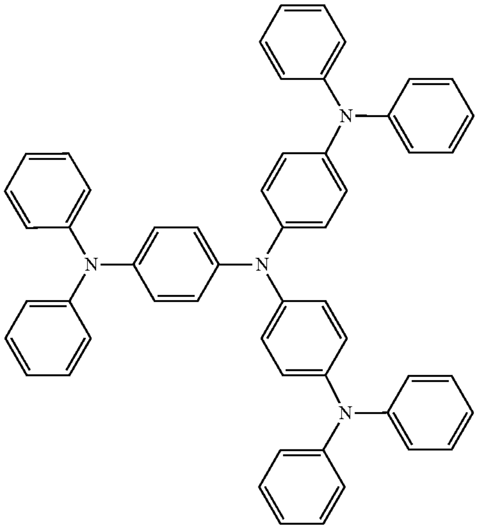
TDATA
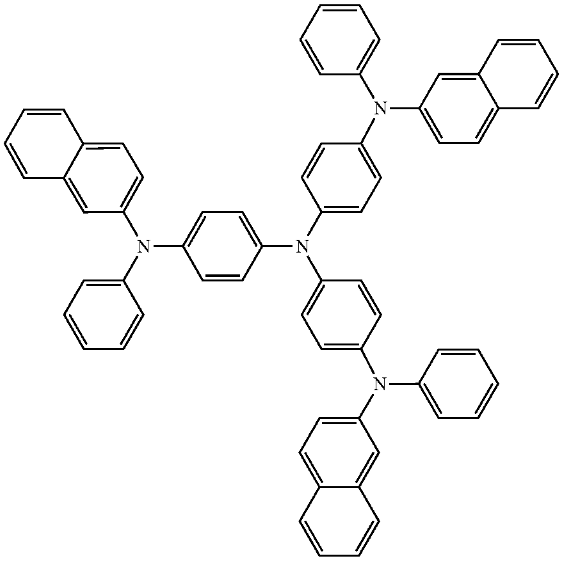
2-TNATA
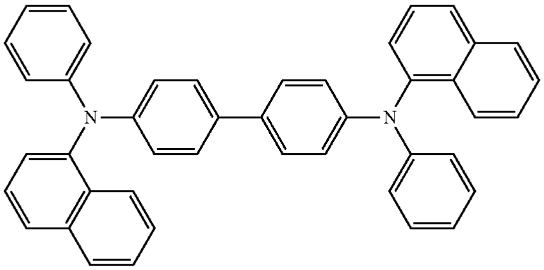
NPB
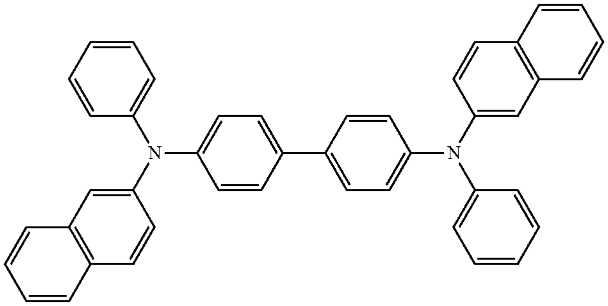
β-NPB
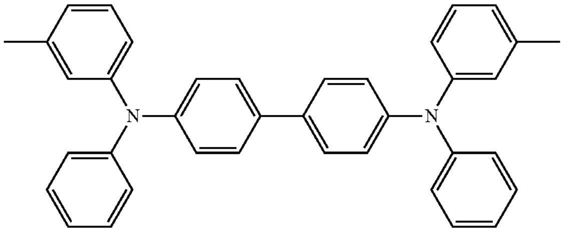
TPD
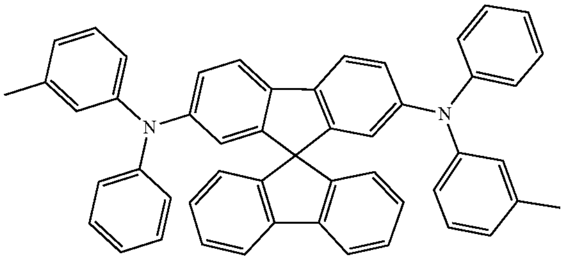
Spiro-TPD
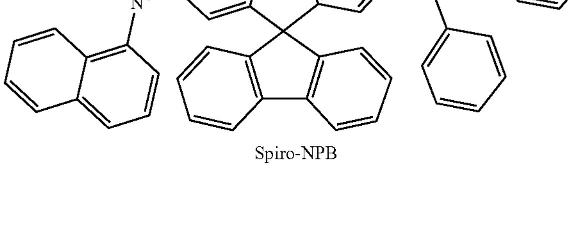
Spiro-NPB
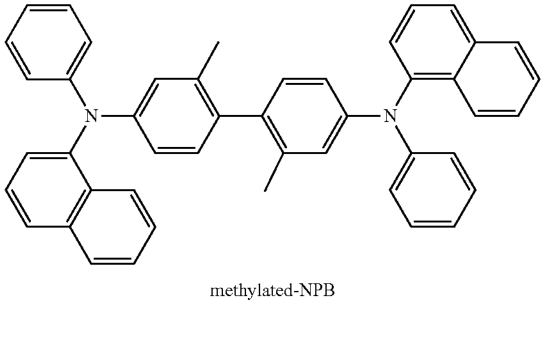
methylated-NPB -continued

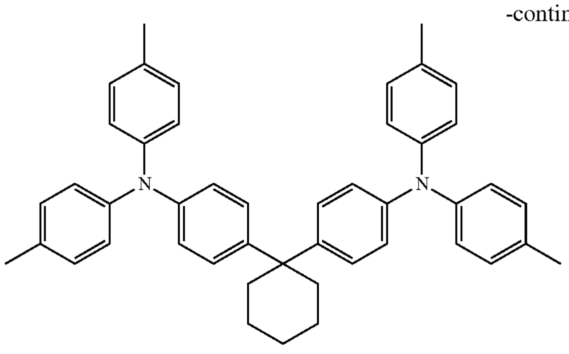

TAPC

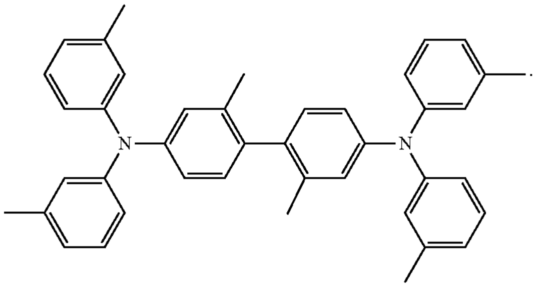

HMTPD

A thickness of the hole transport region may be about 50 Å to about 10,000 Å, for example, about 100 Å to about 4,000 Å. When the hole transport region includes a hole injection layer, a hole transport layer, or any combination thereof, a thickness of the hole injection layer may be about 100 Å to about 9,000 Å, for example, about 100 Å to about 1,000 Å, and a thickness of the hole transport layer may be about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase the light-emission efficiency of the device by compensating for an optical resonance distance of a wavelength of light emitted by an emission layer, and the electron blocking layer may block or reduce the flow of electrons from an electron transport region. The emission auxiliary layer and the electron blocking layer may each include the materials as described above.

p-Dopant

The hole transport region may further include, in addition to these materials, a charge-generation material for the improvement of conductive properties. The charge-generation material may be uniformly or non-uniformly dispersed in the hole transport region (for example, in the form of a single layer including (e.g., consisting of) a charge-generation material).

The charge-generation material may be, for example, a p-dopant.

In an embodiment, a lowest unoccupied molecular orbital (LUMO) energy level of the p-dopant may be −3.5 eV or less.

In an embodiment, the p-dopant may include a quinone derivative, a cyano group-containing compound, a compound containing an element EL1 and an element EL2, or any combination thereof.

Non-limiting examples of the quinone derivative include TCNQ and F4-TCNQ.

Non-limiting examples of the cyano group-containing compound include HAT-CN and a compound represented by Formula 221.

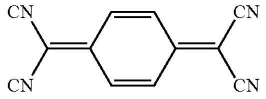

TCNQ

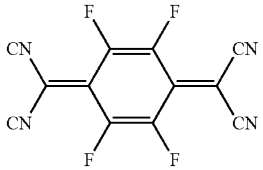

F4-TCNQ

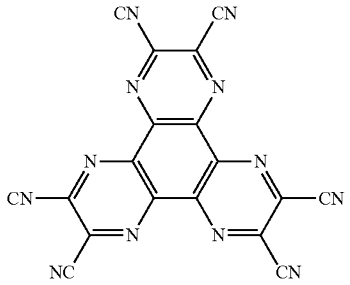

HAT-CN

Formula 221

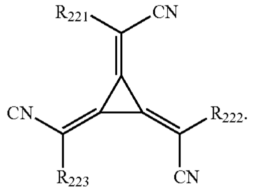

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the compound containing the element EL1 and the element EL2, the element EL1 may be a metal, a metalloid, or a combination thereof, and the element EL2 may be a non-metal, a metalloid, or a combination thereof.

Non-limiting examples of the metal include: an alkali metal (for example, lithium (Li), sodium (Na), potassium (K), rubidium (Rb), cesium (Cs), and/or the like); an alkaline earth metal (for example, beryllium (Be), magnesium (Mg), calcium (Ca), strontium (Sr), barium (Ba), and/or the like);

a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); a post-transition metal (for example, zinc (Zn), indium (In), tin (Sn), and/or the like); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), ruthenium (Lu), and/or the like).

Non-limiting examples of the metalloid include silicon (Si), antimony (Sb), and tellurium (Te).

Non-limiting examples of the non-metal include oxygen (O) and a halogen (for example, F, Cl, Br, I, etc.).

In an embodiment, non-limiting examples of the compound containing the element EL1 and the element EL2 include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Non-limiting examples of the metal oxide include a tungsten oxide (for example, WO, $W_2O_3$, $WO_2$, $WO_3$, or $W_2O_5$), a vanadium oxide (for example, VO, $V_2O_3$, $VO_2$, or $V_2O_5$), a molybdenum oxide (MoO, $Mo_2O_3$, $MoO_2$, $MoO_3$, or $Mo_2O_5$), and a rhenium oxide (for example, $ReO_3$).

Non-limiting examples of the metal halide include an alkali metal halide, transition alkaline earth metal halide, a transition metal halide, a post-transition metal halide, and a lanthanide metal halide.

Non-limiting examples of the alkali metal halide include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Non-limiting examples of the alkaline earth metal halide include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Non-limiting examples of the transition metal halide include a titanium halide (for example, $TiF_4$, $TiCl_4$, $TiBr_4$, or $TiI_4$), a zirconium halide (for example, $ZrF_4$, $ZrCl_4$, $ZrBr_4$, or $ZrI_4$), a hafnium halide (for example, $HfF_4$, $HfCl_4$, $HfBr_4$, or $HfI_4$), a vanadium halide (for example, $VF_3$, $VCl_3$, $VBr_3$, or $VI_3$), a niobium halide (for example, $NbF_3$, $NbCl_3$, $NbBr_3$, or $NbI_3$), a tantalum halide (for example, $TaF_3$, $TaCl_3$, $TaBr_3$, or $TaI_3$), a chromium halide (for example, $CrF_3$, $CrCl_3$, $CrBr_3$, or $CrI_3$), a molybdenum halide (for example, $MoF_3$, $MoCl_3$, $MoBr_3$, or $MoI_3$), a tungsten halide (for example, $WF_3$, $WCl_3$, $WBr_3$, or $WI_3$), a manganese halide (for example, $MnF_2$, $MnCl_2$, $MnBr_2$, or $MnI_2$), a technetium halide (for example, $TcF_2$, $TcCl_2$, $TcBr_2$, or $TcI_2$), a rhenium halide (for example, $ReF_2$, $ReCl_2$, $ReBr_2$, or $ReI_2$), an iron halide (for example, $FeF_2$, $FeCl_2$, $FeBr_2$, or $FeI_2$), a ruthenium halide (for example, $RuF_2$, $RuCl_2$, $RuBr_2$, or $RuI_2$), an osmium halide (for example, $OsF_2$, $OsCl_2$, $OsBr_2$, or $OsI_2$), a cobalt halide (for example, $CoF_2$, $CoCl_2$, $CoBr_2$, or $CoI_2$), a rhodium halide (for example, $RhF_2$, $RhCl_2$, $RhBr_2$, or $RhI_2$), an iridium halide (for example, $IrF_2$, $IrCl_2$, $IrBr_2$, or $IrI_2$), a nickel halide (for example, $NiF_2$, $NiCl_2$, $NiBr_2$, or $NiI_2$), a palladium halide (for example, $PdF_2$, $PdCl_2$, $PdBr_2$, or $PdI_2$), a platinum halide (for example, $PtF_2$, $PtCl_2$, $PtBr_2$, or $PtI_2$), a copper halide (for example, CuF, CuCl, CuBr, or CuI), a silver halide (for example, AgF, AgCl, AgBr, or AgI), and a gold halide (for example, AuF, AuCl, AuBr, or AuI).

Non-limiting examples of the post-transition metal halide include a zinc halide (for example, $ZnF_2$, $ZnCl_2$, $ZnBr_2$, or $ZnI_2$), an indium halide (for example, $InI_3$), and a tin halide (for example, $SnI_2$).

Non-limiting examples of the lanthanide metal halide include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

Non-limiting examples of the metalloid halide include antimony halide (for example, $SbCl_5$).

Non-limiting examples of the metal telluride include an alkali metal telluride (for example, $Li_2Te$, $Na_2Te$, $K_2Te$, $Rb_2Te$, or $Cs_2Te$), an alkaline earth metal telluride (for example, BeTe, MgTe, CaTe, SrTe, or BaTe), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), a post-transition metal telluride (for example, ZnTe), and a lanthanide metal telluride (for example, LaTe, CeTe, PrTe, NdTe, PmTe, EuTe, GdTe, TbTe, DyTe, HoTe, ErTe, TmTe, YbTe, or LuTe).

Emission Layer Stack in Interlayer 130

As described above, the emission layer stack may include the first emission layer and the second emission layer, and the first emission layer may contact (e.g., directly contact) the second emission layer. The emission layer stack may be to emit blue light.

Each of the first emission layer and the second emission layer in the emission layer stack may independently include a host and a dopant. The dopant may be or include a TADF dopant.

An amount of the dopant in the emission layer may be about 0.01 parts by weight to about 15 parts by weight based on 100 parts by weight of the host.

A thickness of the emission layer may be about 100 Å to about 1,000 Å, for example, about 200 Å to about 600 Å. When the thickness of the emission layer is within this range, excellent light-emission characteristics may be obtained without a substantial increase in driving voltage.

Host in Emission Layer

The first host and the second host respectively included in the first emission layer and the second emission layer may be the same as described above.

Examples of the first host and the second host are as described above.

Additional detailed examples of the first host and the second host may include one of following Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1
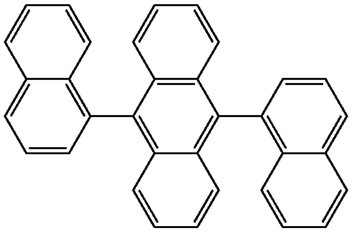
H2
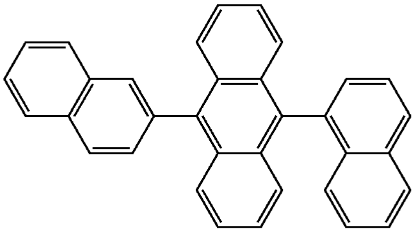
H3
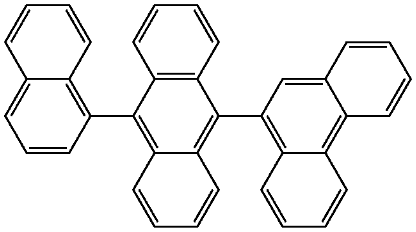
H4
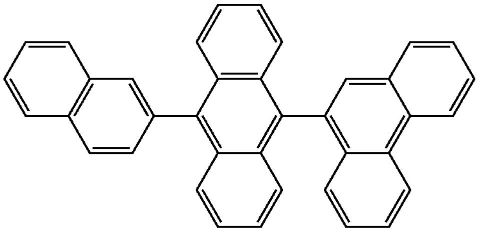
H5
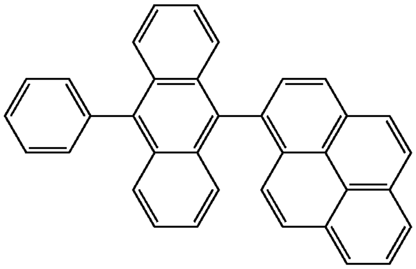
H6
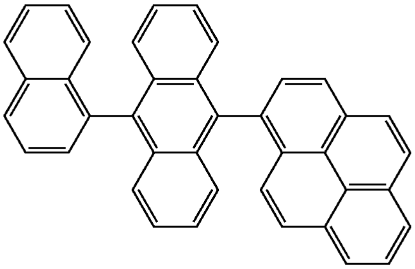
H7
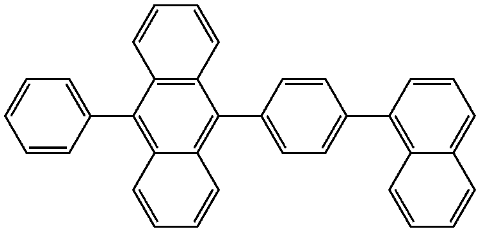
H8
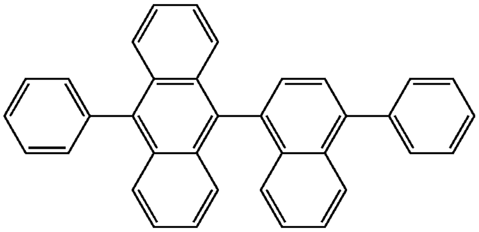
H9
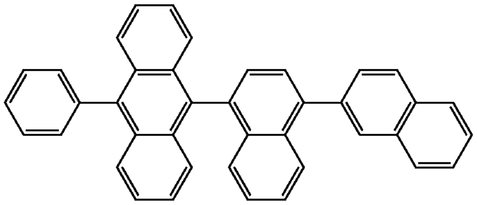
H10
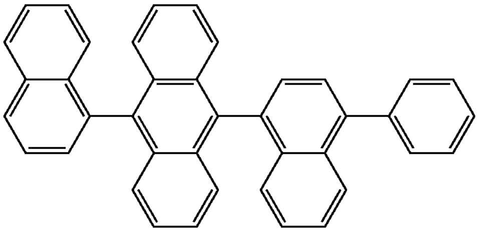
H11
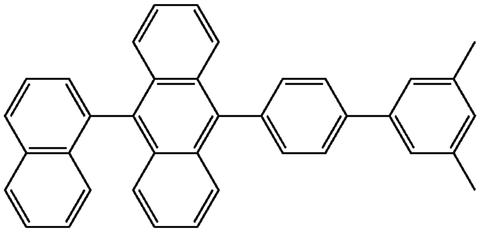
H12
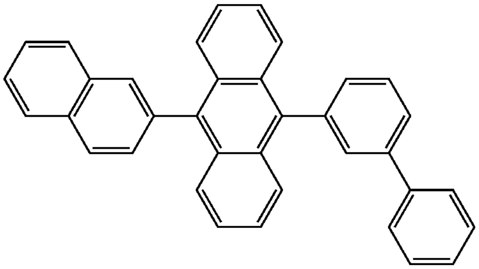

-continued
H13
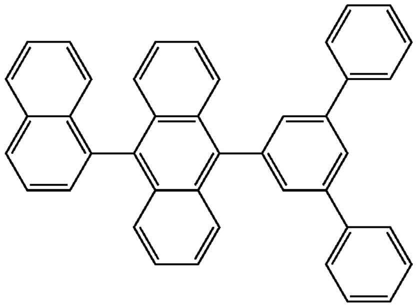
H14
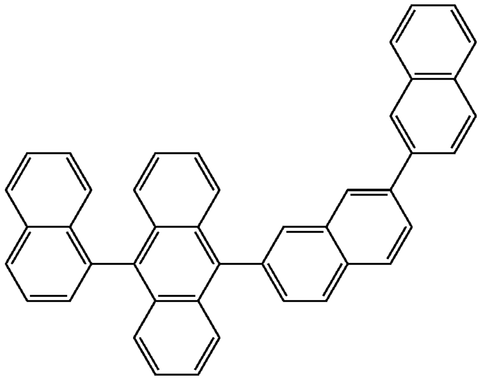
H15
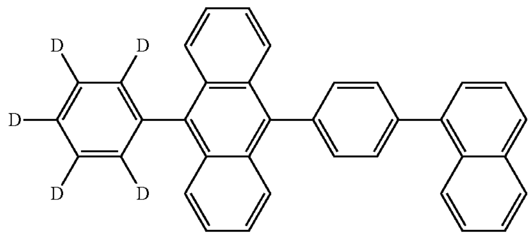
H16
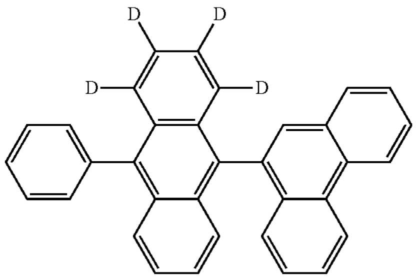
H17
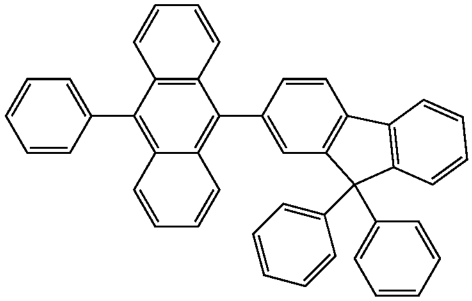
H18
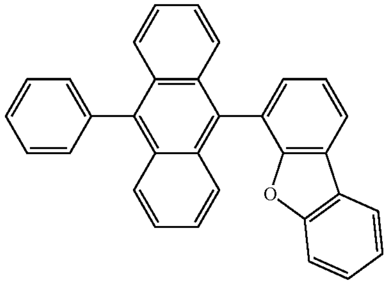
H19
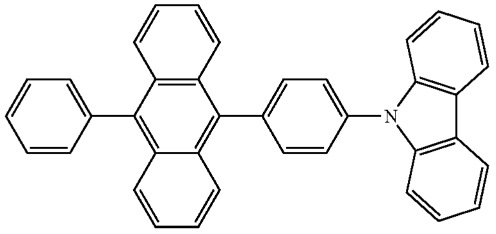
H20
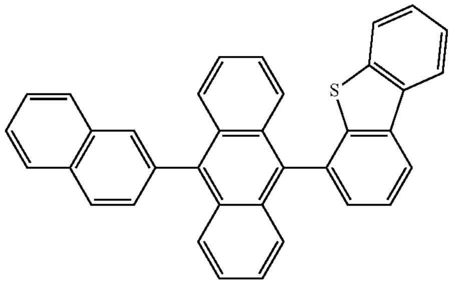

-continued
H21
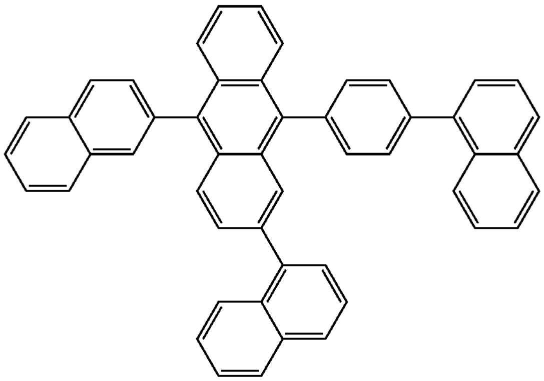
H22
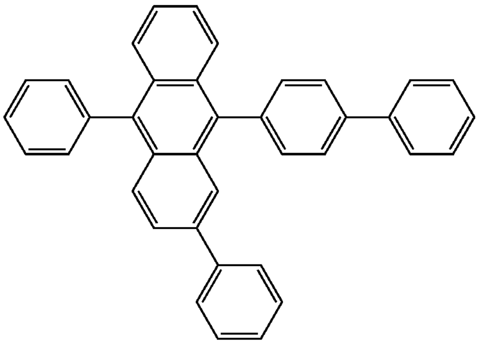
H23
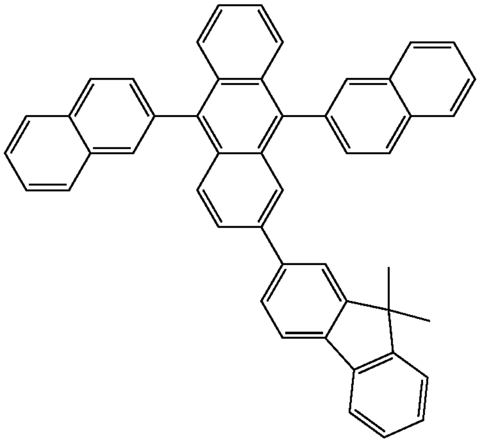
H24
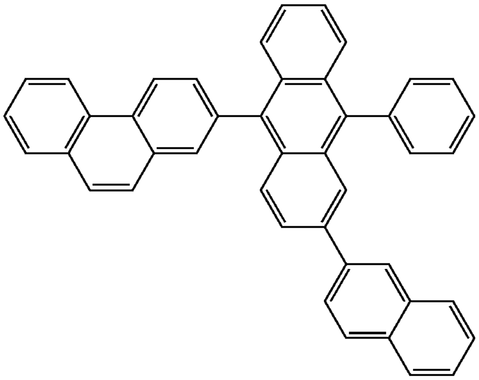
H25
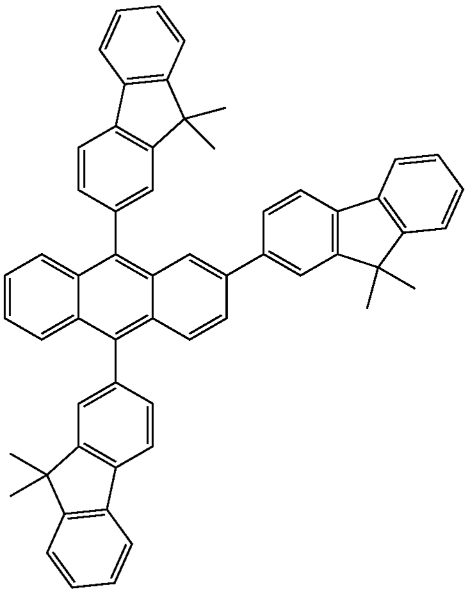
H26
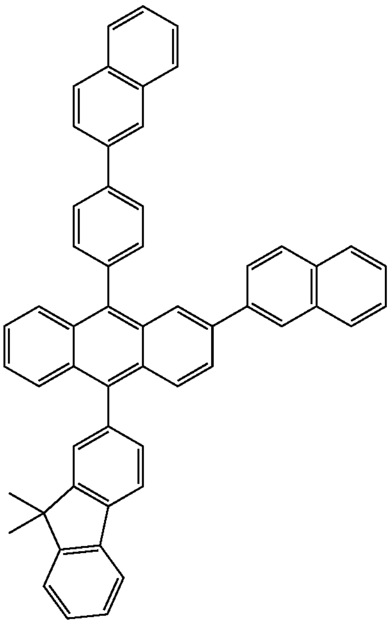

-continued
H27
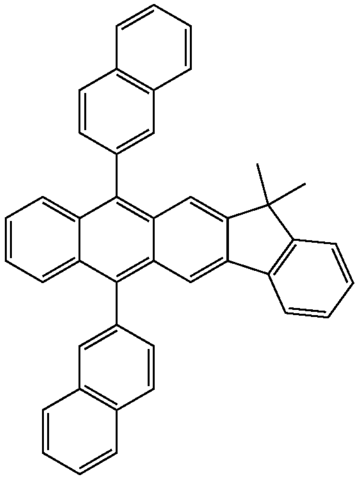
H28
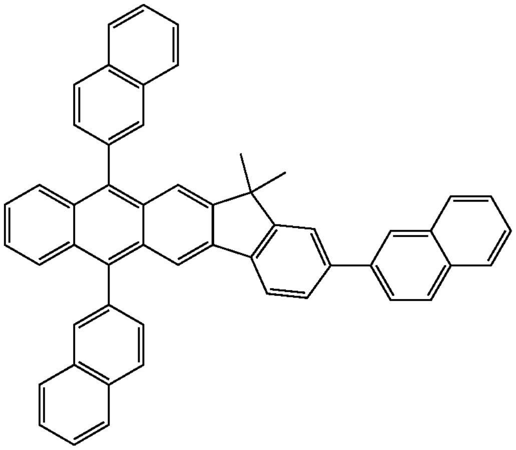
H29
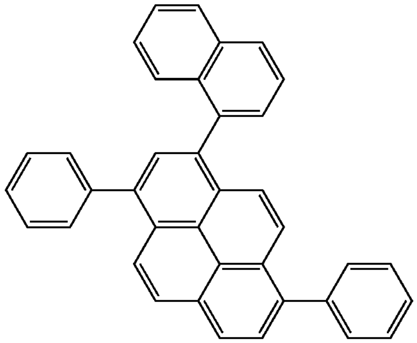
H30
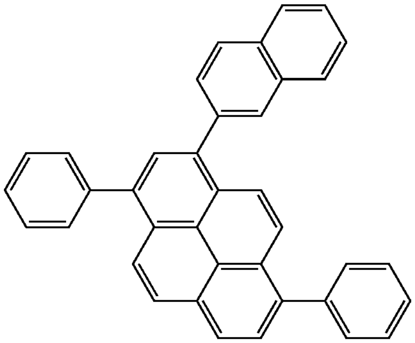
H31
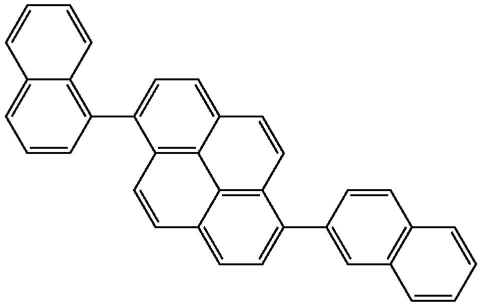
H32
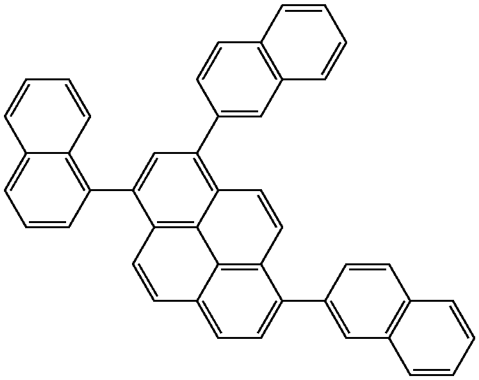
H33
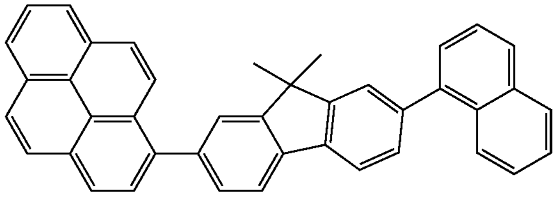

-continued
H34
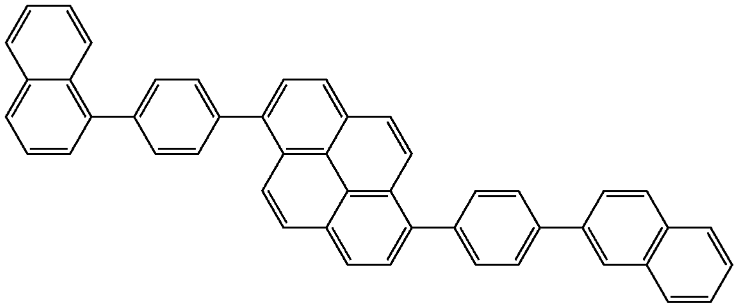
H35
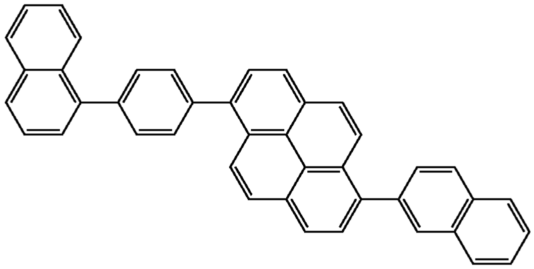
H36
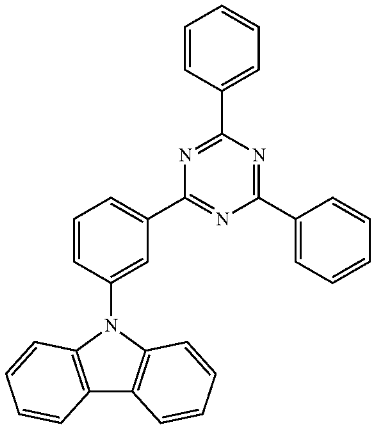
H37
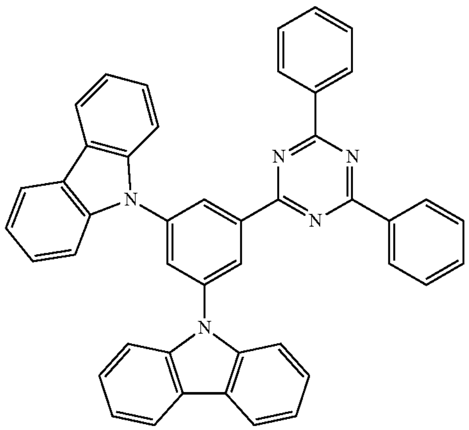
H38
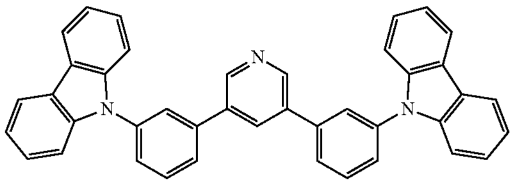

-continued
H39
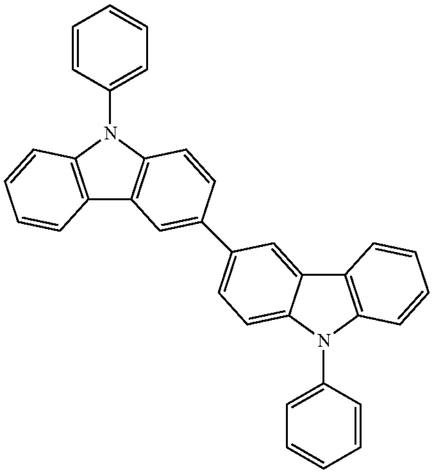
H40
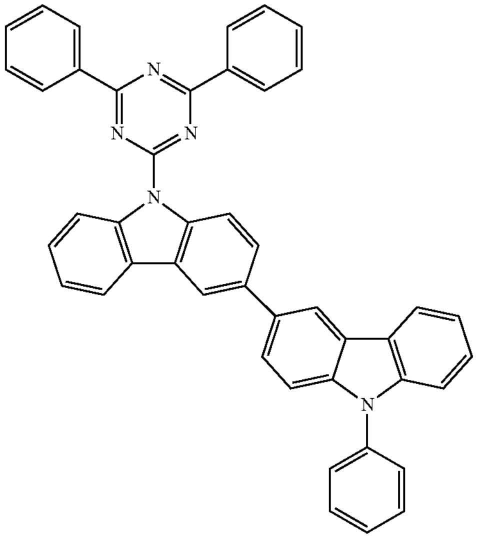
H41
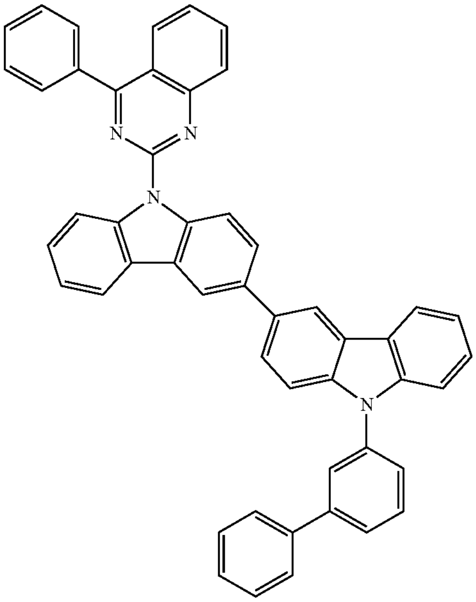
H42
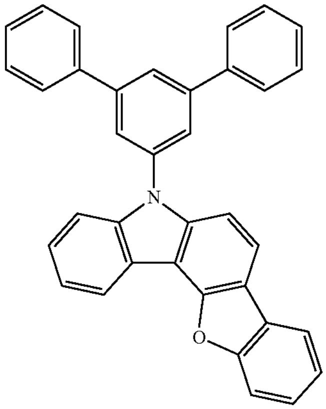
H43
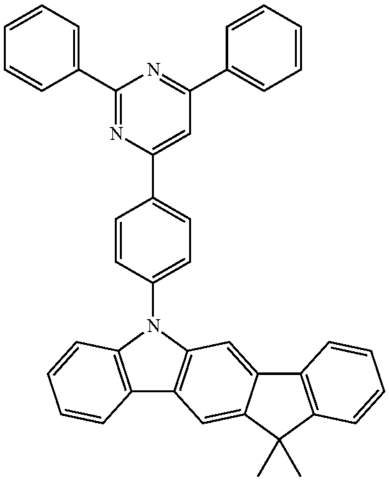
H44
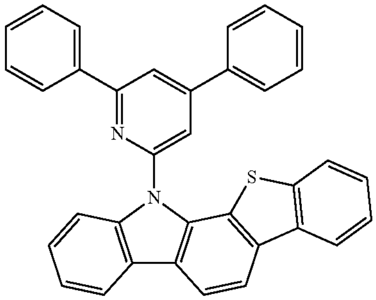

-continued
H45
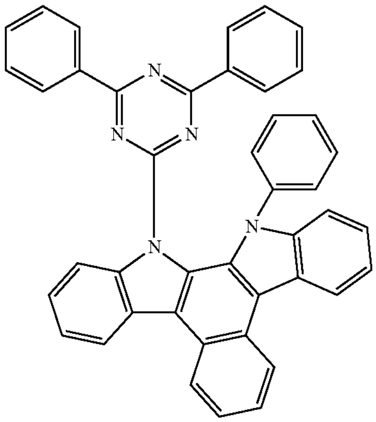
H46
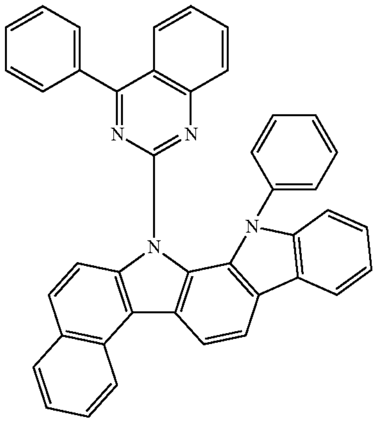
H47
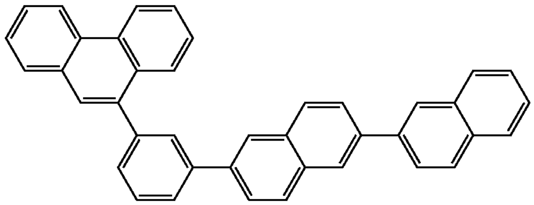
H48
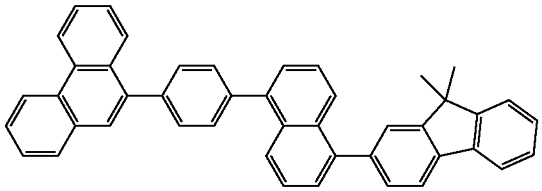
H49
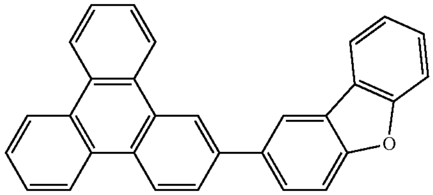
H50
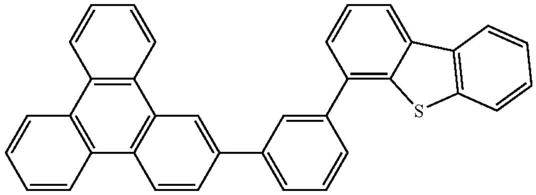
H51
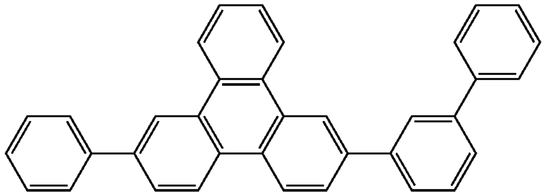
H52
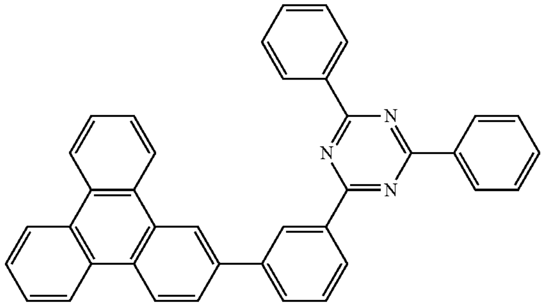
H53
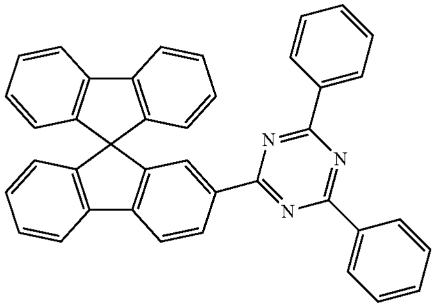
H54
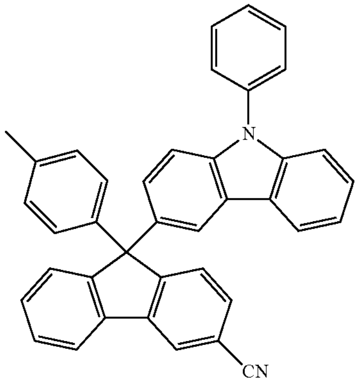

-continued
H55
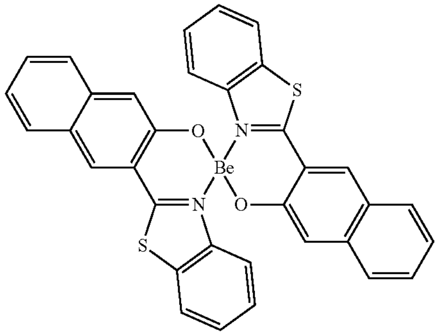
H56
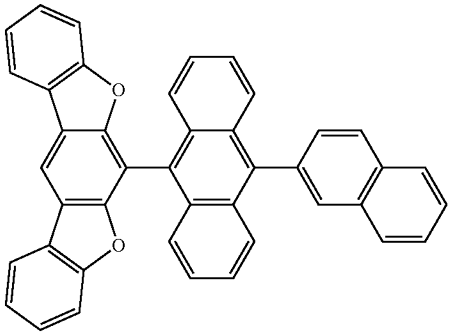
H57
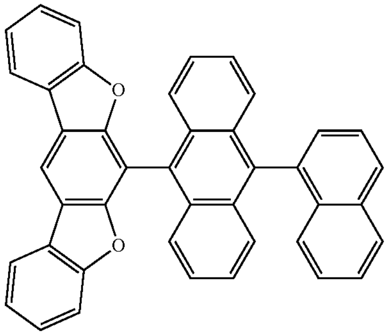
H58
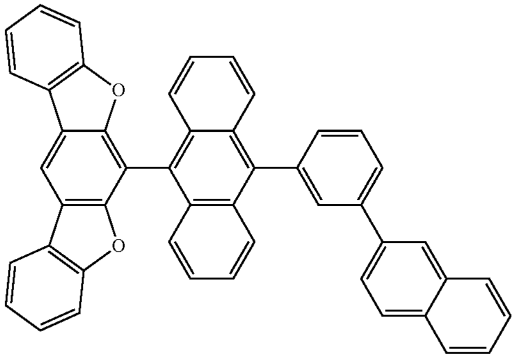
H59
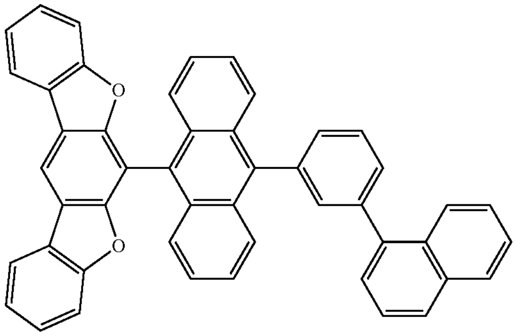
H60
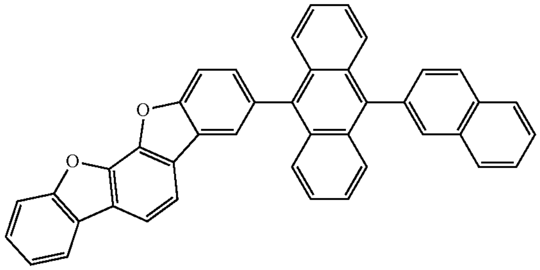
H61
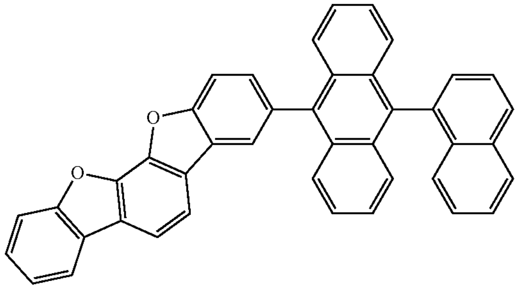
H62
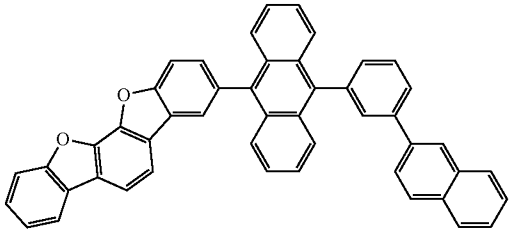

-continued
H63
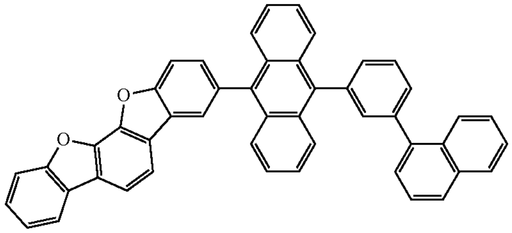
H64
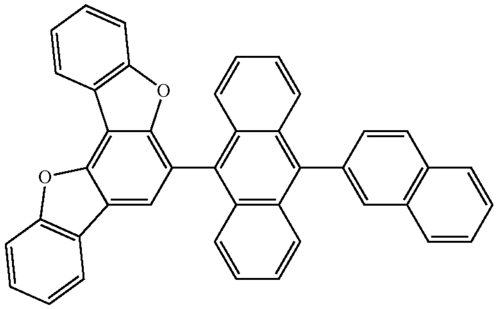
H65
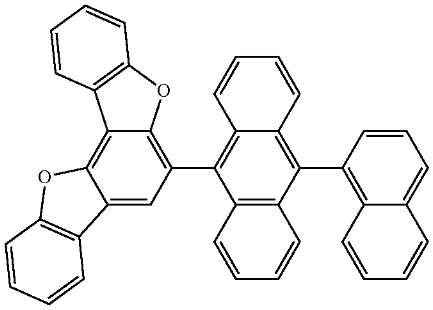
H66
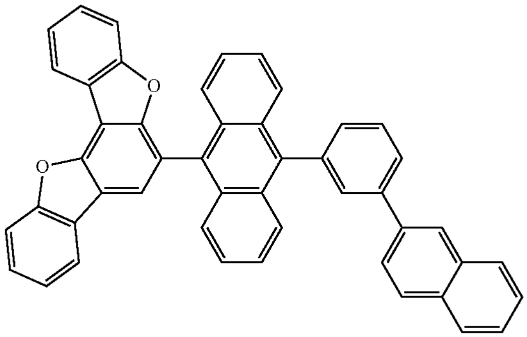
H67
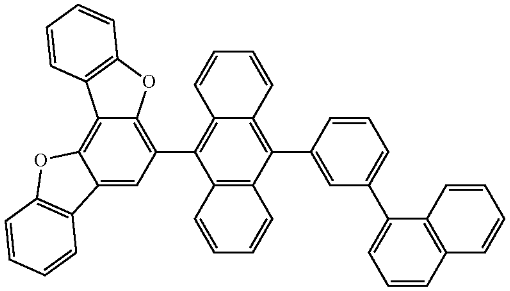
H68
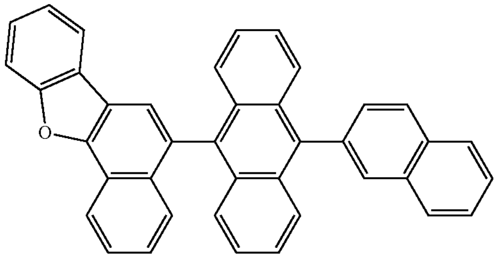
H69
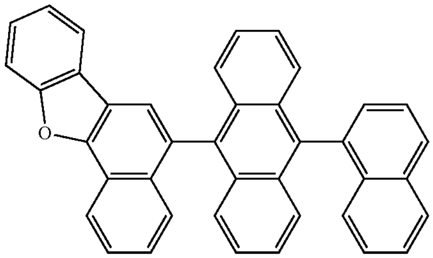
H70
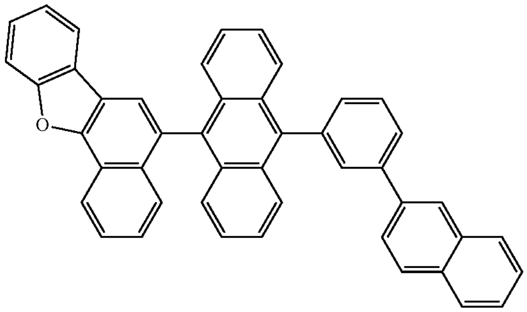
H71
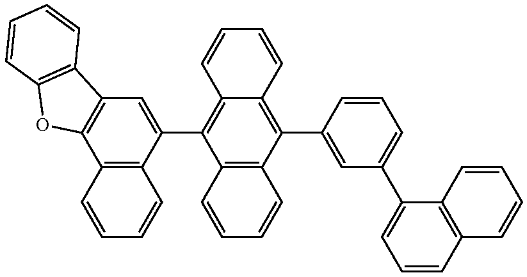
H72
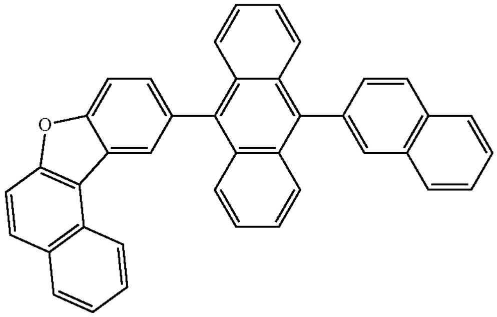

-continued
H73
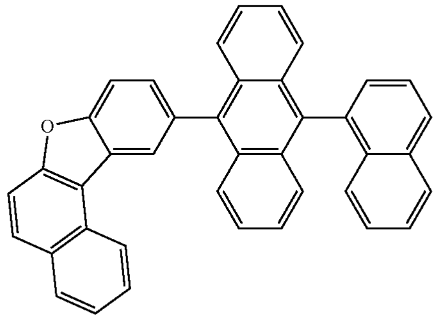
H74
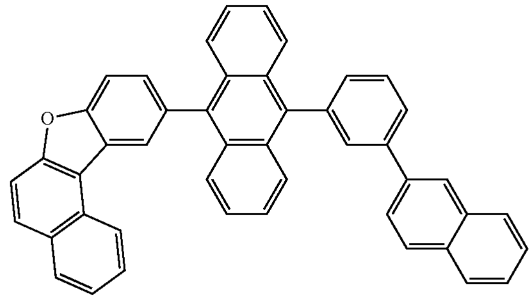
H75
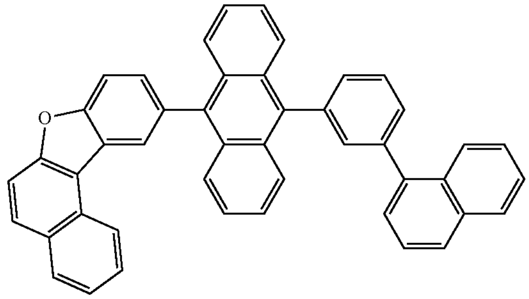
H76
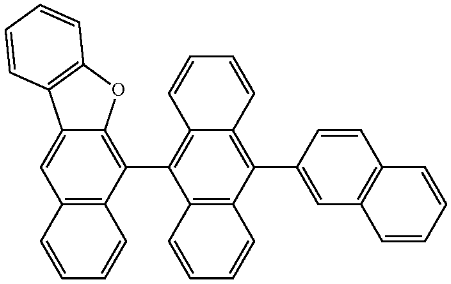
H77
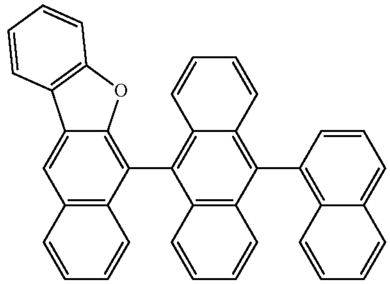
H78
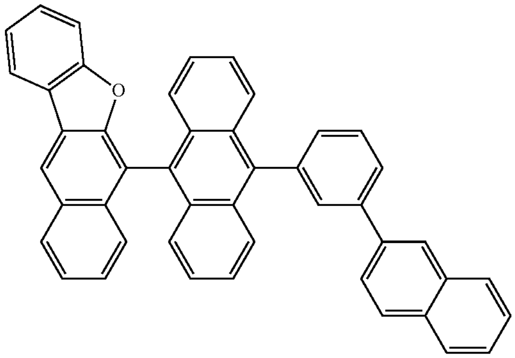
H79
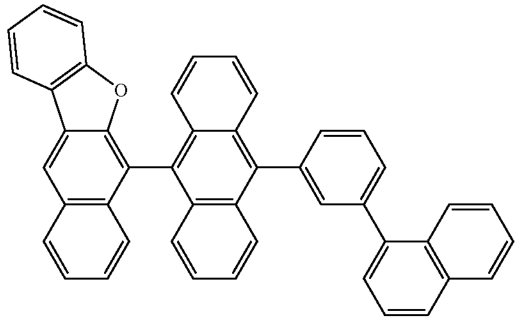
H80
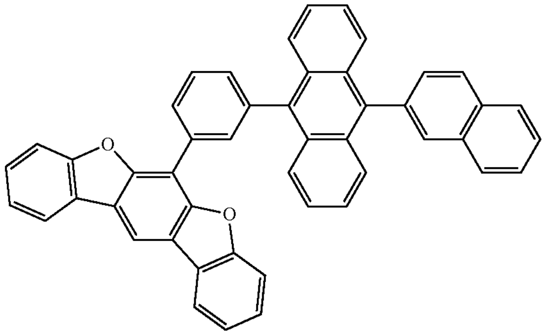

-continued
H81
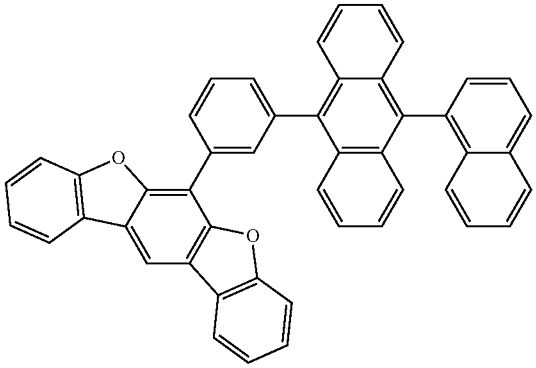
H82
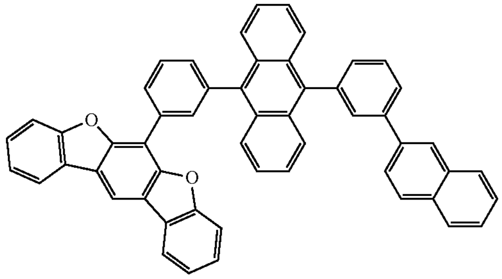
H83
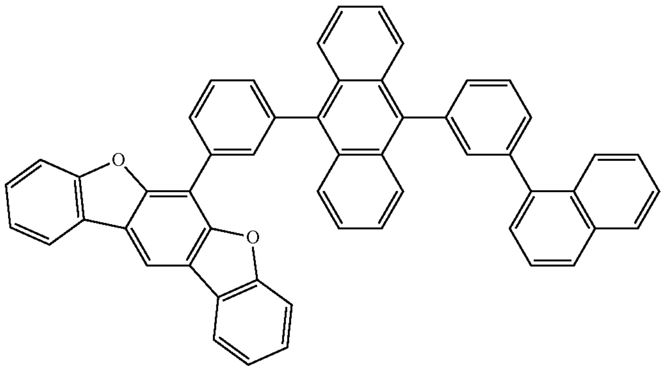
H84
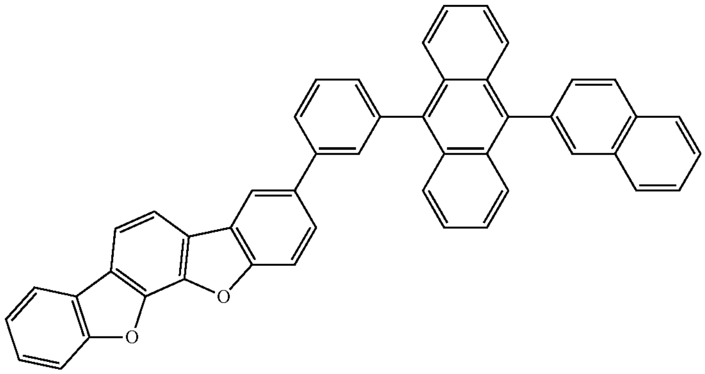
H85
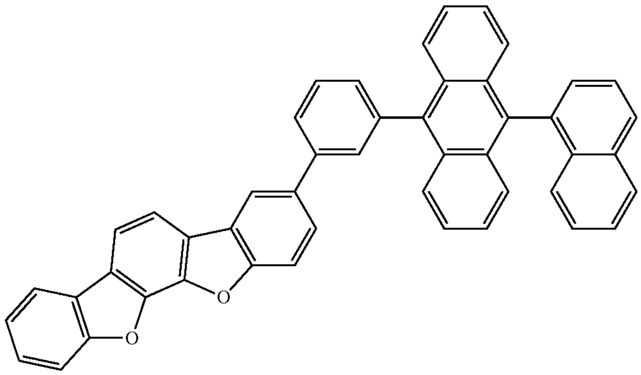

-continued
H86
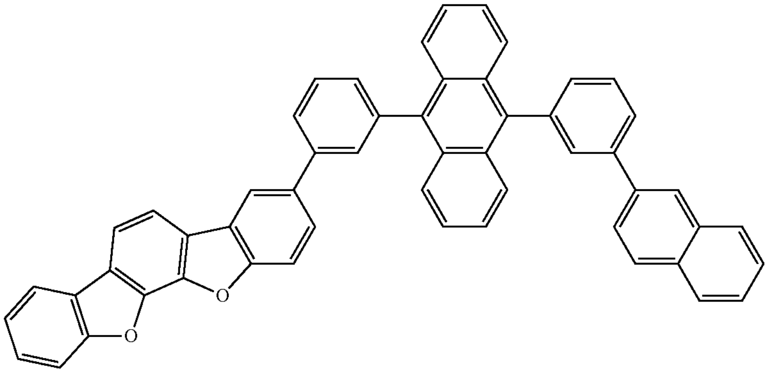
H87
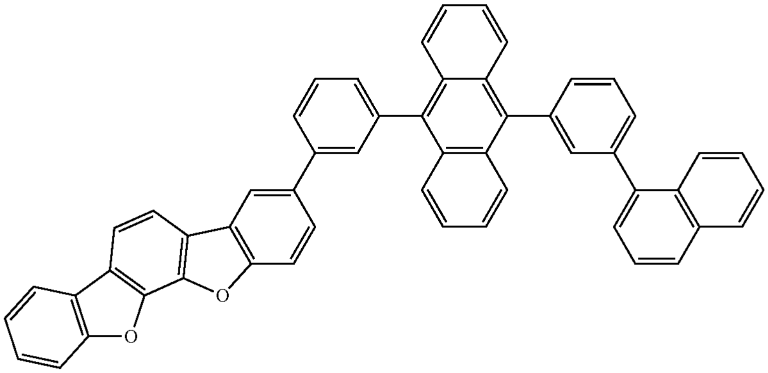
H88
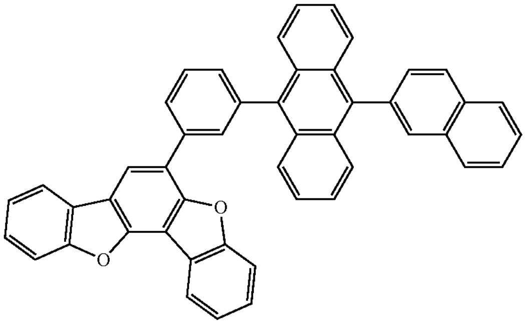
H89
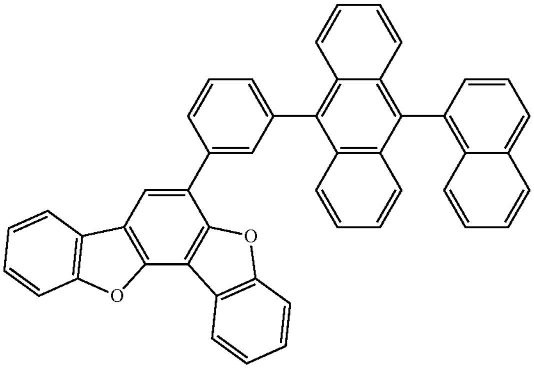
H90
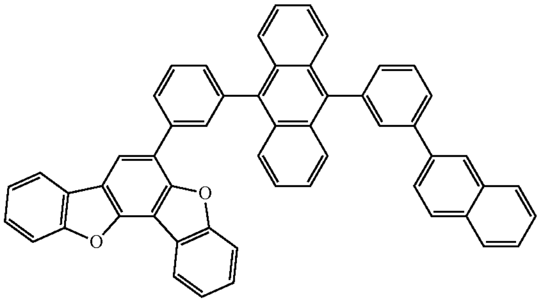
H91
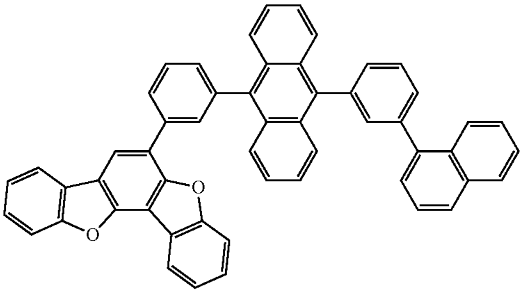

-continued
H92
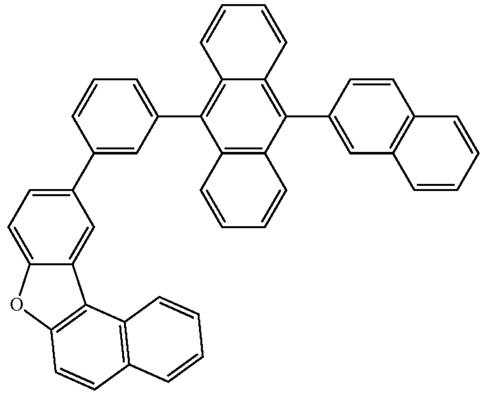
H93
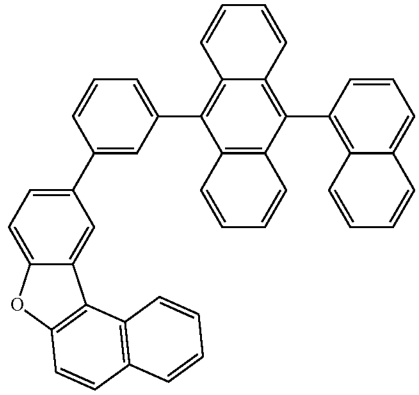
H94
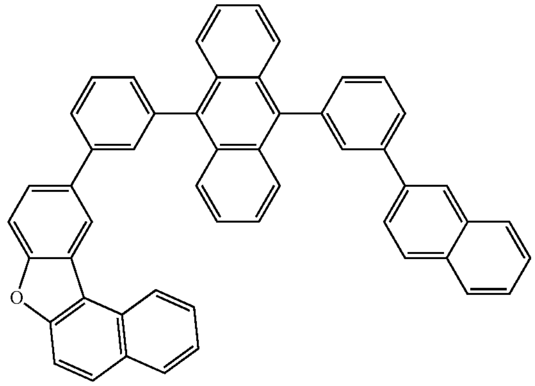
H95
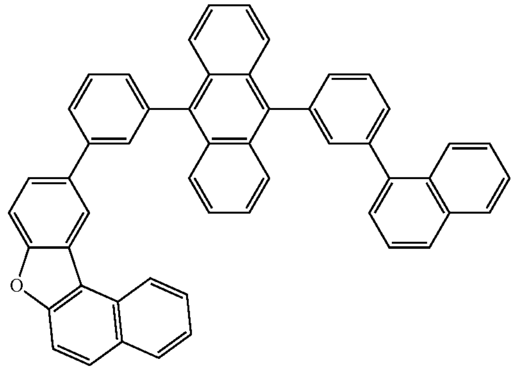
H96
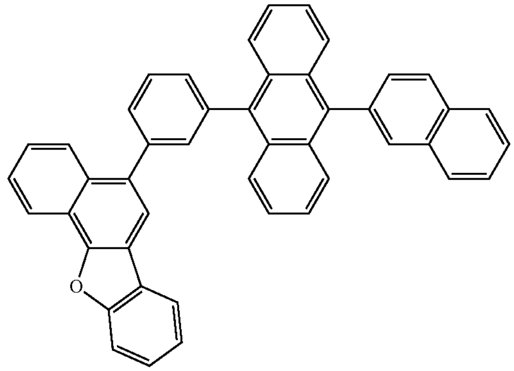
H97
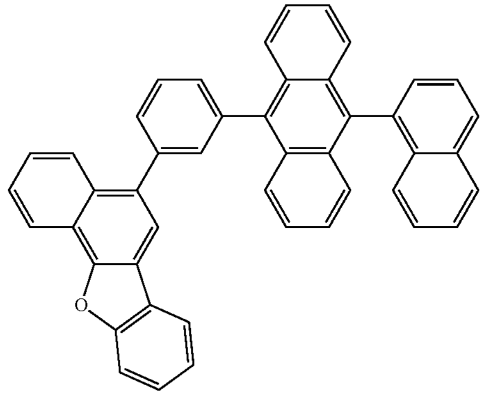
H98
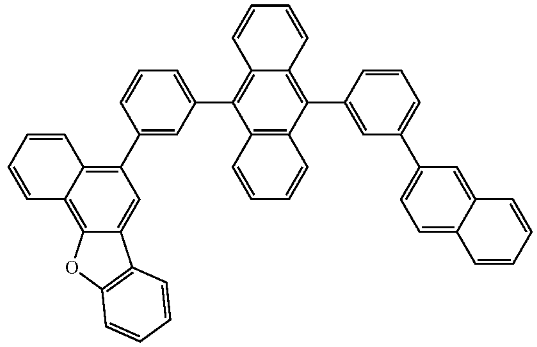
H99
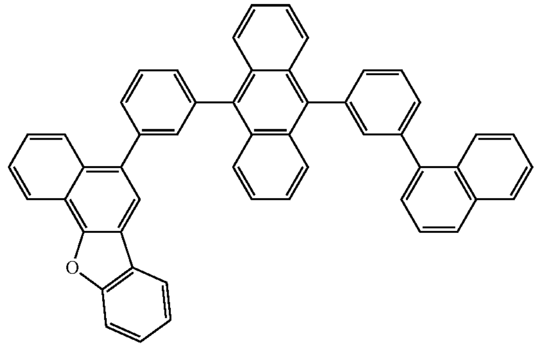

-continued
H100
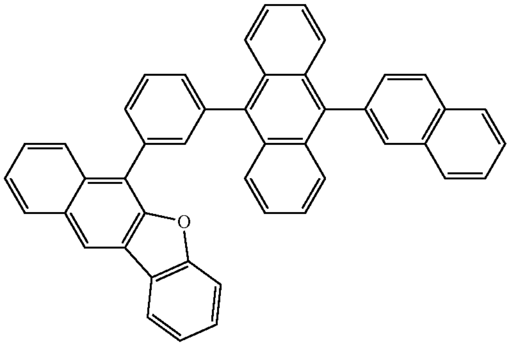
H101
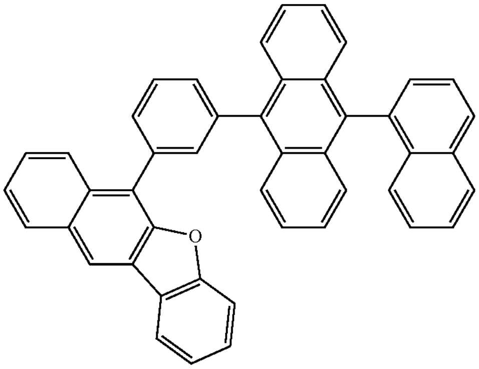
H102
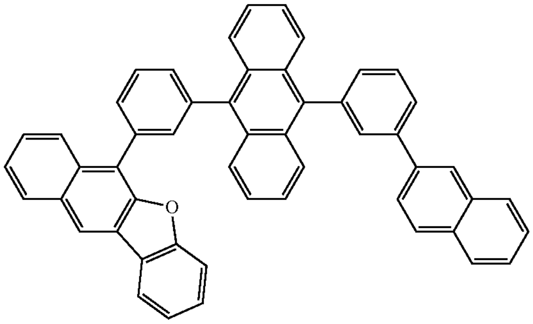
H103
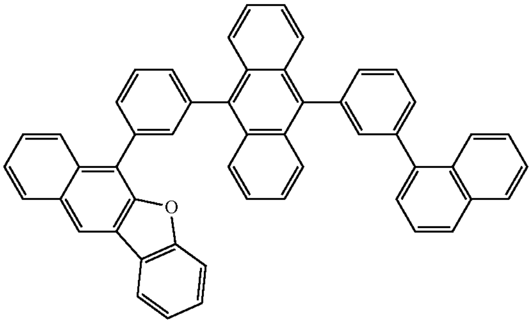
H104
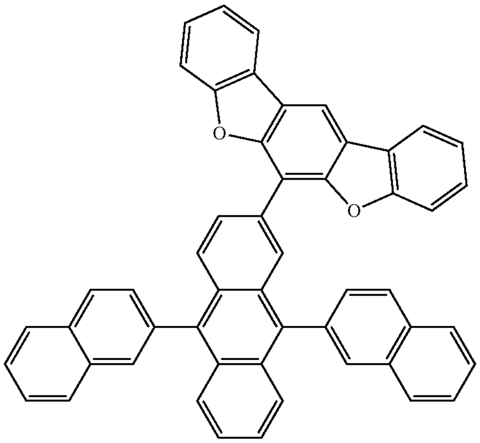
H105
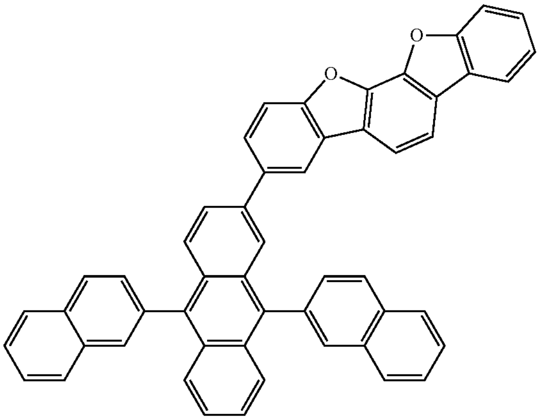
H106
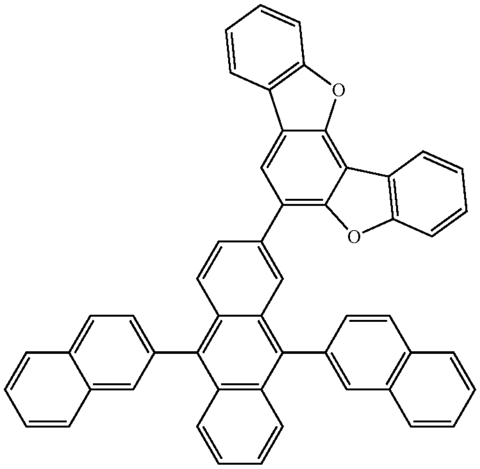
H107
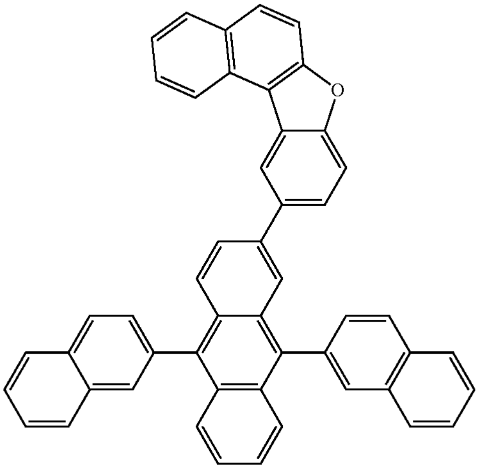

-continued
H108
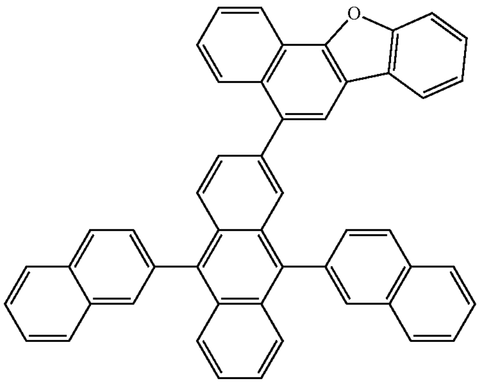
H109
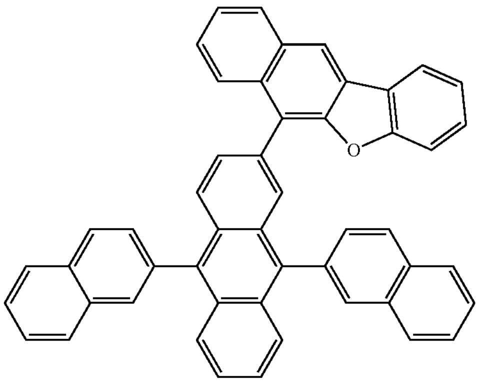
H110
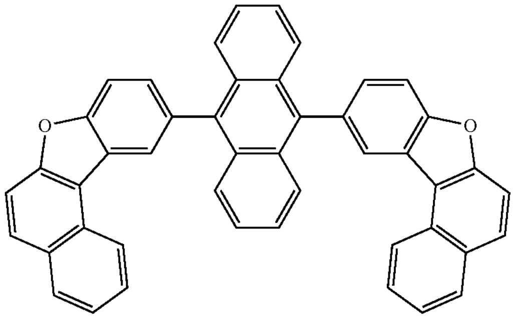
H111
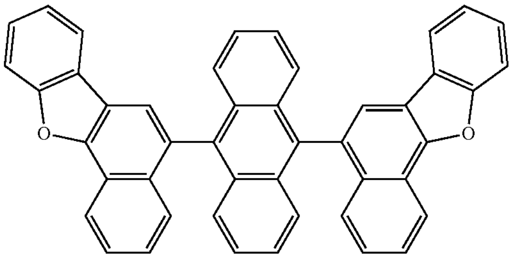
H112
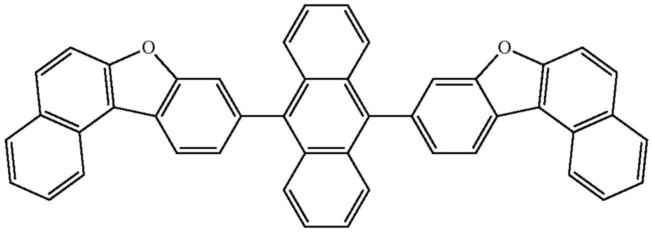
H113
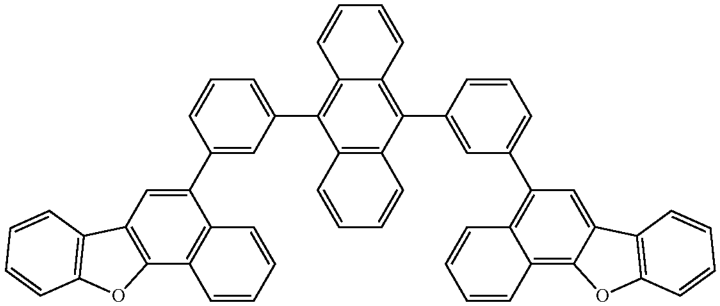
H114
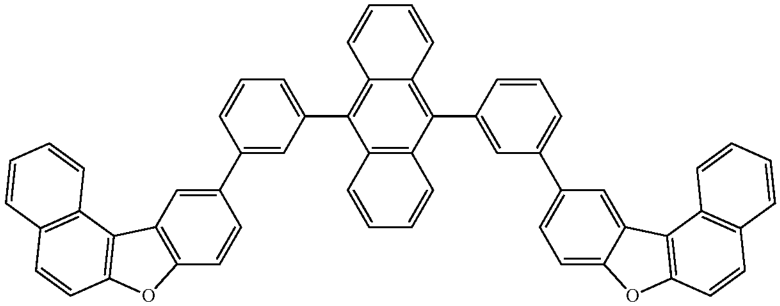

-continued
H115
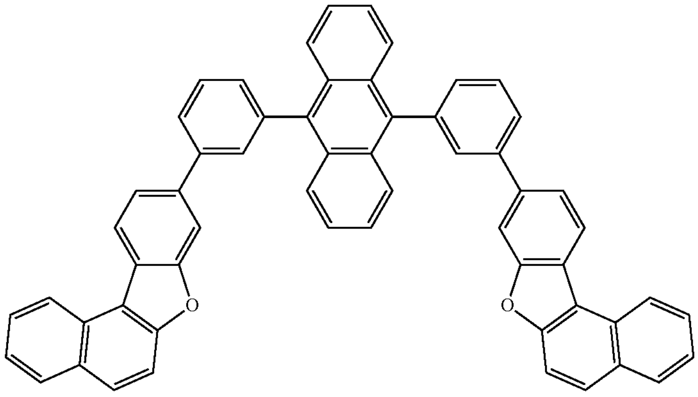
H116
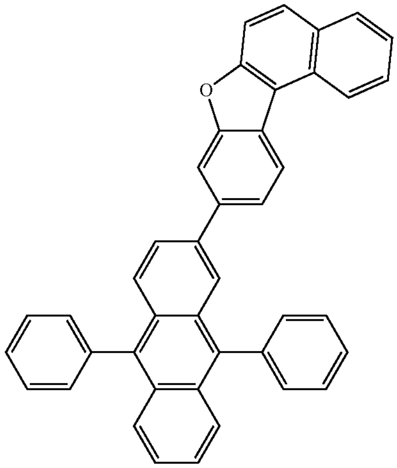
H117
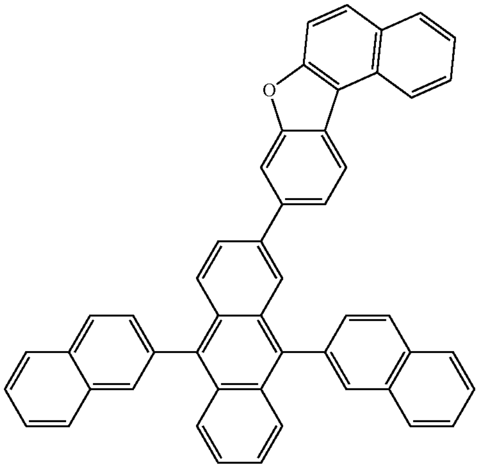
H118
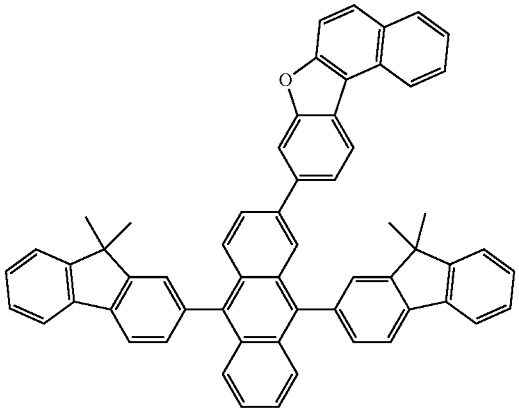
H119
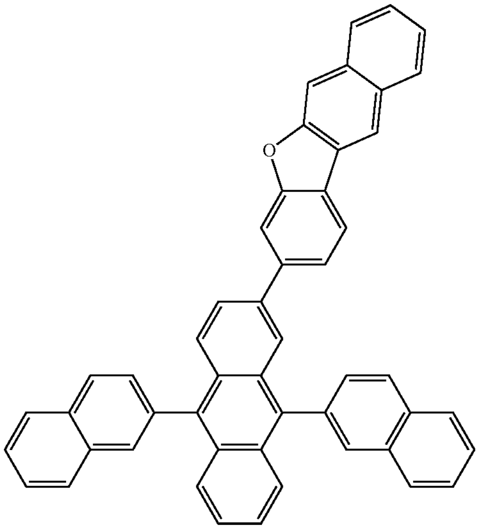

-continued

H120

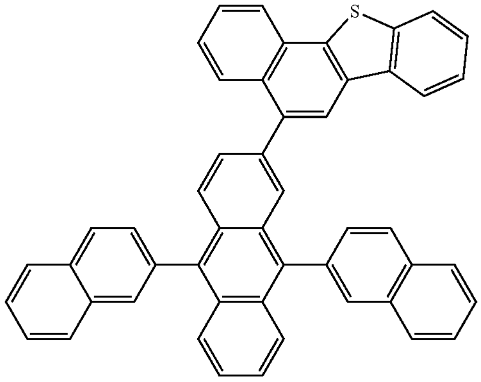

H121

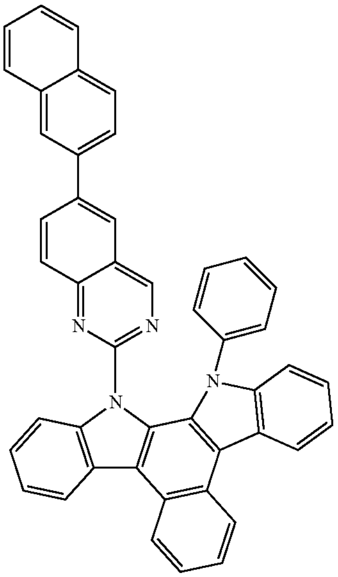

H122

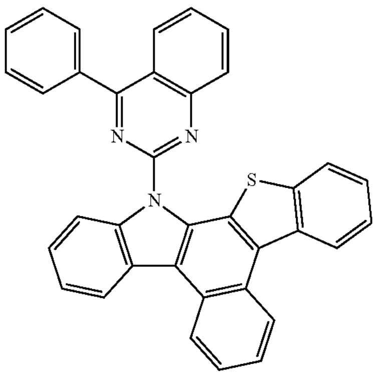

H123

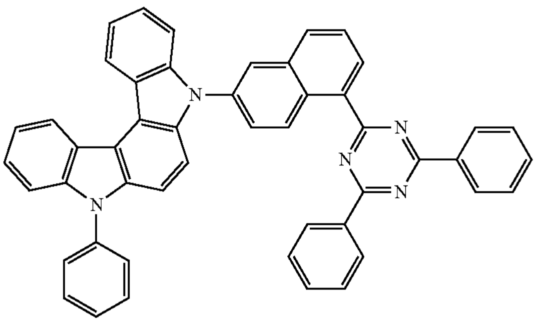

H124

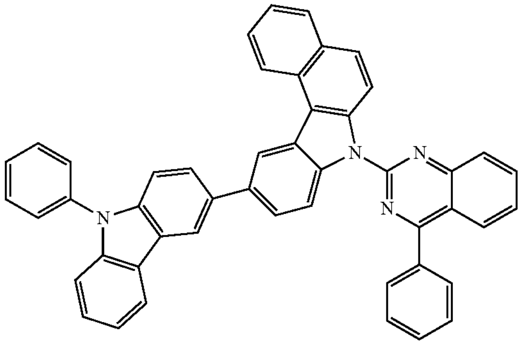

.

Thermally Activated Delayed Fluorescence Dopant

The first TADF dopant and the second TADF dopant respectively included in the first emission layer and the second emission layer may be the same as described above.

The first TADF dopant and the second TADF dopant may be any compound having a wavelength range and a FWHM as described above. Because the first TADF dopant and the second TADF dopant are thermally activated delayed fluorescence compounds, a difference between S1 energy and T1 energy (e.g., singlet-triplet energy gap) may be about 0 eV or more and about 0.5 eV or less.

When the difference between the triplet energy level (eV) of the TADF dopant and the singlet energy level (eV) of the TADF dopant satisfies the above-described range, up-conversion from a triplet state to a singlet state of the TADF dopant may effectively or efficiently occur, and thus, the luminescence efficiency of the light-emitting device 10 may be improved.

In an embodiment, the first TADF dopant and the second TADF dopant may each include: i) a material including at least one electron donor (for example, a π electron-rich $C_3$-$C_{60}$ cyclic group such as a carbazole group), and at least one electron acceptor (for example, a sulfoxide group, a cyano group, a r-electron-deficient nitrogen-containing $C_1$-$C_{60}$ cyclic group, etc.) or ii) a material including a $C_8$-$C_{60}$ polycyclic group including at least two cyclic groups condensed while sharing boron (B).

Examples of the first TADF dopant and the second TADF dopant are as described above.

Quantum Dot

The term "quantum dot" used herein refers to a crystal of a semiconductor compound, and may include any material that is capable of emitting light of various emission wavelengths as determined by a size of the crystal.

A diameter of the quantum dot may be, for example, about 1 nm to about 10 nm.

The quantum dot may be synthesized by a wet chemical process, an organometallic chemical vapor deposition process, a molecular beam epitaxy process, or any suitable (similar) process.

The term "wet chemical process" refers to a method in which a solvent and a precursor material are mixed, and then, a quantum dot particle crystal is grown. When the crystal grows, the organic solvent naturally acts as a dispersant coordinated on the surface of the quantum dot crystal and thus controls the growth of the crystal. Accordingly, by using a process that is easily performed at low costs compared to a vapor deposition process (such as a metal organic chemical vapor deposition (MOCVD) process and a molecular beam epitaxy (MBE) process), the growth of quantum dot particles may be controlled.

The quantum dot may include a Group III-VI semiconductor compound, a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Non-limiting examples of the Group III-VI semiconductor compound include a binary compound (such as $In_2S_3$); a ternary compound, (such as AgInS, $AgInS_2$, CuInS, and/or $CuInS_2$); or any combination thereof.

Non-limiting examples of the Group II-VI semiconductor compound include a binary compound (such as CdS, CdSe, CdTe, ZnS, ZnSe, ZnTe, ZnO, HgS, HgSe, HgTe, MgSe, and/or MgS); a ternary compound (such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS); a quaternary compound (such as CdZnSeS, CdZnSeTe, CdZnSTe, CdHgSeS, CdHgSeTe, CdHgSTe, HgZnSeS, HgZnSeTe, and/or HgZnSTe); or any combination thereof.

Non-limiting examples of the Group III-V semiconductor compound include a binary compound (such as GaN, GaP, GaAs, GaSb, AlN, AlP, AlAs, AlSb, InN, InP, InAs, and/or InSb); a ternary compound (such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or GaAlNP); a quaternary compound (such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb); or any combination thereof. In some embodiments, the Group III-V semiconductor compound may further include a Group II element. Non-limiting examples of the Group III-V semiconductor compound further including the Group II element may include InZnP, InGaZnP, and InAIZnP.

Non-limiting examples of the Group III-VI semiconductor compound include a binary compound (such as GaS, GaSe, $Ga_2Se_3$, GaTe, InS, InSe, $In_2Se_3$, and/or InTe); a ternary compound (such as $InGaS_3$ and/or $InGaSe_3$); or any combination thereof.

Non-limiting examples of the Group I-III-VI semiconductor compound include a ternary compound (such as AgInS, $AgInS_2$, CuInS, $CuInS_2$, $CuGaO_2$, $AgGaO_2$, and/or $AgAlO_2$); or any combination thereof.

Non-limiting examples of the Group IV-VI semiconductor compound include a binary compound (such as SnS, SnSe, SnTe, PbS, PbSe, and/or PbTe); a ternary compound (such as SnSeS, SnSeTe, SnSTe, PbSeS, PbSeTe, PbSTe, SnPbS, SnPbSe, and/or SnPbTe); a quaternary compound (such as SnPbSSe, SnPbSeTe, and/or SnPbSTe); or any combination thereof.

The Group IV element or compound may include a single element compound (such as Si and/or Ge); a binary compound (such as SiC and/or SiGe); or any combination thereof.

Each element included in the multi-element compound (such as the binary compound, the ternary compound, and/or the quaternary compound) may be present in a particle at a substantially uniform concentration or in a non-uniform concentration (e.g., in a gradient or varying concentration).

In some embodiments, the quantum dot may have a single (unitary) structure having a substantially uniform concentration of each element, or a dual structure of a core-shell (e.g., such that the core and shall may have different concentrations of one or more elements). In some embodiments, for example, the material included in the core may be different from the material included in the shell.

The shell of the quantum dot may function as a protective layer to maintain semiconductor characteristics by preventing or reducing chemical degeneration of the core, and/or may function as a charging layer for imparting electrophoretic characteristics to the quantum dot. The shell may include a single layer or a multilayer structure. An interface between the core and the shell may have a concentration gradient, in which the concentration of elements in the shell decreases toward the center.

Non-limiting examples of the material included in the shell of the quantum dot include a metal oxide or a non-metal oxide, a semiconductor compound, or any combination thereof. Non-limiting examples of the metal oxide or the non-metal oxide include: a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO); a ternary compound (such as $MgAl_2O_4$, $CoFe_2O_4$, $NiFe_2O_4$, and/or $CoMn_2O_4$); or any combination thereof. Non-limiting examples of the semiconductor compound include, as described herein, a Group III-VI semiconductor compound, a Group II-VI semiconductor compound, a Group III-V semiconductor compound, a Group III-VI semiconductor compound, a Group I-III-VI semiconductor compound, a Group IV-VI semiconductor compound, or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A FWHM of an emission wavelength spectrum of the quantum dot may be about 45 nm or less, for example, about 40 nm or less, for example, about 30 nm or less. When the FWHM of the emission wavelength spectrum of the quantum dot is within this range, color purity and/or color reproduction may be improved. In addition, the quantum dot may omnidirectionally emit light. Accordingly, the device may have an increased wide viewing angle.

In some embodiments, the quantum dot may be a spherical, pyramidal, multi-arm, or cubic nanoparticle, a nanotube, a nanowire, a nanofiber, or a nanoplate particle.

By adjusting a size of the quantum dot, an energy band gap may be adjusted, and light of various suitable (e.g., selected) wavelengths in a quantum dot emission layer may be obtained. Therefore, a light-emitting device that emits light of various wavelengths may be implemented by utilizing quantum dots of different sizes. For example, the size of the quantum dot may be selected to emit red, green and/or blue light. In addition, the size of the quantum dot may be adjusted such that light of various colors are combined to emit white light.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including a plurality of different materials, or iii) a multi-layered structure including a plurality of layers including different materials.

The electron transport region may include a hole blocking layer, an electron transport layer, an electron injection layer, or any combination thereof.

In an embodiment, the electron transport region may have a structure such as an electron transport layer/electron injection layer structure, or a hole blocking layer/electron transport layer/electron injection layer structure, wherein the layers of each structure are stacked sequentially from the emission layer.

The electron transport region (for example, the hole blocking layer and/or the electron transport layer in the electron transport region) may include a metal-free compound including at least one r-electron-deficient nitrogen-containing $C_1$-$C_{60}$ cyclic group.

In one or more embodiments, the electron transport region may include a compound represented by Formula 601:

$$[Ar_{601}]_{xe11}\text{-}[(L_{601})_{xe1}\text{-}R_{601}]_{xe21}. \qquad \text{Formula 601}$$

In Formula 601, $Ar_{601}$ and $L_{601}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(═O)($Q_{601}$), —S(═O)$_2$($Q_{601}$), or —P(═O)($Q_{601}$)($Q_{602}$), $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a r-electron-deficient nitrogen-containing $C_1$-$C_{60}$ cyclic group unsubstituted or substituted with at least one $R_{10a}$.

In one or more embodiments, when xe11 in Formula 601 is 2 or more, the two or more $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

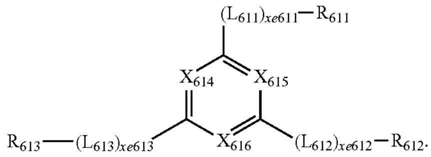

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In one or more embodiments, xe1 and xe611 to xe613 in Formula 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

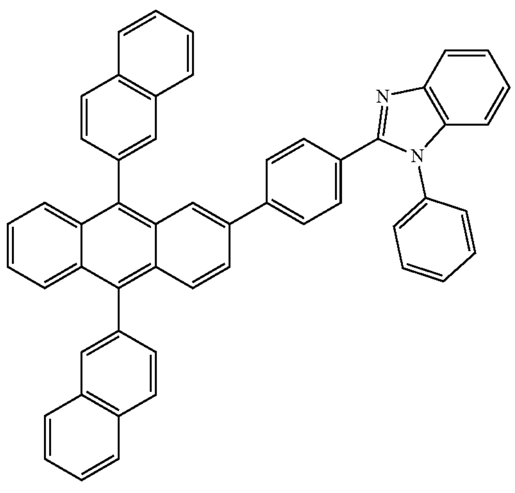

-continued
ET2
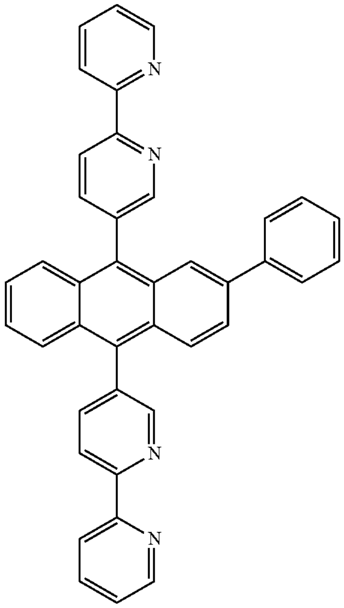
ET3
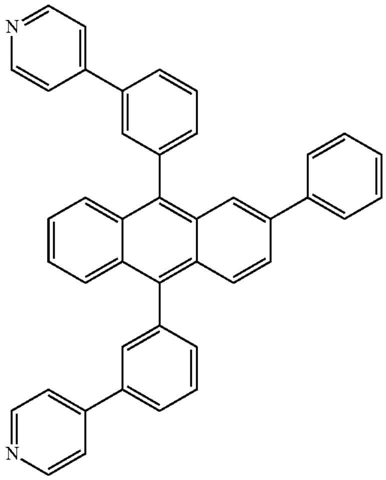
ET4
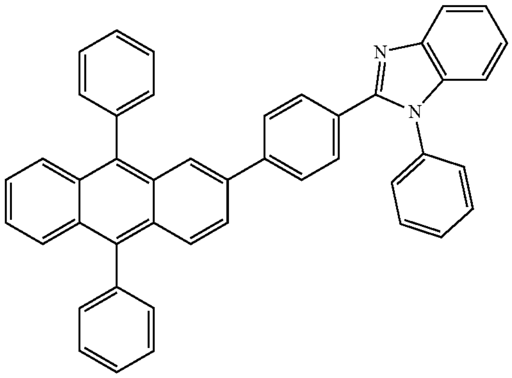
-continued
ET5
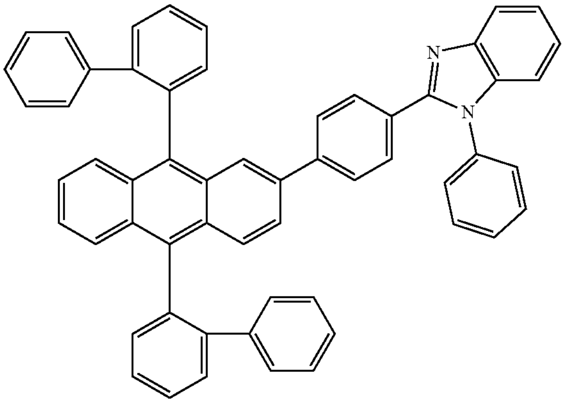
ET6
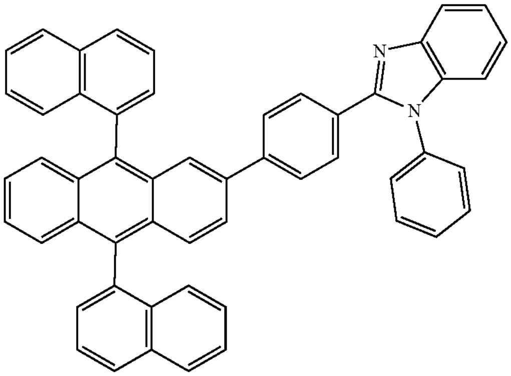
ET7
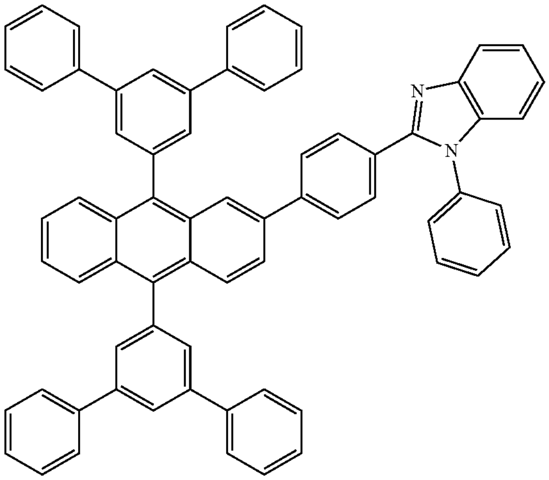

ET8
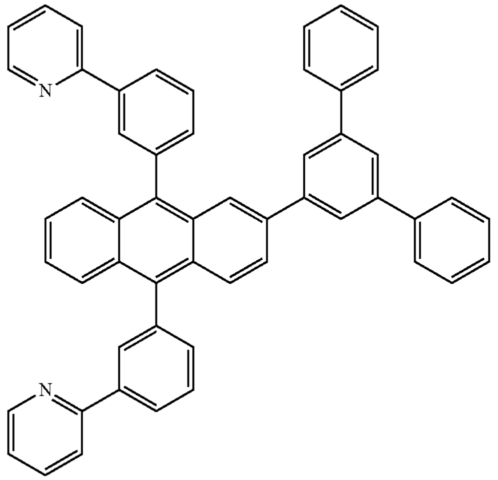
ET9
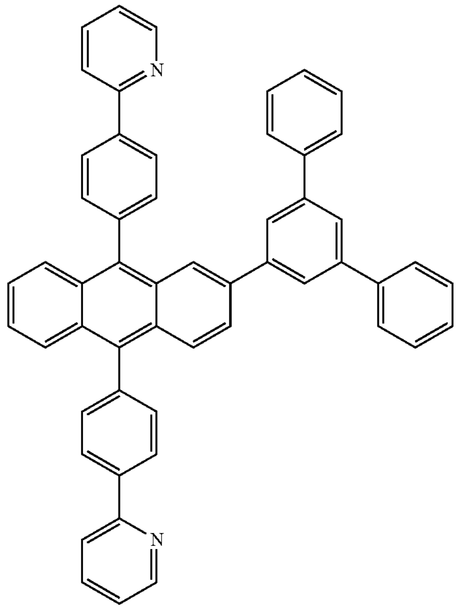
ET10
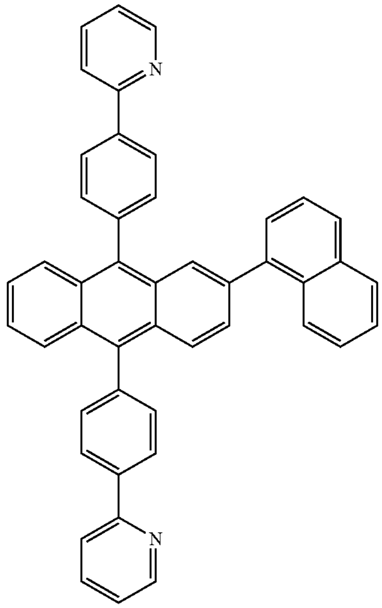
ET11
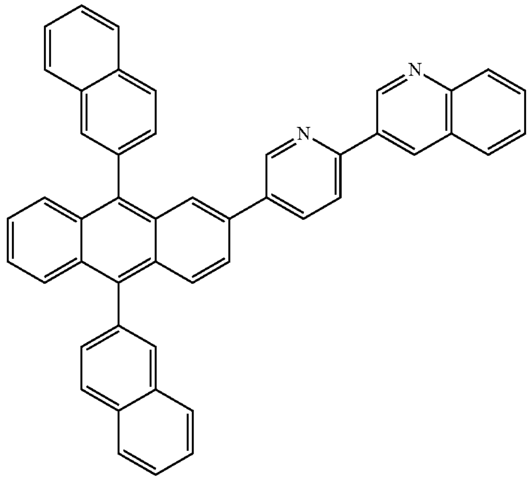
ET12
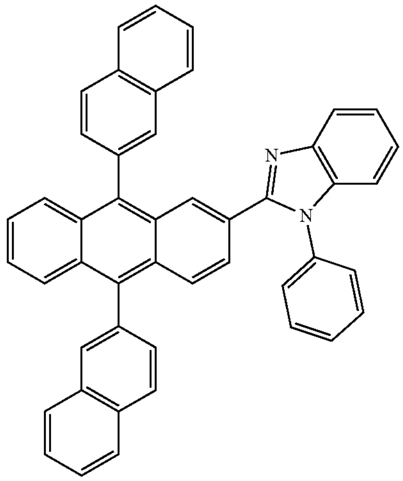

-continued
ET13
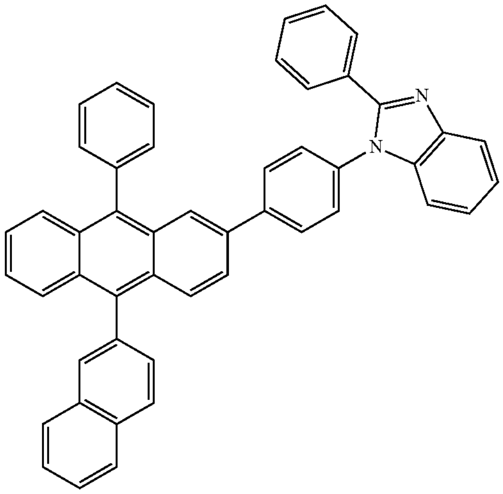
ET14
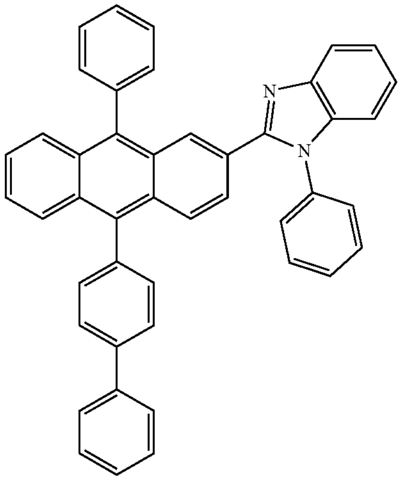
ET15
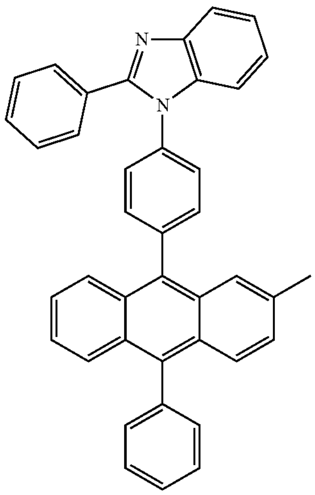
-continued
ET16
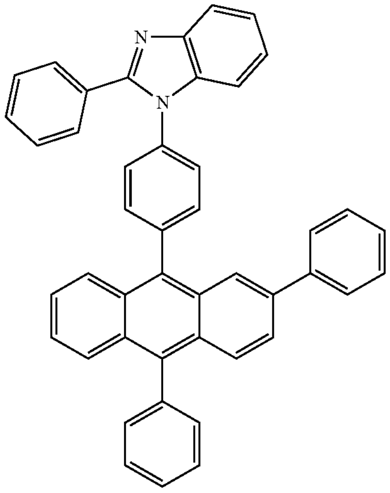
ET17
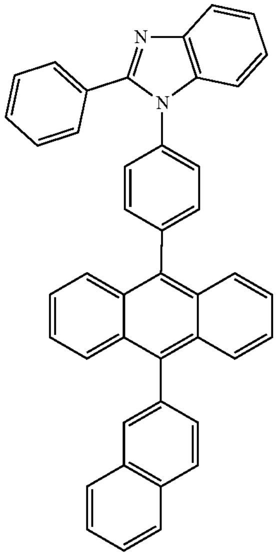
ET18
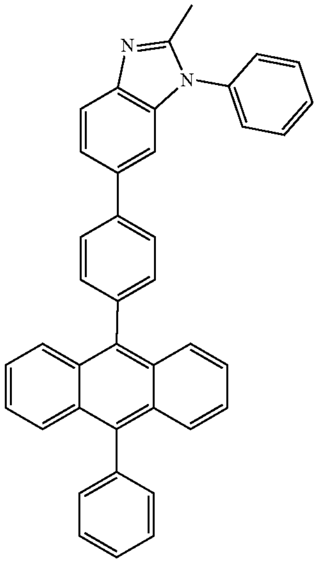

-continued
ET19
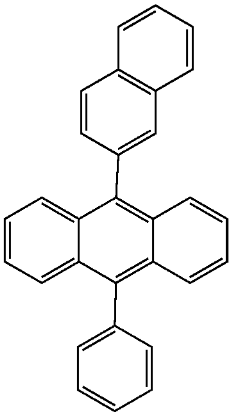
ET20
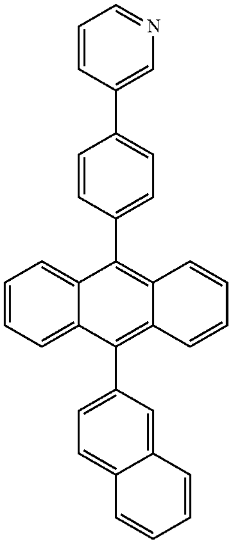
ET21
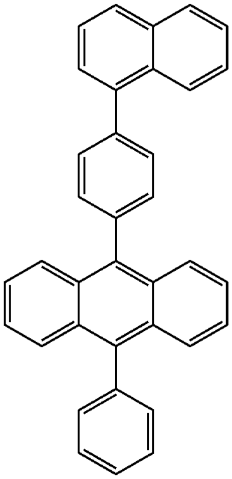
-continued
ET22
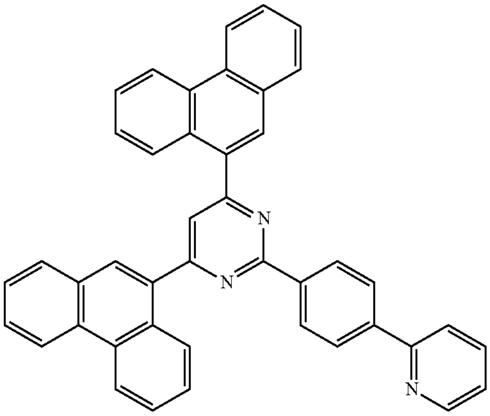
ET23
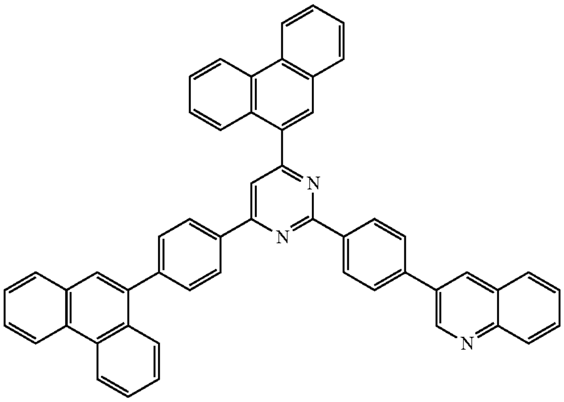
ET24
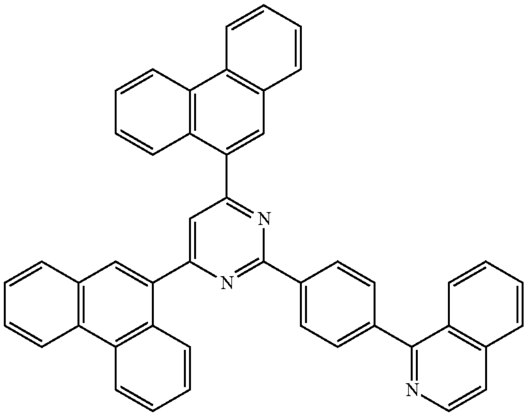

-continued
ET25
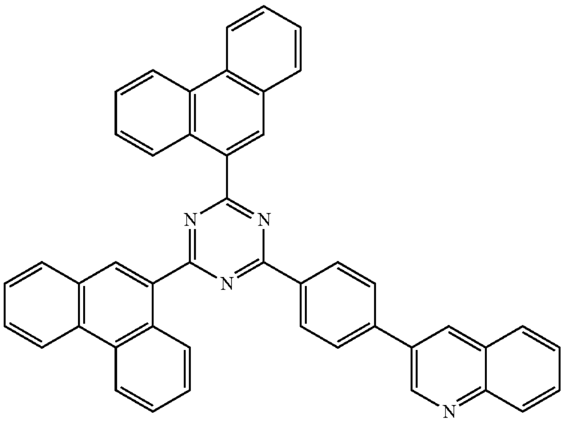
ET26
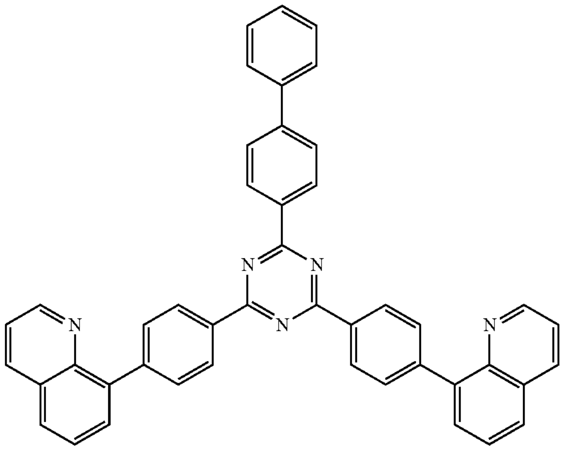
ET27
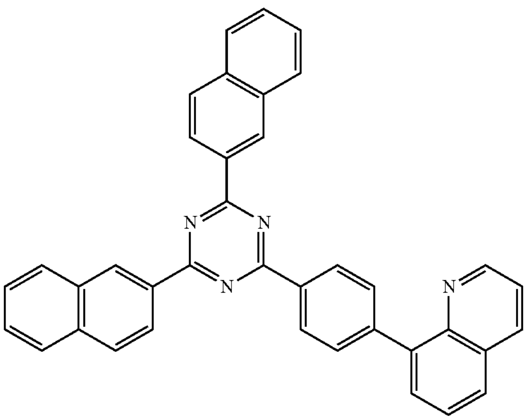
-continued
ET28
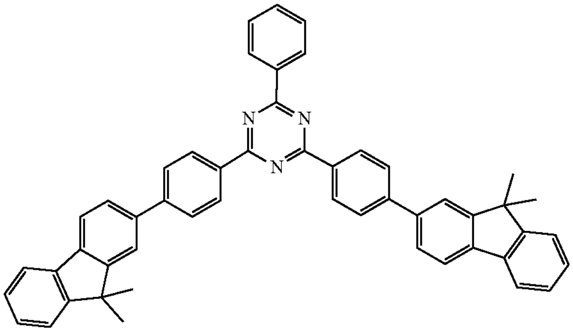
ET29
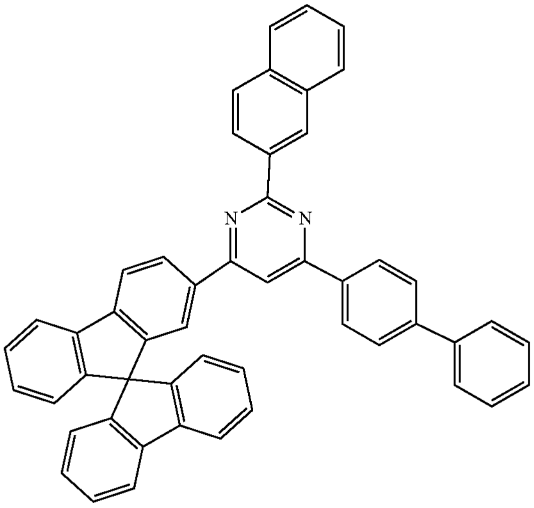
ET30
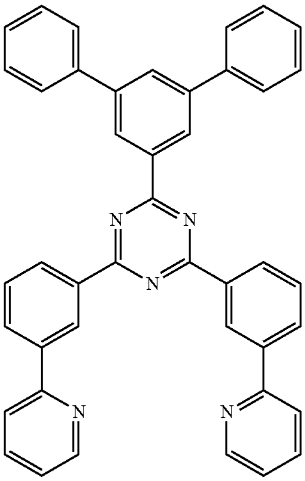

-continued
ET31
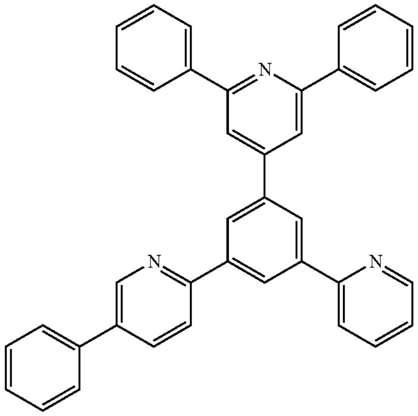
ET32
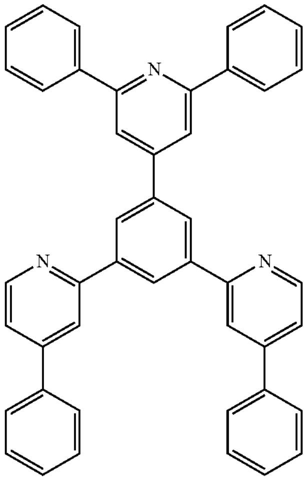
ET33
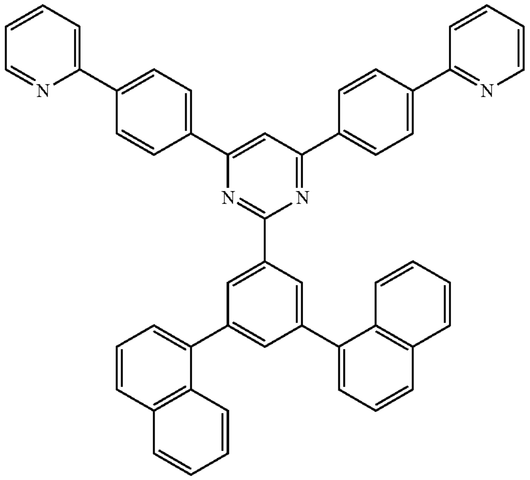
-continued
ET34
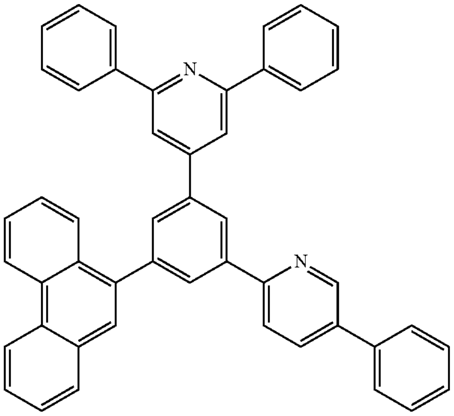
ET35
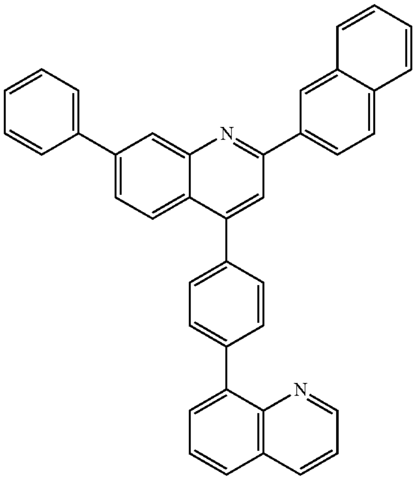
ET36
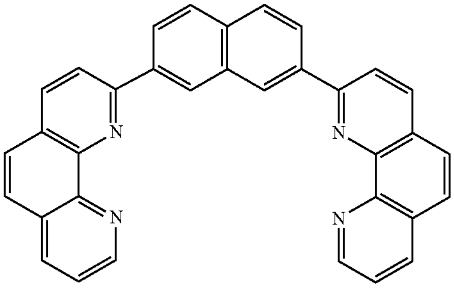
ET37
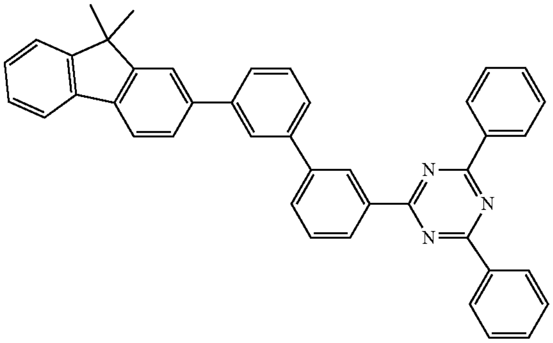

-continued
ET38
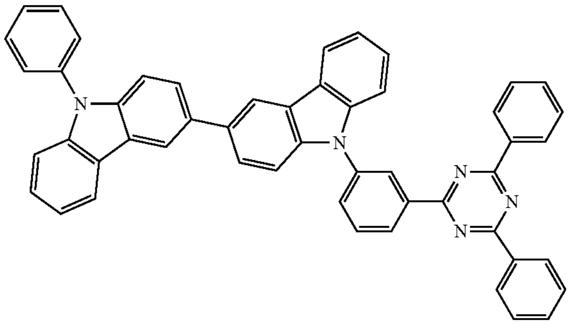
ET39
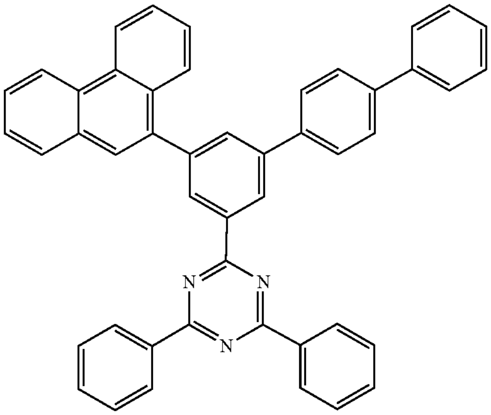
ET40
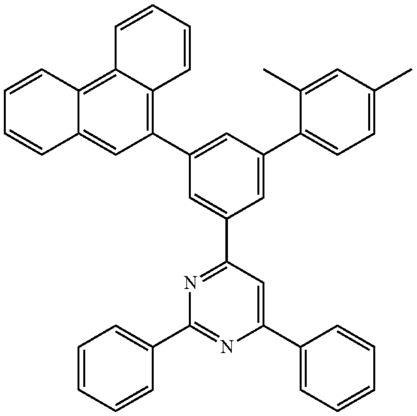
ET41
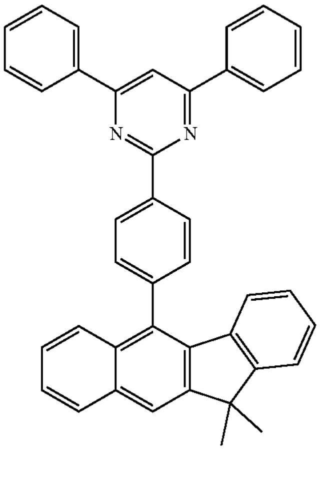
-continued
ET42
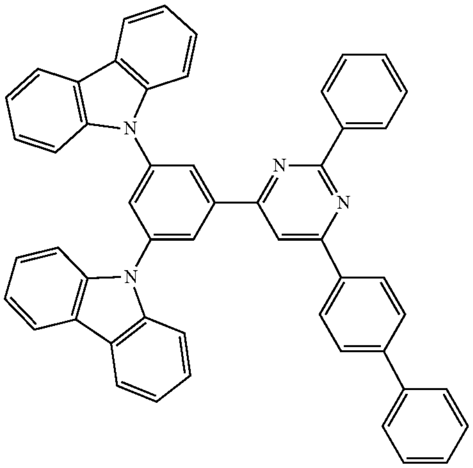
ET43
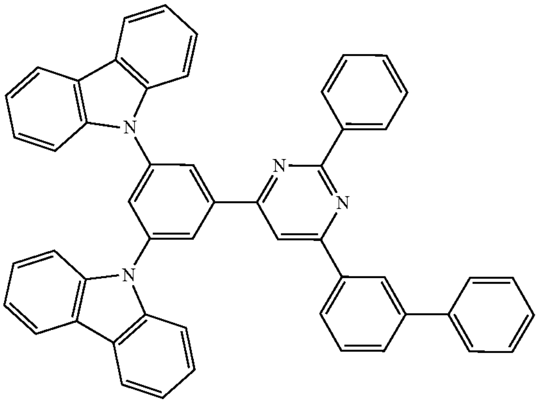
ET44
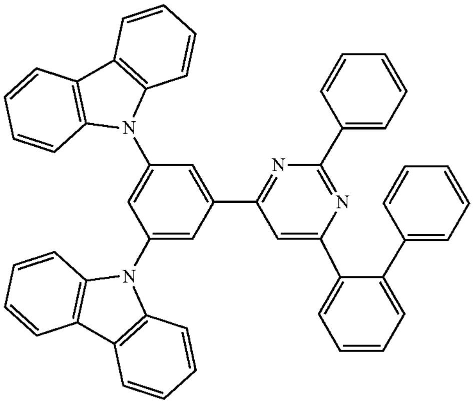
ET45
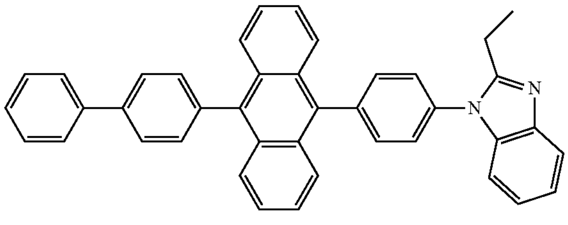

-continued

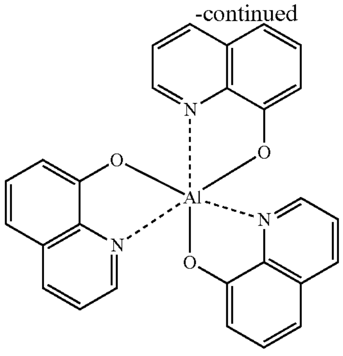

Alq3

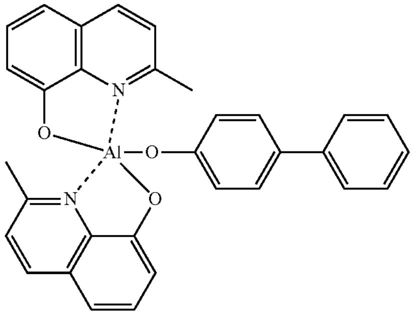

BAlq

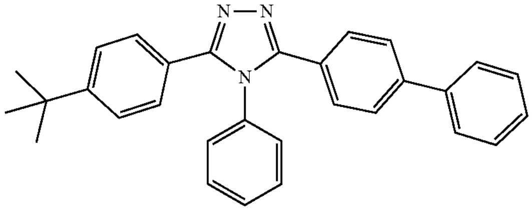

TAZ

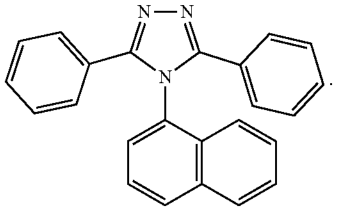

NTAZ

A thickness of the electron transport region may be about 160 Å to about 5,000 Å, for example, about 100 Å to about 4,000 Å. When the electron transport region includes a hole blocking layer or an electron transport layer, or any combination thereof, the hole blocking layer or the electron transport layer may each independently have a thickness of about 20 Å to about 1,000 Å, for example, about 30 Å to about 3,000 Å, and the electron transport layer may have a thickness of about 100 Å to about 1,000 Å, for example, about 150 Å to about 500 Å. When the thickness of the hole blocking layer and/or the electron transport layer is within the range described above, satisfactory electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may each independently be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

In one or more embodiments, the metal-containing material may include a Li complex. The Li complex may include, for example, Compound ET-D1 (LiQ) or ET-D2:

ET-D1

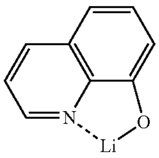

ET-D2

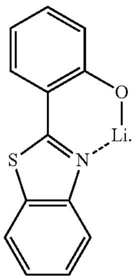

The electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may each independently be an oxide, a halide (for example, fluorides, chlorides, bromides, and/or iodides), a telluride, or any combination thereof of the corresponding alkali metal, alkaline earth metal, and rare earth metal.

The alkali metal-containing compound may be an alkali metal oxide (such as $Li_2O$, $Cs_2O$, and/or $K_2O$), an alkali metal halide (such as LiF, NaF, CsF, KF, LiI, NaI, CsI, and/or KI), or any combination thereof. The alkaline earth metal-containing compound may include an alkaline earth metal compound (such as BaO, SrO, CaO, $Ba_xSr_{1-x}O$ (x is a real number that satisfies the condition of $0<x<1$), and/or $Ba_xCa_{1-x}O$ (x is a real number that satisfies the condition of $0<x<1$)). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include a lanthanide metal telluride. Non-limiting examples of the lanthanide metal telluride include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may each independently include i) one of an alkali metal ion, an alkaline earth metal ion, and a rare earth metal ion, and ii) as a ligand linked to the metal ion, for example, a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may include (e.g., consist of): i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In one or more embodiments, the electron injection layer may be a KI:Yb co-deposited layer or a RbI:Yb co-deposited layer.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be about 1 Å to about 100 Å, for example, about 3 Å to about 90 Å. When the thickness of the electron injection layer is within the range described above, the electron injection layer may have satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and a metal, an alloy, an electrically conductive compound, or any combination thereof, each having a low work function, may be used as a material for forming the second electrode 150.

The second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

Capping Layer

A first capping layer may be located outside the first electrode 110, and/or a second capping layer may be located outside the second electrode 150. In some embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110 (which is a semi-transmissive electrode or a transmissive electrode), and the first capping layer, and light generated in an emission layer of the interlayer 130 of the light-emitting device 10 may be extracted toward the outside through the second electrode 150 (which is a semi-transmissive electrode or a transmissive electrode), and the second capping layer.

The first capping layer and the second capping layer may increase the external luminescence efficiency of the device according to the principle of constructive interference. Accordingly, the light extraction efficiency of the organic light-emitting device 10 may be increased, so that the luminescence efficiency of the organic light-emitting device 10 may be improved.

Each of the first capping layer and the second capping layer may include a material having a refractive index of about 1.6 or more (at 589 nm).

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include a carbocyclic compound, a heterocyclic compound, an amine group-containing compound, a porphyrin derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may each independently be optionally substituted with a substituent containing O, N, S, Se, Si, F, C, Br, I, or any combination thereof. In an embodiment, at least one of the first capping layer and the second capping layer may each independently include an amine group-containing compound.

In one or more embodiments, at least one of the first capping layer and second capping layer may each independently include a compound represented by Formula 201, a compound represented by Formula 202, or any combination thereof.

In one or more embodiments, at least one of the first capping layer and the second capping layer may each independently include one of Compounds HT28 to HT33, one of Compounds CP1 to CP6, β-NPB, or any combination thereof:

CP1

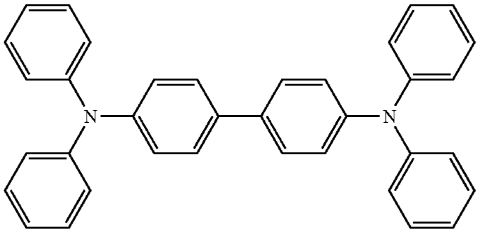

CP2

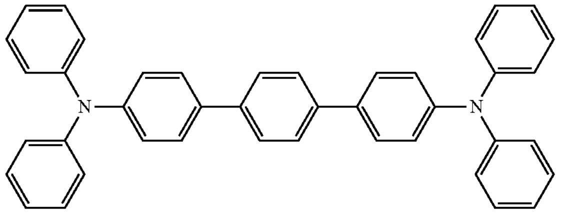

CP3

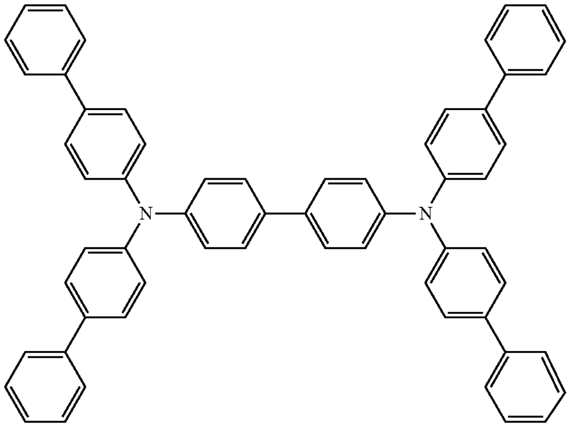

CP4

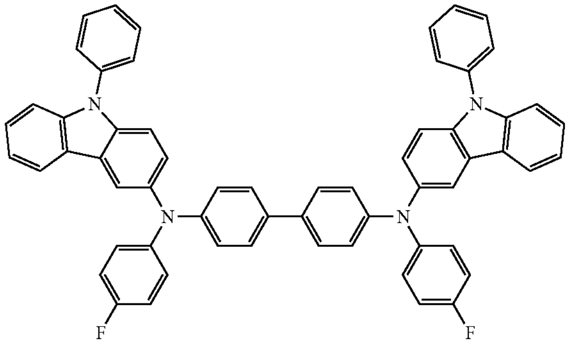

-continued

CP5

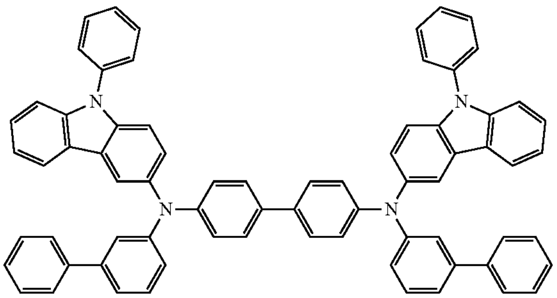

CP6

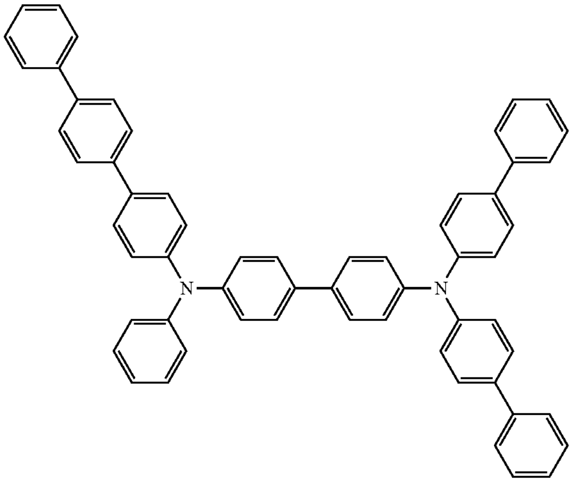

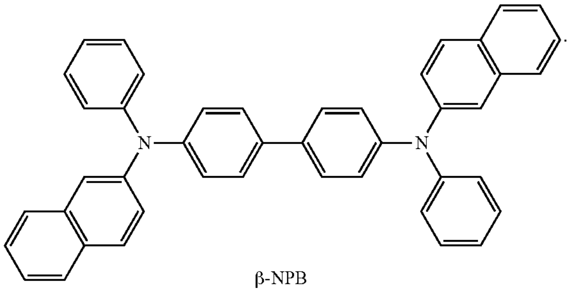

β-NPB

Electronic Apparatus

The light-emitting device may be included in various suitable electronic apparatuses. In an embodiment, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, the light emitted from the light-emitting device may be blue light. The light-emitting device may be the same as described above. In an embodiment, the color conversion layer may include a quantum dot. The quantum dot may be, for example, a quantum dot as described herein.

The electronic apparatus may include a first substrate. The first substrate may include a plurality of subpixel areas, the color filter may include a plurality of color filter areas corresponding to the plurality of subpixel areas, respectively, and the color conversion layer may include a plurality of color conversion areas corresponding to the subpixel areas, respectively.

A pixel-defining film may be between the plurality of subpixel areas to define each of the subpixel areas.

The color filter may further include a plurality of color filter areas and a light-blocking pattern between the plurality of color filter areas, and the color conversion layer may further include a plurality of color conversion areas and a light-blocking pattern between the plurality of color conversion areas.

The plurality of color filter areas (or the plurality of color conversion areas) may include a first area to emit first color light, a second area to emit second color light, and/or a third area to emit third color light, and the first color light, the second color light, and/or the third color light may have different maximum emission wavelengths from one another. In an embodiment, the first color light may be red light, the second color light may be green light, and the third color light may be blue light. In an embodiment, the plurality of color filter areas (or the plurality of color conversion areas) may include a quantum dot. In detail, the first area may include a red quantum dot, the second area may include a green quantum dot, and the third area may not include a quantum dot. The quantum dot is the same as described in the present specification. Each of the first area, the second area and/or the third area may further include a scatterer.

In an embodiment, the light-emitting device may be to emit first light, the first area may be to absorb the first light to emit first first-color light, the second area may be to absorb the first light to emit second first-color light, and the third area may be to absorb the first light to emit third first-color light. In this regard, the first first-color light, the second first-color light, and the third first-color light may have different maximum emission wavelengths from one another. In some embodiments, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein one selected from the source electrode and the drain electrode may be electrically connected to one selected from the first electrode and the second electrode of the light-emitting device.

The thin-film transistor may further include a gate electrode, a gate insulating film, and/or the like.

The activation layer may include crystalline silicon, amorphous silicon, organic semiconductor, oxide semiconductor, and/or the like.

The electronic apparatus may further include a sealing portion for sealing the light-emitting device. The sealing portion may be between the color filter and/or the color conversion layer and the light-emitting device. The sealing portion allows light from the light-emitting device to be extracted to the outside, while simultaneously preventing or reducing ambient air and/or moisture from penetrating into the light-emitting device. The sealing portion may be a sealing substrate including a transparent glass substrate and/or a plastic substrate. The sealing portion may be a thin film encapsulation layer including at least one layer of an organic layer and/or an inorganic layer. When the sealing portion is a thin film encapsulation layer, the electronic apparatus may be flexible.

On the sealing portion, in addition to the color filter and/or the color conversion layer, various suitable functional layers may be further located according to the use of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus for authenticating an individual by using biometric information of a biometric body (for example, a fingertip, a pupil, and/or the like).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and/or the like.

Figure 2:
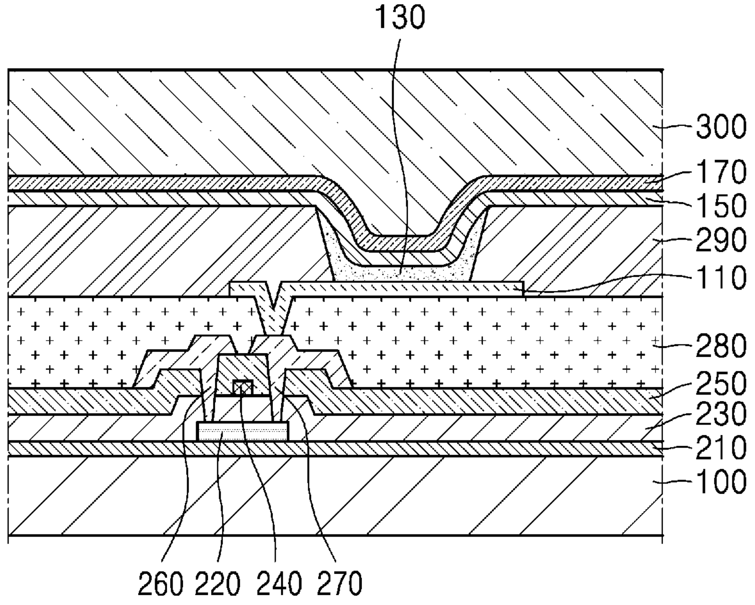
FIG. 2 is a cross-sectional view of a light-emitting apparatus according to an embodiment of the present disclosure.
Figure 3:
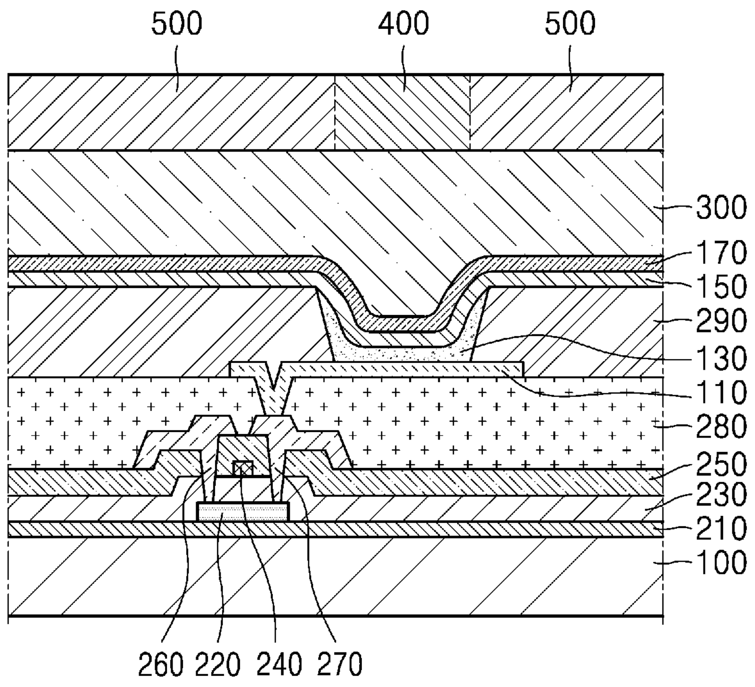
FIG. 3 is a cross-sectional view of a light-emitting apparatus according to another embodiment of the present disclosure.

Description of FIGS. 2 and 3

FIG. 2 is a cross-sectional view of a light-emitting apparatus according to an embodiment.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent or reduce the penetration of impurities through the substrate 100, and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor (such as silicon and/or polysilicon), an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 is located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located to be in contact with the exposed portions of the source region and the drain region of the activation layer 220.

The TFT may be electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device includes the first electrode 110, the interlayer 130, and the second electrode 150.

The first electrode 110 may be located on the passivation layer 280. The passivation layer 280 does not completely cover the drain electrode 270 and may exposes a certain region of the drain electrode 270, and the first electrode 110 may be connected to the exposed region of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The pixel defining layer 290 may be a polyimide or polyacryl-based organic film. In some embodiments, at least some layers of the interlayer 130 may extend beyond the upper portion of the pixel defining layer 290 and may thus be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device and may protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate or polyacrylic acid), an epoxy-based resin (for example, aliphatic glycidyl ether (AGE), or a combination thereof; or a combination of an inorganic film and an organic film.

FIG. 3 is a cross-sectional view showing a light-emitting apparatus according to an embodiment of the present disclosure.

The light-emitting apparatus of FIG. 3 is substantially the same as the light-emitting apparatus of FIG. 2, except that a light-blocking pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

Preparation Method

The layers constituting the hole transport region, the emission layer, and the layers constituting the electron transport region may be formed in a set or predetermined region of the device by using one or more suitable methods selected from vacuum deposition, spin coating, casting, Langmuir-Blodgett (LB) deposition, ink-jet printing, laser-printing, and laser-induced thermal imaging.

When the layers constituting the hole transport region, the emission layer, and the layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

When the layers constituting the hole transport region, the emission layer, and the layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed and the structure of a layer to be formed.

General Definition of Substituents

The term "$C_3$-$C_{60}$ carbocyclic group" as used herein refers to a cyclic group that consists of three to sixty carbon atoms, and the term "$C_1$-$C_6$ heterocyclic group" as used herein refers to a cyclic group that has one to sixty carbon atoms and further includes, in addition to carbon, a heteroatom. The $C_3$-$C_{60}$ carbocyclic group and the $C_1$-$C_{60}$ heterocyclic group may each be a monocyclic group consisting of one ring, or a polycyclic group in which two or more rings are condensed with each other. In one or more embodiments, the number of ring-forming atoms of the $C_1$-$C_6$ heterocyclic group may be from 3 to 61.

The term "cyclic group" as used herein includes the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N═*' as a ring-forming moiety, and the term "r-electron-deficient nitrogen-containing $C_1$-$C_{60}$ cyclic group" as used herein refers to a heterocyclic group that has one to sixty carbon atoms and includes *—N═*' as a ring-forming moiety.

For example, the $C_3$-$C_{60}$ carbocyclic group may be i) a group T1 (defined below) or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2 (defined below), ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1 (defined below), ii) a condensed cyclic group in which two or more groups T1 are condensed with each other, iii) a group T3 (defined below), iv) a condensed cyclic group in which two or more groups T3 are condensed with each other, or v) a condensed cyclic group in which at least one group T3 and at least one group T1 are condensed with each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), and the π-electron-deficient nitrogen-containing $C_1$-$C_{60}$ cyclic group may be i) a group T4 (defined below), ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group).

The group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group.

The group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The group T3 may be a furan group, a thiophene group, a 1H-pyrrole group, a silole group, or a borole group.

The group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

Terms used herein such as the "cyclic group", the "$C_3$-$C_{60}$ carbocyclic group", the "$C_1$-$C_{60}$ heterocyclic group", the "π electron-rich $C_3$-$C_{60}$ cyclic group", or the "π-electron-deficient nitrogen-containing $C_1$-$C_{60}$ cyclic group" may each independently refer to a group that is condensed with a cyclic group, a monovalent group, or a polyvalent group (for example, a divalent group, a trivalent group, a tetravalent group, or the like), according to the structure of a formula described with corresponding terms (e.g., the relevant context). For example, "a benzene group" may be (refer to) a benzene, a phenyl group, a phenylene group, and/or the like, which may be easily understand by one of ordinary skill in the art according to a structure of a formula including the "benzene group."

In one or more embodiments, non-limiting examples of the monovalent $C_3$-$C_{60}$ carbocyclic group and the monovalent $C_1$-$C_{60}$ heterocyclic group include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and non-limiting examples of the divalent $C_3$-$C_{60}$ carbocyclic group and the monovalent $C_1$-$C_6$ heterocyclic group include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and non-limiting examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_6$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and non-limiting examples thereof include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_6$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and non-limiting examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms, at least one carbon-carbon double bond in the ring thereof, and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzothiophenyl group, a benzofuranyl group, a carbazolyl group, a dibenzothiophenyl group, a dibenzofuranyl group, an azacarbazolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzofurodibenzofuranyl group, a benzofurodibenzothiophenyl group, and a benzothienodibenzothiophenyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group (for example, having 8 to 60 carbon atoms) having two or more rings condensed with each other, only carbon atoms as ring-forming atoms, and non-aromaticity in its entire molecular structure (e.g., the structure when considered as a whole is non-aromatic). Non-limiting examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom other than carbon atoms, as a ring-forming atom, and non-aromaticity in its entire molecular structure (e.g., the structure when considered as a whole is non-aromatic). Non-limiting examples of the monovalent non-aromatic condensed heteropolycyclic group may include a 9H-xanthenyl group, an azaadamantyl group, a benzosilolyl group, a dibenzosilolyl group, an azafluorenyl group, an azadibenzosilolyl group, and a benzonaphthosilolyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein refers to —$OA_{102}$ (wherein $A_{102}$ is a $C_6$-$C_{60}$ aryl group), and the term "$C_6$-$C_{60}$ arylthio group" as used herein refers to —$SA_{103}$ (wherein $A_{103}$ is a $C_6$-$C_{60}$ aryl group).

The term "$R_{103}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_6$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_6$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_6$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom or a hydrogen atom. Non-limiting examples of the heteroatom include O, S, N, P, Si, B, Ge, Se, and any combination thereof.

The term "Ph" as used herein refers to a phenyl group, the term "Me" as used herein refers to a methyl group, the term "Et" as used herein refers to an ethyl group, the term "ter-Bu" or "$Bu^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a compound according to embodiments and a light-emitting device according to embodiments will be described in more detail with reference to the Examples.

EXAMPLES

Manufacture of Light-Emitting Device

Comparative Example 1

An ITO 300 Å/Ag 50 Å/ITO 300 Å (anode) (hereinafter, referred to as "glass substrate") was cut to a size of 50 mm×50 mm×0.7 mm, sonicated using isopropyl alcohol and pure water for 5 minutes each, and then, cleaned by irradiation of ultraviolet rays and exposure of ozone thereto for 30 minutes. Then, the glass substrate was loaded onto a vacuum deposition apparatus.

HAT-CN was vacuum-deposited on the substrate to form a hole injection layer having a thickness of 50 Å. Subsequently, NPB was vacuum-deposited thereon as a hole transport compound to form a hole transport layer having a thickness of 600 Å.

Host-1 (as a host) and a fluorescent compound 100 (as a dopant) were co-deposited on the hole transport layer at a weight ratio of 97:3 to form a single emission layer having a thickness of 200 Å.

TPM-TAZ and Liq were deposited on the emission layer at a weight ratio of 5:5 to form an electron transport layer having a thickness of 300 Å.

Yb was vacuum-deposited on the electron transport layer to a thickness of 10 Å, and AgMg was vacuum-deposited thereon to a thickness of 120 Å, to thereby form a cathode, and then CPL was deposited thereon to form a capping layer having a thickness of 600 Å, thereby completing manufacture of an organic light-emitting device.

Example 1

A light-emitting device was manufactured in substantially the same manner as in Comparative Example 1, except that, in forming an emission layer, a thermally activated delayed fluorescence compound 200 (wavelength: 450 nm, FWHM: 22 mm) was used to form a thickness of 100 Å (a first emission layer) instead of the fluorescent compound 100 (as a dopant), and host-2 (as a host) and a thermally activated delayed fluorescence compound 300 (wavelength: 470 nm, FWHM: 32 nm) (as a dopant) were used to form a second emission layer having a thickness of 100 Å on the first emission layer.

Example 2

An ITO 300 Å/Ag 50 Å/ITO 300 Å (anode) (hereinafter, referred to as "glass substrate") was cut to a size of 50 mm×50 mm×0.7 mm, sonicated using isopropyl alcohol and pure water for 5 minutes each, and then, cleaned by irradiation of ultraviolet rays and exposure of ozone thereto for 30 minutes. Then, the glass substrate was loaded onto a vacuum deposition apparatus.

HAT-CN was vacuum-deposited on the substrate to form a hole injection layer having a thickness of 50 Å. Subsequently, NPB was vacuum-deposited thereon as a hole transport compound to form a hole transport layer having a thickness of 600 Å.

Host-1 (as a host) and a thermally activated delayed fluorescence compound 200 (wavelength: 450 nm, FWHM: 22 nm) (as a dopant) were co-deposited on the hole transport layer at a weight ratio of 97:3, thereby forming a first emission layer having a thickness of 100 Å. Subsequently, host-2 (as a host) and a thermally activated delayed fluorescence compound 300 (wavelength: 470 nm, FWHM: 32 nm) (as a dopant) were co-deposited thereon at a weight ratio of 97:3, thereby forming a second emission layer having a thickness of 100 Å.

TPM-TAZ and Liq were deposited on the second emission layer at a weight ratio of 5:5 to form an electron transport layer having a thickness of 300 Å.

BCP and Li were co-deposited on the electron transport layer at a weight ratio of 98.5:1.5 to form an n-type charge generation layer having a thickness of 50 Å, and HAT-CN was deposited on the n-type charge generation layer to form a p-type charge generation layer having a thickness of 100 Å.

NPB as a hole transport compound was vacuum-deposited on the p-type charge generation layer to form a hole transport layer having a thickness of 600 Å.

Host-1 (as a host) and a thermally activated delayed fluorescence compound 200 (wavelength: 450 nm, FWHM: 22 nm) (as a dopant) were co-deposited on the hole transport layer at a weight ratio of 97:3, thereby forming a third emission layer having a thickness of 100 Å. Subsequently, host-2 (as a host) and a thermally activated delayed fluorescence compound 300 (wavelength: 470 nm, FWHM: 32 nm) (as a dopant) were co-deposited thereon at a weight ratio of 97:3, thereby forming a fourth emission layer having a thickness of 100 Å.

TPM-TAZ and Liq were deposited on the fourth emission layer at a weight ratio of 5:5 to form an electron transport layer having a thickness of 300 Å.

Yb was vacuum-deposited on the electron transport layer to a thickness of 10 Å and AgMg was vacuum-deposited thereon to a thickness of 120 Å, to thereby form a cathode, and then CPL was deposited thereon to form a capping layer having a thickness of 600 Å, thereby completing manufacture of a tandem organic light-emitting device including two emission layer stacks.

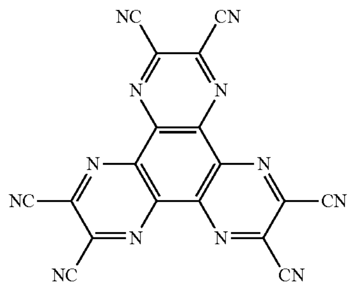

HATCN

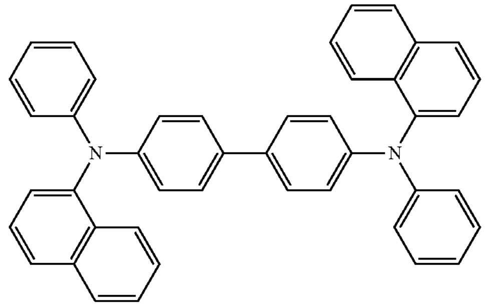

NPB

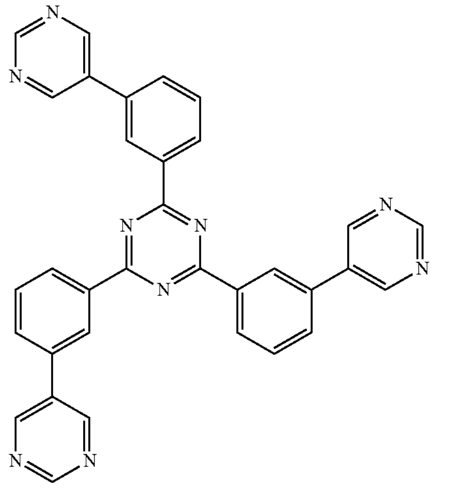

TPM-TAZ

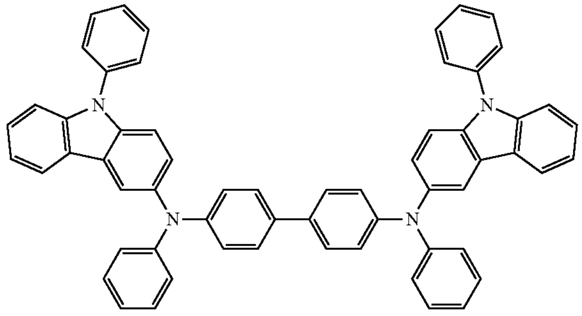

CPL

-continued host-1

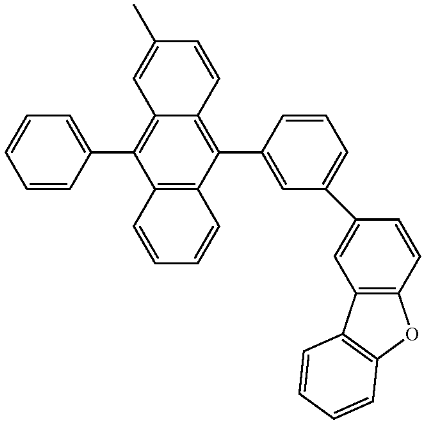

host-2

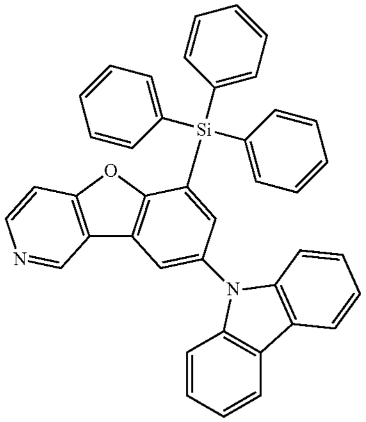

300

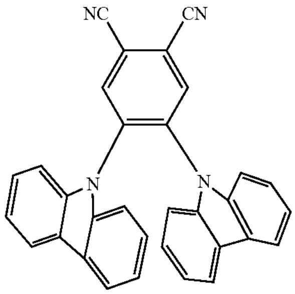

200

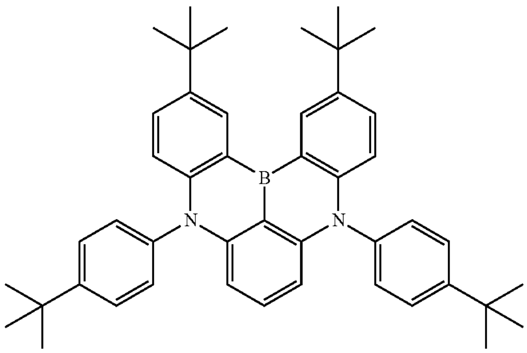

-continued

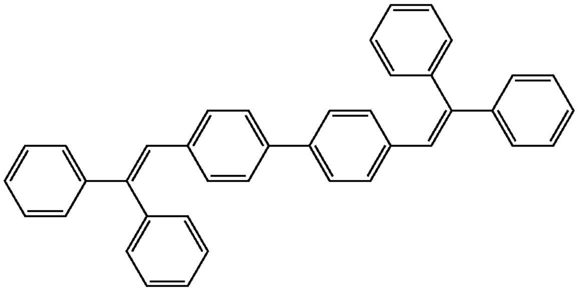

DPVBi

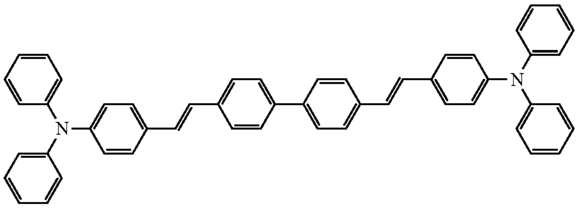

DPAVBi

100

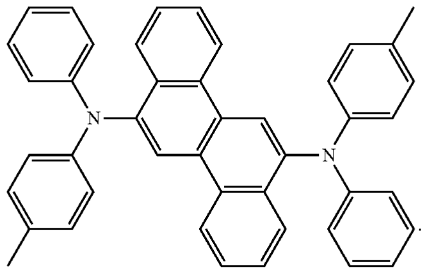

In order to evaluate the characteristics of the light-emitting devices manufactured in Comparative Example 1 and Examples 1 and 2, driving voltage at a current density of 10 mA/cm$^2$, efficiency, and lifespan were measured.

The driving voltage and the current density of each of the light-emitting devices were measured using a source meter (Keithley Instrument, 2400 series), and the efficiency was measured using a 09920-2-12, available from Hamamatsu Photonics.

TABLE 1

| | Emission layer | Host | Dopant | Driving voltage (V) | Efficiency (Cd/A) | Life-span (T97) | Luminance (nit) |
|---|---|---|---|---|---|---|---|
| Comparative Example 1 | Single emission layer | host-1 | 100 | 5.0 | 8.5 | 35 | 1000 |
| Example 1 | First emission layer | host-1 | 200 | 5.5 | 17.5 | 45 | 1000 |
| | Second emission layer | host-2 | 300 | | | | |
| Example 2 | First emission layer | host-1 | 200 | 9.5 | 34.0 | 70 | 1000 |
| | Second emission layer | host-2 | 300 | | | | |
| | Third emission layer | host-1 | 200 | | | | |

TABLE 1-continued

| Emission layer | Host | Dopant | Driving voltage (V) | Efficiency (Cd/A) | Life-span (T97) | Luminance (nit) |
|---|---|---|---|---|---|---|
| Fourth emission layer | host-2 | 300 | | | | |

Referring to Table 1, it is confirmed that the light-emitting devices of Examples 1 and 2 show excellent or improved results in both the efficiency and the lifespan, compared to the light-emitting device of Comparative Example 1.

The light-emitting device according to an embodiment has improved efficiency compared to that in the related art.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as being available for other similar features or aspects in other embodiments. While one or more embodiments have been described with reference to the figures, it will be understood by those of ordinary skill in the art that various changes in form and details may be made therein without departing from the spirit and scope as defined by the following claims and equivalents thereof.

What is claimed is:

1. A light-emitting device comprising:

a first electrode;

a second electrode facing the first electrode; and an interlayer between the first electrode and the second electrode, the interlayer comprising an emission layer stack, wherein the emission layer stack consists of:

a first emission layer consisting of a first host and a first thermally activated delayed fluorescence (TADF) dopant; and a second emission layer consisting of a second host and a second TADF dopant, wherein, the first TADF dopant and the second TADF dopant are different compounds, each of the first TADF dopant and the second TADF dopant being a blue light emission dopant, the first emission layer directly contacts the second emission layer, the interlayer comprises a plurality of the emission layer stacks, the first emission layer is to emit blue light, the second emission layer is to emit blue light, and the first host and the second host comprised in the emission layer stack are each independently any one of the compounds below:

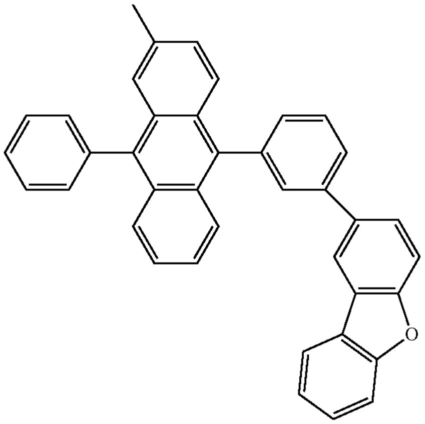

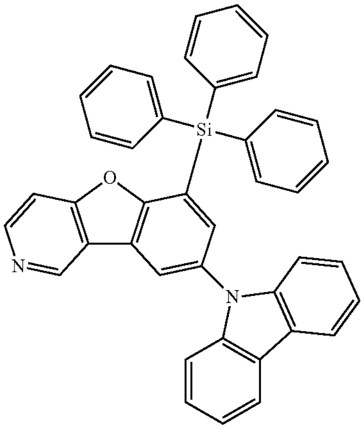

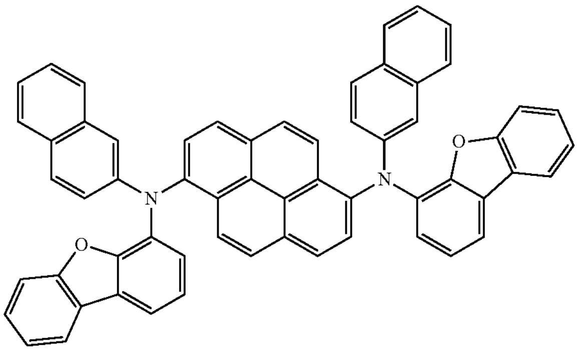

-continued
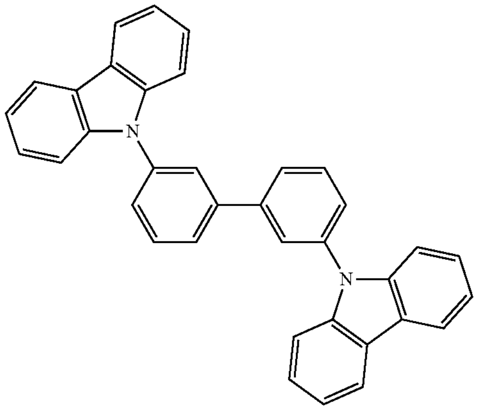
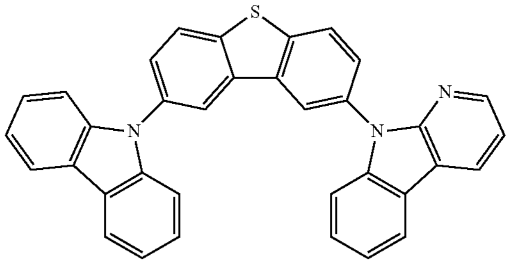
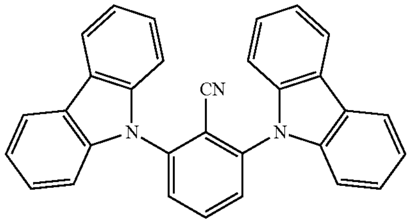
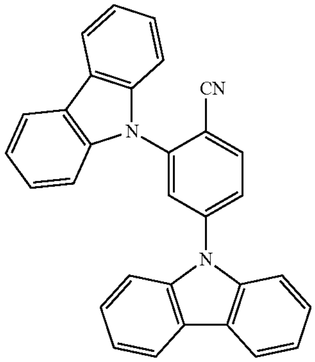
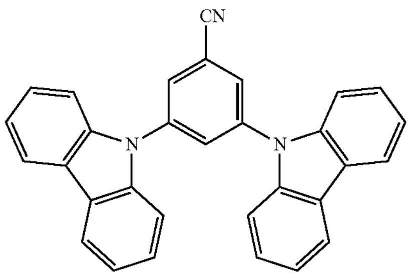
-continued
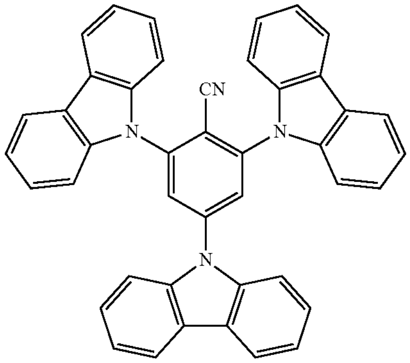
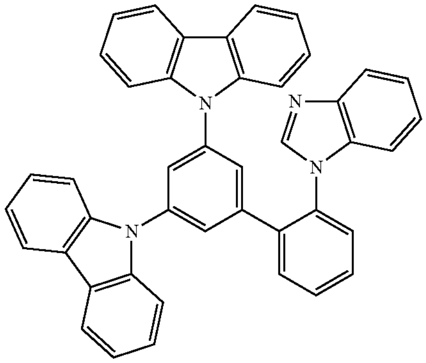
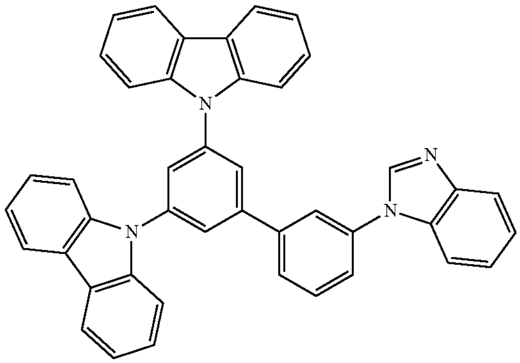
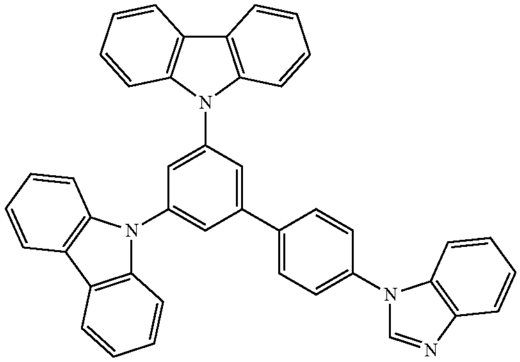

-continued

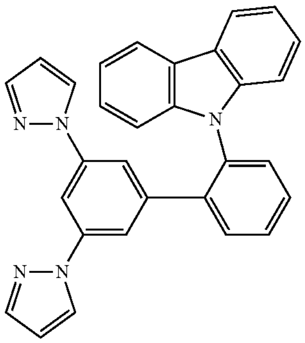

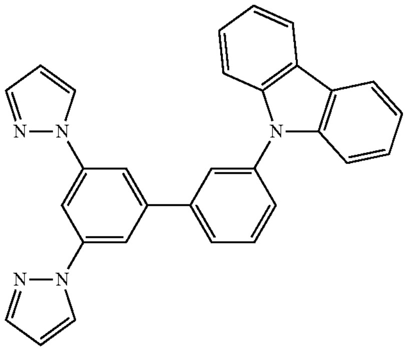

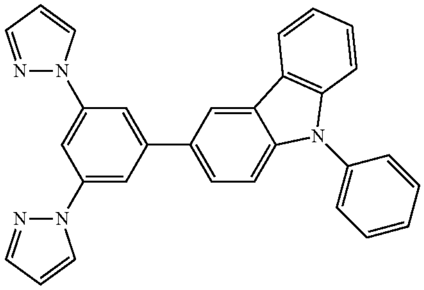

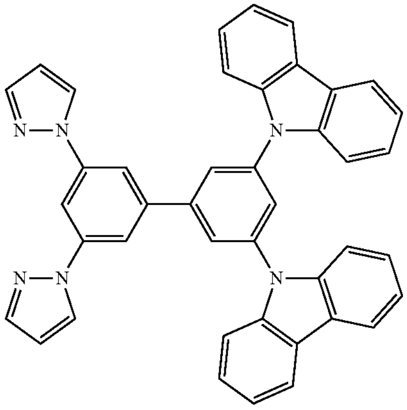

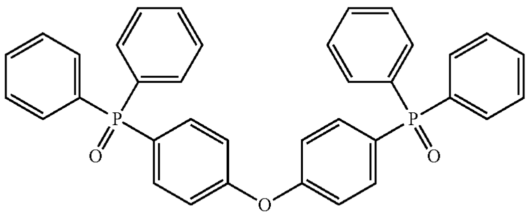

-continued

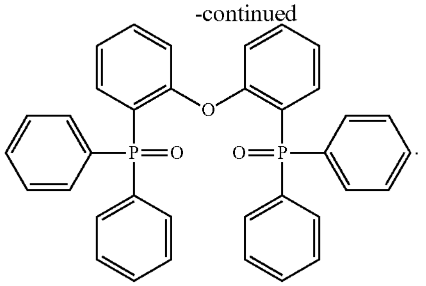

2. The light-emitting device of claim 1, wherein the first electrode is an anode, the second electrode is a cathode, and the light-emitting device further comprises a hole transport region between the first electrode and the emission layer stack, the hole transport region comprising a hole injection layer, a hole transport layer, an electron blocking layer, or a combination thereof.

3. The light-emitting device of claim 1, wherein the first electrode is an anode, the second electrode is a cathode, and the light-emitting device further comprises an electron transport region located between the second electrode and the emission layer stack, the electron transport region comprising a hole blocking layer, an electron transport layer, an electron injection layer, or a combination thereof.

4. The light-emitting device of claim 1, wherein the emission layer stack is to emit blue light.

5. The light-emitting device of claim 1, wherein a wavelength of the first TADF dopant is 440 nm to 460 nm.

6. The light-emitting device of claim 1, wherein a wavelength of the second TADF dopant is 460 nm to 480 nm.

7. The light-emitting device of claim 1, wherein a full width at half maximum (FWHM) of a wavelength of the first TADF dopant is 30 nm or less.

8. The light-emitting device of claim 1, wherein a full width at half maximum (FWHM) of a wavelength of the second TADF dopant is 30 nm or more.

9. The light-emitting device of claim 1, wherein a triplet energy (T1) of the first host and a T1 of the second host are each 1.7 eV or more, and the first host and the second host are different compounds.

10. The light-emitting device of claim 1, wherein a hole provided by the first electrode and an electron provided by the second electrode is to recombine at an interface between the first emission layer and the second emission layer.

11. The light-emitting device of claim 1, wherein a charge generation layer is located between two among the plurality of emission layer stacks.

12. The light-emitting device of claim 1, wherein the first TADF dopant is any one of the compounds below:
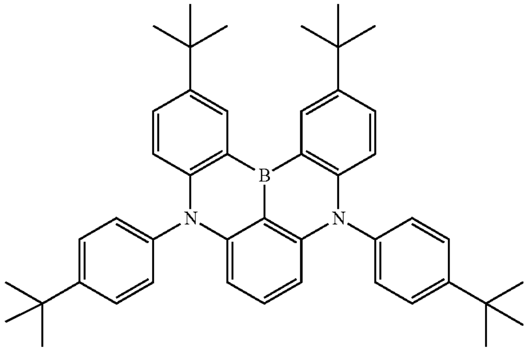
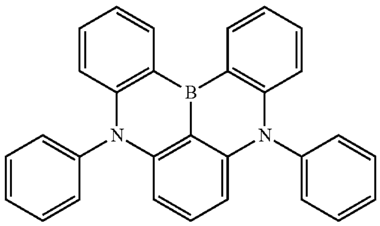
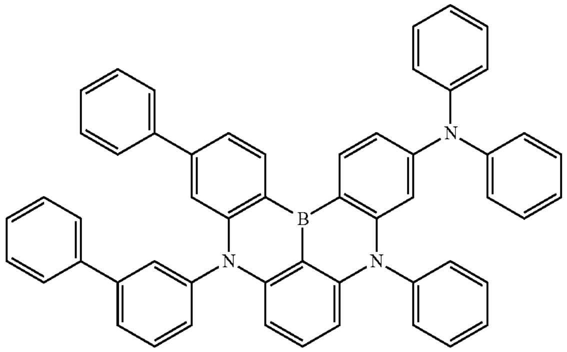
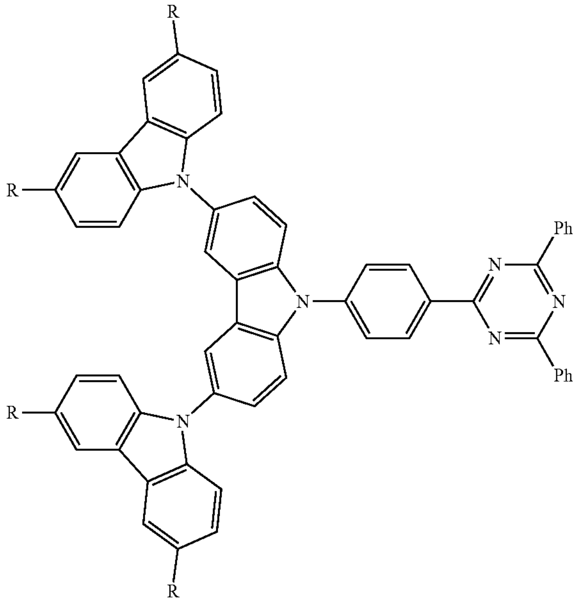
3 (2a): R = Phenyl
4 (2b): R = H
-continued
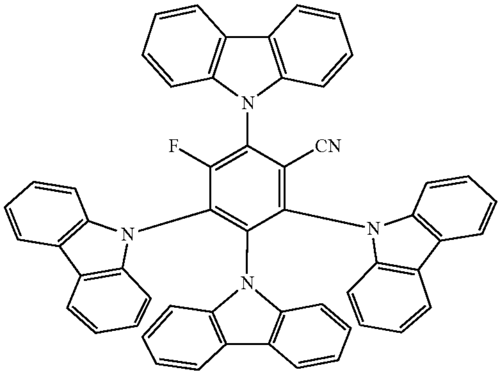
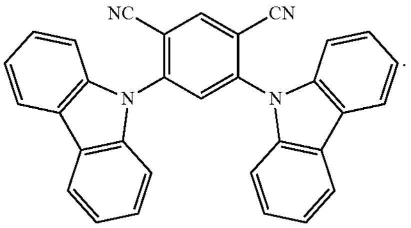
13. The light-emitting device of claim 1, wherein the second TADF dopant is any one of the compounds below:
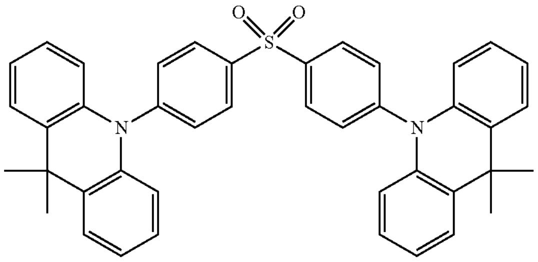
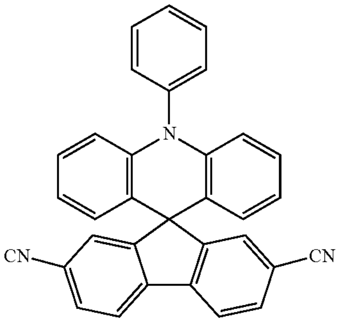
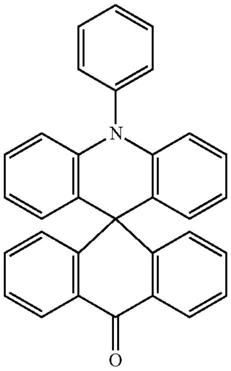

-continued

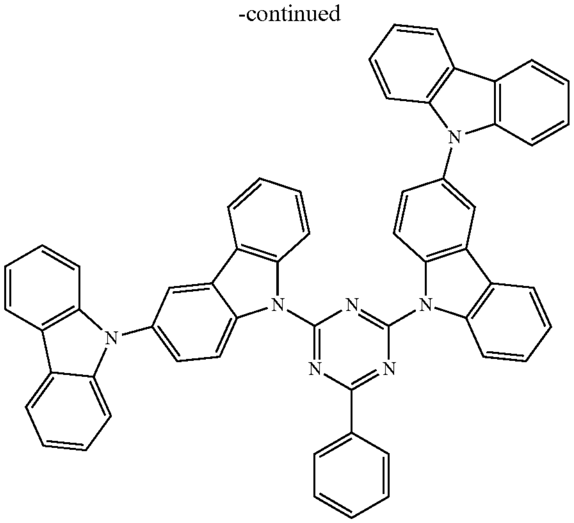

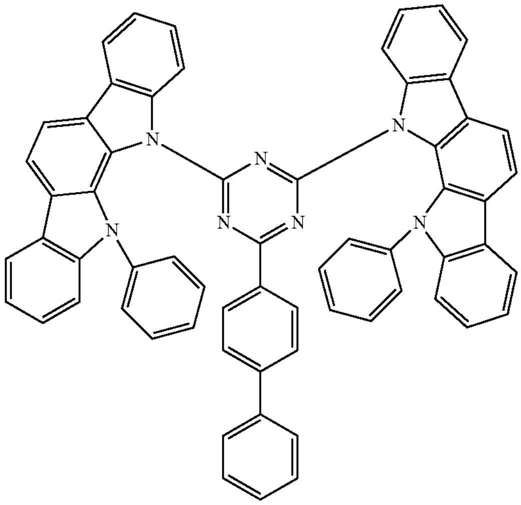

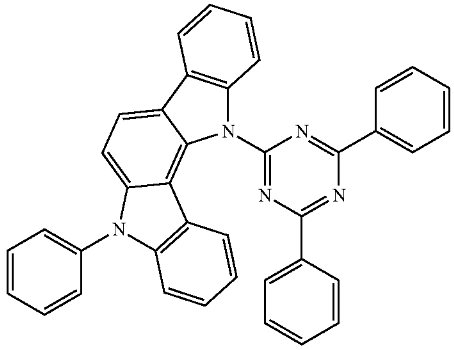

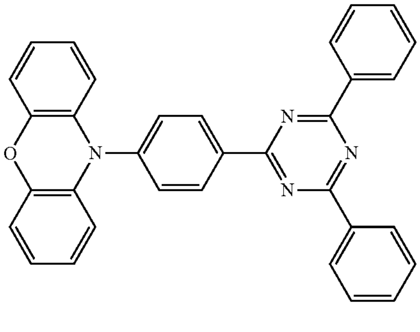

-continued

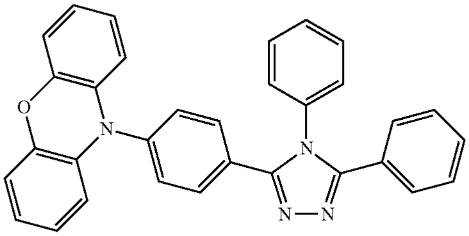

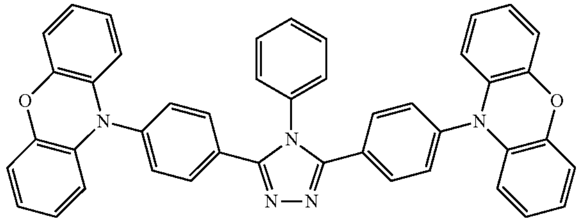

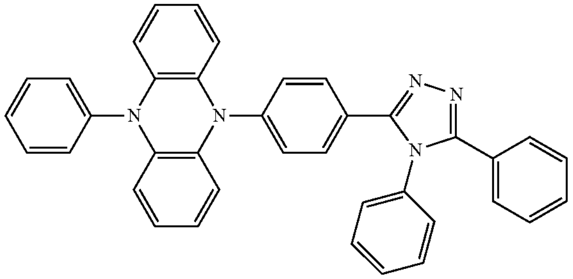

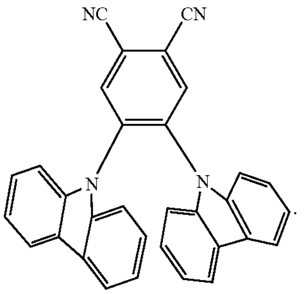

14. An electronic apparatus comprising the light-emitting device of claim 1.

15. The electronic apparatus of claim 14, further comprising a thin-film transistor, wherein the thin-film transistor comprises a source electrode and a drain electrode, and the first electrode of the light-emitting device is electrically connected to at least one of the source electrode or the drain electrode of the thin-film transistor.

16. The electronic apparatus of claim 14, further comprising a color filter, a color conversion layer, a touch screen layer, a polarizing layer, or any combination thereof.

* * * * *